US012598814B2

(12) United States Patent
Thomson et al.

(10) Patent No.: US 12,598,814 B2
(45) Date of Patent: Apr. 7, 2026

(54) LATERAL DIODES IN STACKED TRANSISTOR TECHNOLOGIES

(71) Applicant: INTEL CORPORATION, Santa Clara, CA (US)

(72) Inventors: Nicholas A. Thomson, Hillsboro, OR (US); Ayan Kar, Portland, OR (US); Benjamin Orr, Beaverton, OR (US); Kalyan C. Kolluru, Portland, OR (US); Nathan D. Jack, Forest Grove, OR (US); Patrick Morrow, Portland, OR (US); Cheng-Ying Huang, Hillsboro, OR (US); Charles C. Kuo, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 1047 days.

(21) Appl. No.: 17/448,384

(22) Filed: Sep. 22, 2021

(65) Prior Publication Data

US 2023/0087444 A1 Mar. 23, 2023

(51) Int. Cl.
H10D 89/60 (2025.01)
H01L 21/02 (2006.01)
(Continued)

(52) U.S. Cl.
CPC ....... H10D 89/611 (2025.01); H01L 21/0259 (2013.01); H10D 30/031 (2025.01);
(Continued)

(58) Field of Classification Search
CPC ........ H10D 8/045; H10D 8/50; H10D 62/128; H10D 62/129; H10D 62/119–123; H10D 30/43–435; H10D 30/6757; H10D 30/6735; H10D 30/501–509; H10D 30/014; H10D 30/019–0198;
(Continued)

(56) References Cited

U.S. PATENT DOCUMENTS

2020/0411518 A1* 12/2020 Fulford ............... H10D 84/834
2021/0226042 A1* 7/2021 Hsiao .................... B82Y 10/00
(Continued)

*Primary Examiner* — Wael M Fahmy
*Assistant Examiner* — Thomas Wilson McCoy
(74) *Attorney, Agent, or Firm* — Arcane Law PLLC

(57) ABSTRACT

Integrated circuits including lateral diodes. In an example, diodes are formed with laterally neighboring source and drain regions (diffusion regions) configured with different polarity epitaxial growths (e.g., p-type and n-type), to provide an anode and cathode of the diode. In some such cases, dopants may be used in the channel region to create or otherwise enhance a PN or PIN junction between the diffusion regions and the semiconductor material of a channel region. The channel region can be, for instance, one or more nanoribbons or other such semiconductor bodies that extend between the oppositely-doped diffusion regions. In some cases, nanoribbons making up the channel region are left unreleased, thereby preserving greater volume through which diode current can flow. Other features include skipped epitaxial regions, elongated gate structures, using isolation structures in place of gate structures, and/or sub-fin conduction paths that are supplemental or alternative to a channel-based conduction path.

25 Claims, 32 Drawing Sheets

(51) Int. Cl.

| | |
|---|---|
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ..... *H10D 30/6729* (2025.01); *H10D 30/6735* (2025.01); *H10D 30/6757* (2025.01); *H10D 62/118* (2025.01); *H10D 64/017* (2025.01); *H10D 64/018* (2025.01); *H10D 84/0167* (2025.01); *H10D 84/017* (2025.01); *H10D 84/0184* (2025.01); *H10D 84/0186* (2025.01); *H10D 84/038* (2025.01); *H10D 84/856* (2025.01)

(58) Field of Classification Search
CPC .. H10D 84/851; H10D 84/852; H10D 84/832; H10D 84/833; H10D 84/811; H10D 84/00; H10D 89/911; H10D 89/611; H10D 8/411; H10D 8/422; H10D 89/811–817; H10D 84/611–619; H10D 84/403–409; H10D 84/204; H10D 84/221; H01L 23/60–62; H10B 99/16
See application file for complete search history.

(56) References Cited

U.S. PATENT DOCUMENTS

| | | | |
|---|---|---|---|
| 2022/0109047 A1* | 4/2022 | Jun ................... | H10D 84/0177 |
| 2023/0061857 A1* | 3/2023 | Lin ..................... | H10D 84/038 |
| 2023/0088578 A1* | 3/2023 | Thomson ............ | H10D 62/118 |
| | | | 257/351 |

* cited by examiner

Interconnect 111

| Gate or Dielectric Structure 108 | Contact 109a | Source or Drain Region 103a | Dielectric 105 | Source or Drain Region 103b | Contact 113 |

102

1 0 2

Gate or Dielectric Structure 108 · Dielectric 412 · 410 · 410 · Gate Structure 410

1 0 2

Gate or Dielectric Structure 108 · Dielectric 105 · Source or Drain Region 103b · Contact 113 · Spacer 414

102

Gate or Dielectric Structure 108 · 410 · 410 · Gate Structure 410

Contact 109b · Source or Drain Region 107a · Dielectric 105 · Source or Drain Region 103b · Contact 113

102          1 0 2

Gate or Dielectric Structure 108 · Dielectric 412 · 410 · Gate Structure 410

1 0 2

Contact 109b · Source or Drain Region 107a · Dielectric 105 · Source or Drain Region 103b · Contact 113

102

Gate or Dielectric Structure 108 · 410 · 410 · Gate Structure 410

1 0 2

Dielectric 105 · Dielectric 412 · Source or Drain Region 103b · Contact 113 · Spacer 414

102

Gate or Dielectric Structure 108 · 410 · 410 · Gate Structure 410

Contact 109a · Source or Drain Region 103a · Dielectric 105 · Source or Drain Region 103b · Contact 113

102          1 0 2

Gate or Dielectric Structure 108 · Dielectric 412 · 410 · 410 · Gate Structure 410

1 0 2

Interconnect 115

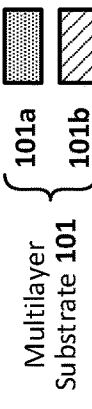

Multilayer Substrate 101 { 101a / 101b

Fig. 4b

Note: p-type source or drain regions (e.g., 103a-b) processed separately from n-type source or drain regions (e.g., 107a-b).

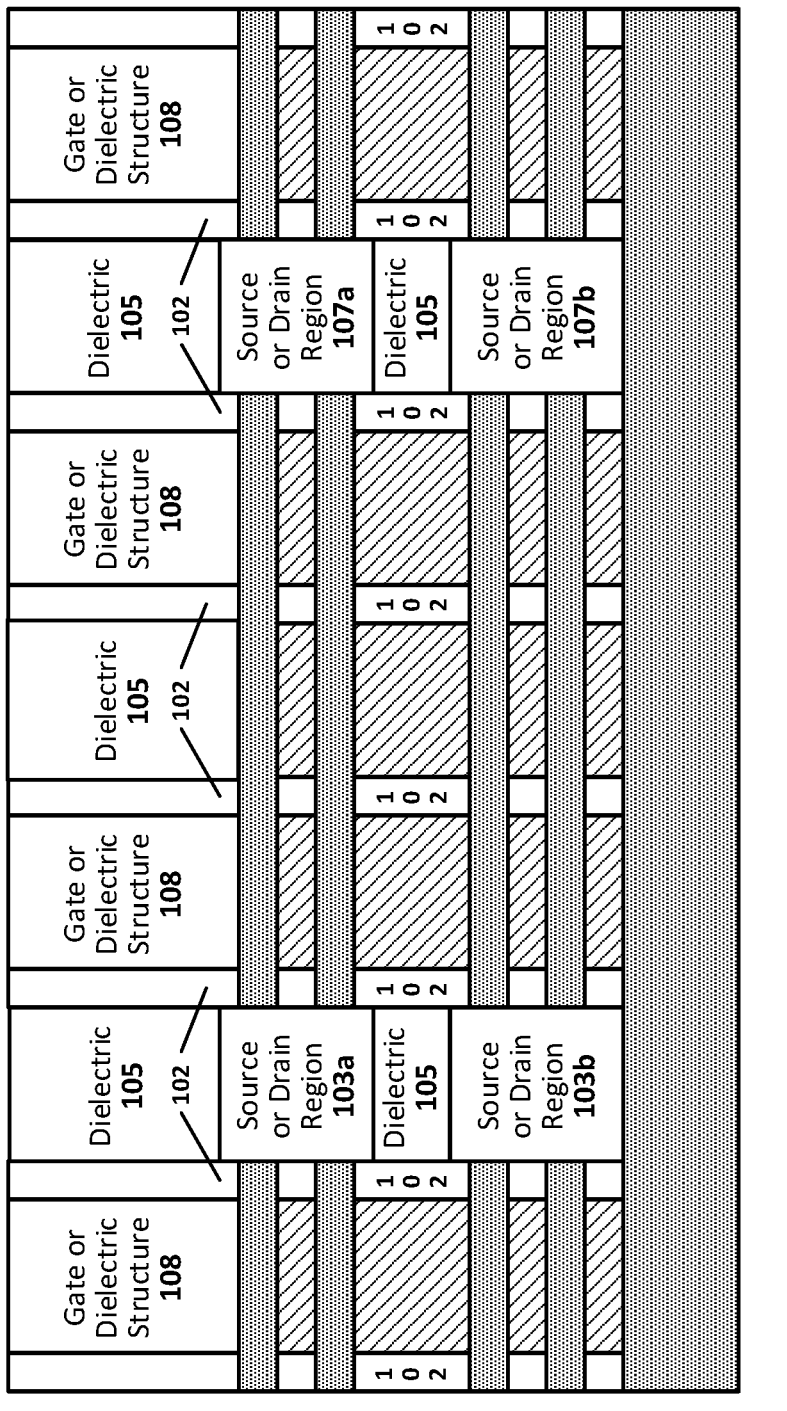
Fig. 9d
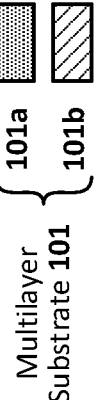
Multilayer
Substrate 101
101a
101b

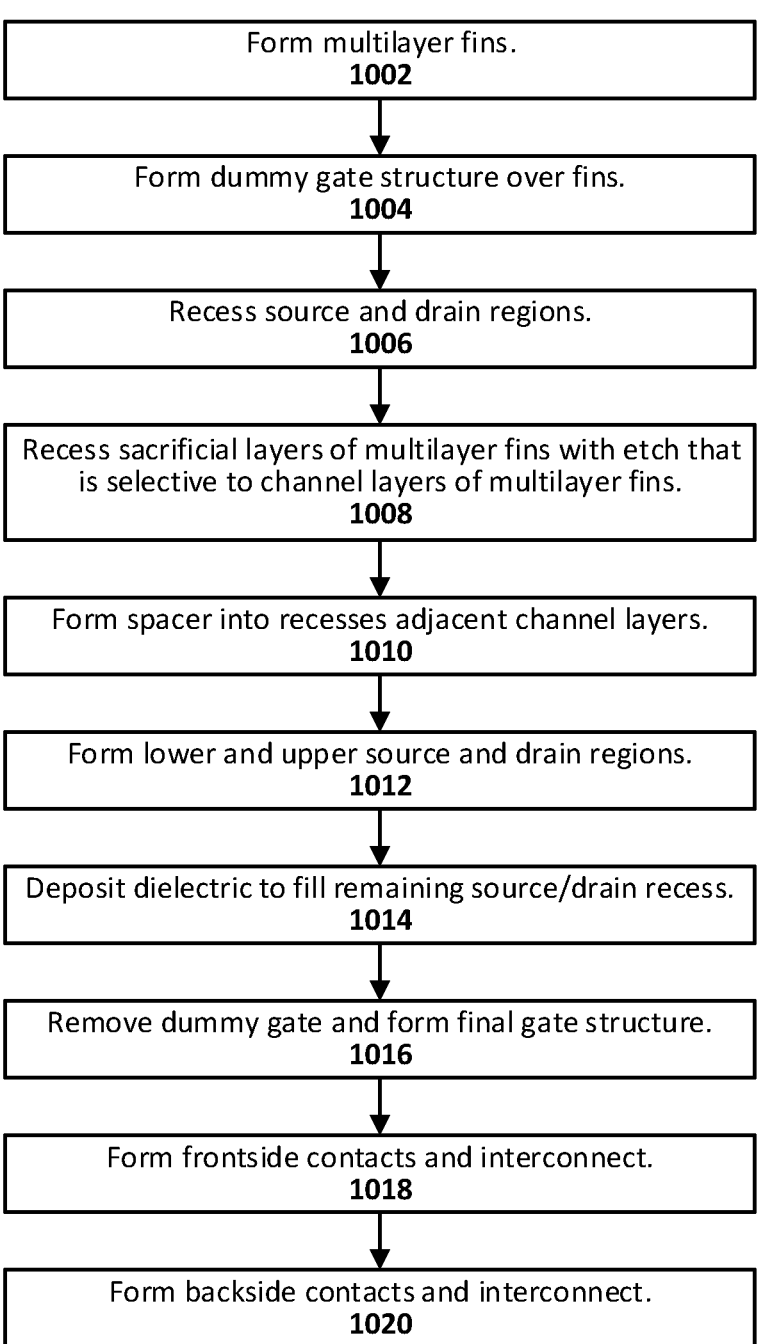

Form multilayer fins.
1002

Form dummy gate structure over fins.
1004

Recess source and drain regions.
1006

Recess sacrificial layers of multilayer fins with etch that is selective to channel layers of multilayer fins.
1008

Form spacer into recesses adjacent channel layers.
1010

Form lower and upper source and drain regions.
1012

Deposit dielectric to fill remaining source/drain recess.
1014

Remove dummy gate and form final gate structure.
1016

Form frontside contacts and interconnect.
1018

Form backside contacts and interconnect.
1020

Fig. 10

LATERAL DIODES IN STACKED TRANSISTOR TECHNOLOGIES

FIELD OF THE DISCLOSURE

The present disclosure relates to integrated circuits, and more particularly, to lateral diodes in stacked transistor technologies.

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the z-dimension (build upwards rather than laterally outwards in the x- and y-dimensions). Some such 3D integrated circuits are formed utilizing a technique known as layer transfer. Such layer transfer may include, for instance, bond and hydrogen-based or hydrogen/helium based cleave techniques. Other 3D integrated circuits are formed by separately forming transistors on two distinct wafers (sometimes referred to as host and donor wafers or substrates), the two wafers being bonded together via an oxide bonding layer. Excess wafer material is removed by chemical-mechanical polish (CMP) operations. Still other 3D integrated circuits are achieved by forming transistors on upper and lower regions of the same fin structure. In any such cases, such 3D integration schemes provide a stacked transistor architecture and give rise to a number of non-trivial issues.

BRIEF DESCRIPTION OF THE DRAWINGS

FIG. 4b is a cross-sectional view that illustrates an example integrated circuit configured with a lateral diode in the upper device region and not in the lower device region, in accordance with an embodiment of the present disclosure.

FIGS. 9a-93 e are cross-sectional views that collectively illustrate an example process for forming an integrated circuit configured with lateral diodes, in accordance with an embodiment of the present disclosure.

FIG. 10 illustrates an example method for forming an integrated circuit configured with lateral diodes, in accordance with an embodiment of the present disclosure.

DETAILED DESCRIPTION

Figure 1A:
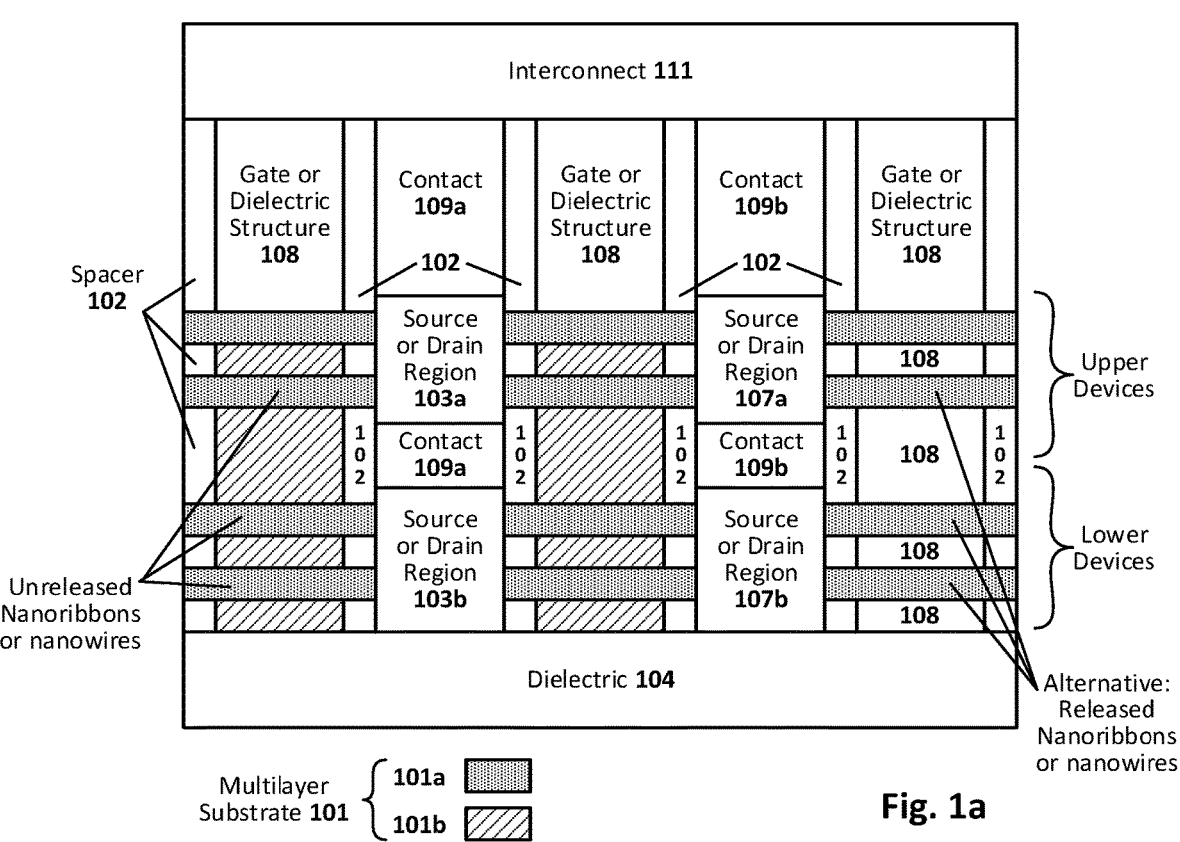
FIG. 1a is a cross-sectional view that illustrates an example integrated circuit configured with a lateral diode having frontside connections, in accordance with some embodiments of the present disclosure.

Integrated circuit structures including lateral diodes are provided herein. In an example, an integrated circuit includes. In an embodiment, the diodes are constructed in a fashion similar to transistor devices except that laterally neighboring source and drain regions are configured with different polarity epitaxial growths (e.g., p-type and n-type), to provide an anode and cathode of the diode. These source and drain regions are also referred to herein as diffusion regions, which may be used interchangeably. In some such cases, dopants may be used in the channel region to create or otherwise enhance a PN or PIN junction between the diffusion regions and the semiconductor material of a channel region. In other such cases, the channel regions are left undoped to provide a longer intrinsic region between the oppositely-doped diffusion regions. The channel region can be, for instance, one or more nanoribbons or other such semiconductor bodies that extend from one diffusion region to the other. In some such cases, nanoribbons making up the channel region are left unreleased, in that the sacrificial semiconductor material between neighboring nanoribbons is left in place (rather than being removed during gate processing), thereby preserving greater volume through which diode current can flow. A number of techniques can be used to assist in reducing parasitics and/or easing tight process margins, including skipping of epitaxial regions, elongating gate structures, removing gate structures, and using sub-fin for a conduction path that is supplemental or alternative to a channel-based conduction path. Numerous variations and embodiments will be apparent in light of this disclosure.

General Overview

As previously noted above, there remain a number of non-trivial challenges with respect to stacked transistor architecture. For instance, diodes are employed to provide electrostatic discharge (ESD) protection for integrated circuit input/output (I/O) pins. Such diodes are capable of sustaining relatively high current densities while imposing relatively low parasitic capacitance to avoid hampering the operation of the pin which they protect. Traditionally, these diodes have been formed by parasitic drain/source-body junctions. In more recent stacked transistor technologies which discard the source/drain-body junction by way of back-side isolation, substrate removal, or otherwise, such ESD diodes are not realizable. In the context of stacked configurations where such parasitic junctions are not present, one possible solution is to repurpose a transistor channel as a lateral diode. However, such a channel-based solution may suffer from increased capacitance due to the proximity of the transistor gate immediately adjacent to the anode and cathode terminals. In addition, transistors having area-constrained channel configurations (e.g., such as nanowire/ribbon/sheet channels, relative to fin channels) will be susceptible to lower failure current, due to the decreased cross-sectional channel area.

Thus, and in accordance with an embodiment of the present disclosure, integrated circuits including lateral diodes are provided herein. Although the described techniques can be used in any number of applications, they are particularly useful in forming diodes in stacked transistor technologies, such as those that include gate-all-around processes where there is a relatively narrow conduction path between source and drain regions (e.g., transistors having nanowires, nanoribbons, nanosheets). In an embodiment, the diodes are constructed in a fashion similar to transistor devices except that laterally neighboring source and drain regions are configured with different polarity epitaxial growths (e.g., p-type and n-type), to provide an anode and cathode of the diode. These source and drain regions are also referred to herein as diffusion regions, which may be used interchangeably. In some such cases, dopants may be used in the channel region to create or otherwise enhance a PN or PIN junction between the diffusion regions and the semiconductor material of a channel region. In other such cases, the channel regions are left undoped to provide a longer intrinsic region between the oppositely-doped diffusion regions. The channel region can be, for instance, one or more nanoribbons or other such semiconductor bodies that extend from one diffusion region to the other. In some such cases, nanoribbons making up the channel region are left unreleased, in that the sacrificial semiconductor material between neighboring nanoribbons is left in place (rather than being removed during gate processing), thereby preserving greater volume through which diode current can flow.

A number of techniques can be used to assist in reducing parasitics and/or easing tight process margins. In one example, an etch and subsequent epitaxial growth in one of the source or regions between the anode and cathode of the diode is skipped. By omitting the etch and subsequent epitaxial fill from this region, additional margin for epitaxial mask misregistration is added while simultaneously reducing the anode-to-cathode coupling through the gate structure. For instance, such a skip allows the n-type epitaxial growth mask to terminate on a different gate structure than the p-type epitaxial growth mask, thus avoiding growth of multiple epitaxial polarities in the same opening due to misregistration in a given process with tight margins. Additionally, the added space, without an added conductor, between the anode and cathode reduces the anode-to-cathode coupling capacitance. In another example, a wider gate structure is provisioned between the anode and cathode of the diode. This allows for the greatest registration margin as the length of the gate structure can be made arbitrarily large to support the misregistration of the anode and cathode growth masks. Note, however, that a conductive gate structure may still allow for anode-to-cathode coupling. So, in another example, the gate structure between the anode and cathode of the diode is replaced with a dielectric or isolation structure, which can also have its length set to provide registration margin. Gate removal is acceptable here, because the device of interest is a diode junction, and the gate structure is not needed for device functionality. By removing the gate structure between the anode and cathode diffusion regions, a large conductor is removed from between opposing signals and the capacitance is greatly reduced. Gate structures between diffusion regions of the same polarity can be similarly removed, or left in place as there would be no added capacitance because the signals on both sides are the same. Leaving these gate structures in place can ease density restrictions, in some such embodiments. Further note that the techniques can be used to reduce parasitic capacitance, by aggregating diffusion regions of similar polarity to reduce coupling capacitance.

Note that, in a stacked device architecture, the upper and lower device regions can be used to form multiple diodes for greater area utilization, according to some embodiments. In other embodiments, process cost could be saved by allowing for uniform polarity of epitaxial growth in one of the upper or lower device region such as done for transistors, and populating diodes having the oppositely-doped diffusion regions in the other of the upper or lower device region. Alternatively, the unused (no diode) device region may be passivated to reduce capacitance.

The embodiments presented so far utilize a semiconductor body laterally extending from the anode diffusion region to the cathode diffusion region as the main conduction path, such as the example case where one or more nanowires or nanoribbons (released or unreleased, as explained above) are used. In other embodiments, this channel region conduction path is supplemented with a sub-fin pathway that extends laterally under the diffusion regions to provide additional volume through which current can flow. In still other embodiments, the channel region can be removed and replaced with an isolation structure and the sub-fin is used as the main conduction path. In some such cases, an undercut etch into the sub-fin is introduced to push the diode current further down into the sub-fin semiconductor material, so as to inhibit possible leakage. In some such examples, a PN junction in the sub-fin is formed where the diffusion regions of the lower region device touches the sub-fin. The sub-fin can be doped to create quality PN junctions. In other cases, no sub-fin doping is used, so as to provide a PIN junction, wherein a portion of the sub-fin provides an intrinsic region between the oppositely-doped diffusion regions. The doping scheme can vary from one embodiment to the next, as will be explained in turn. According to some embodiments, by including the sub-fin region and removing the channel-based conduction path, current can be steered into the sub-fin to avoid early failure bottlenecks through area-constrained channel regions such as those that include nanowires, nanoribbons and nanosheets. The sub-fin region may also allow for greater aggregation of like diffusion regions (like signals, as well), such as the example case where four cathodes are sandwiched between two groups of two anodes, depending on the properties of the semiconductor material and doping of the sub-fin. Greater aggregations lead to improved conduction (e.g., parallel contacts) without added parasitic capacitance, because the additional contacts are facing the same signal on all sides. Another possible benefit here is that even for the smallest ESD event time scales of ESD events, the current is forced to flow through the larger silicon (or other semiconductor material) volume in the sub-fin, thereby sustaining a higher failure current rating in the device.

Many of the various features provided herein can be used together and in various combinations to form specific embodiments. Any number of connection schemes can be used, including frontside-only connections, backside-only connections, and a combination of frontside and backside connections (e.g., frontside contacts to the cathode and backside contacts to the anode).

In some embodiments, the semiconductor bodies extending laterally between the anode and cathode diffusion regions (or the nubs of those semiconductor bodies, in cases where the channel region is removed) may be, for instance, part of a multilayer fin, such as a fin including alternating layers of silicon and silicon germanium (SiGe), which can be used to provide silicon or SiGe nanowires, nanoribbons, or nanosheets, depending on the desired channel material. Other embodiments may use group III-V materials (e.g., alternating layers of gallium arsenide and indium gallium arsenide), or some other channel material. Further note that, prior to the source/drain forming process, a gate spacer may be conformally deposited in a blanket fashion so as to also cover exposed sidewalls of fin portions where the source and drain regions will be formed, and thus can subsequently be used as a guide in not only the epitaxial source and drain formation process.

A number of benefits arise when stacked transistor diffusions are used to form diode junctions as variously described herein. For instance, in the case of gate-all-around devices, higher current carrying capability of the wider diode junctions (e.g., relative to solely relying on nanowire or ribbonized or other area-constrained channel pathways) allows for smaller IO area and higher performance, according to some embodiments. In addition, parasitic coupling from the transistor gate is avoided or otherwise reduced, according to some embodiments. Laterally forming a diode junction between laterally adjacent transistor diffusion regions further allows standard transistor interconnects to serve as the anode and cathode connections, such that no special interconnect process is needed. Likewise, no major deviation from standard gate processing would be needed (e.g., gate-first and gate-last processes can be used). Moreover, the diode terminals can be readily separated to reduce parasitic coupling capacitance, such as in the example case where a frontside contact is used for one terminal, and a backside contact for the other terminal.

Although the techniques can be used with any number of planar and non-planar transistor topologies, they are particularly useful with respect to gate-all-around where a lateral diode junction would otherwise be area-constrained. The source and drain regions can be, for example, doped portions of a given fin or substrate, or epitaxial regions that are deposited during an etch-and-replace source/drain forming process. The dopant-type in the source and drain regions will depend on the desired polarity(ies) of the corresponding device (transistor or diode). The gate structure can be implemented with a gate-first process or a gate-last process (sometimes called a remove metal gate, or RMG, process). Any number of semiconductor materials can be used in forming the devices that will be used to provide the lateral diodes, such as group IV materials (e.g., silicon, germanium, silicon germanium) or group III-V materials (e.g., gallium arsenide, indium gallium arsenide).

According to an embodiment including nanowire or nanoribbon devices formed from a multilayer fin structure, a cross-section parallel to and through the fin structure (perpendicular to the gate structure) will show laterally adjacent and oppositely-doped diffusions, or unreleased nanowire(s) or nanoribbon(s) or nanosheet(s) in the upper and/or lower device channel regions. Such features can be seen with cross-sectional imaging by, for example, a scanning electron microscopy or SEM, transmission electron microscopy or TEM, or other suitable inspection tool. In addition, secondary ion mass spectrometry (SIMS) and atom probe can be used to detect junction doping.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note the use of terms like "above" "below" "upper" "lower" "top" and "bottom" are simply used to facilitate discussion and are not intended to implicate a rigid structure or fixed orientation; rather such terms merely indicate spatial relationships when the structure is in a given orientation.

Architecture

FIG. 1a is a cross-sectional view that illustrates an example integrated circuit configured with a lateral diode having frontside connections, in accordance with some embodiments of the present disclosure. As can be seen in this example case, the stacked configuration includes upper devices and lower devices, formed on the same fin structure. The fin structure is formed from a multilayer substrate 101 that includes alternating layers of semiconductor materials 101a (e.g., silicon) and 101b (e.g., SiGe). Any number of material systems can be used, and silicon and SiGe are just provided as examples. As can be seen, the cross-section is taken parallel to, and through, the fin structure, such that the channel, source, and drain regions are shown. This particular cross-section includes three channel regions along with a source region and a drain region in each of the upper and lower device regions, but any number of channel regions and corresponding source and drain regions can be included, as will be appreciated. Further note that all devices shown in this example are contacted, but other examples may include dummy devices or devices that are not connected into the overall circuit. The semiconductor bodies 101a included in the channel regions of the upper and lower devices can vary in form, but in this example embodiment are in the form of nanoribbons. In particular, the channel regions of the lower devices in this example case each include a first set of two nanoribbons 101a, and the channel regions of the upper devices each include a second set of two nanoribbons 101a above the corresponding first set. Other examples may include fewer nanoribbons 101a per channel region (e.g., one), or more nanoribbons 101a per channel region (e.g., three or four). Still other embodiments may include other channel configurations, such as one or more nanowires or a fin or other semiconductor body, including both planar and nonplanar topologies, although benefits of the techniques provided herein are particularly pronounced with respect to nanoribbon, nanowire, nanosheet, and other such area-constrained channel configurations. To this end, the present disclosure is not intended to be limited to any particular channel configuration or topology.

With further reference to FIG. 1a, the lower device region includes a source or drain region 103b and a source or drain region 107b, each adjacent to and in contact with a channel region (nanoribbons 101a) on either side. Other embodiments may not have channel regions to each side, such as the example case where only the channel region between source or drain region 103b and source or drain region 107b is present. As can be further seen in the two leftmost channel regions in this example, the nanoribbons 101a are unreleased, in that semiconductor layers 101b of the multilayer fin structure have not been removed as normally done. As such, there is no gate structure wrapped around the nanoribbons 101a, in this example embodiment; rather, gate or dielectric structure 108 sits on the topmost nanoribbon 101a and on sidewalls of the fin structure that contains the unreleased nanoribbons. An alternative embodiment is shown in the rightmost channel region of FIG. 1a, where the nanoribbons 101a are released (e.g., by selective etch process that removes layers 101b, during gate processing), and gate or dielectric structure 108 wraps around the nanoribbons 101a. Spacers 102 extend along the sides of diffusion regions 103b and 107b and isolates those diffusion regions from semiconductor layers 101b (or structure 108, as the case may be). In other embodiments, there may be other insulator layers (e.g., interlayer dielectric) that prevent such contact, whether in addition to spacer 102, or in place of spacer 102. Dielectric layer 104 may be provided, for instance, to replace a removed portion of multilayer substrate 101, or may be part of substrate 101.

The upper device region includes a source or drain region 103a and a source or drain region 107a, each adjacent to and in contact with a channel region (nanoribbons 101a) on either side. Again, other embodiments may not have channel regions to each side, such as the example case where only the channel region between source or drain region 103a and source or drain region 107a is present. As explained above, the nanoribbons 101a of the two leftmost channel regions are unreleased, in that semiconductor layers 101b of the multilayer fin structure have not been removed, and the rightmost channel region shows an example of released nanoribbons. In either case, note there is a gate or dielectric structure 108 on the uppermost nanoribbon 101. In some embodiments, by using a given gate process, no or otherwise minimal deviation from that gate processing is required. In such cases, note that the gate structure does not impart any meaningful performance benefit to the corresponding lateral diode; rather, such a gate structure is parasitic. In other embodiments, structure 108 may be, for example, a dielectric structure (e.g., silicon dioxide, or porous silicon dioxide). Such a structure 108 will cause a greater deviation from standard or otherwise given gate processing, which is fine, according to some embodiments. An example gate process is one in which, for example, dummy gate materials are removed from gate trench to expose channel region, sacrificial material 101b is removed to release nanoribbons 101a or vice-versa (this release is skipped, according to some embodiments), a gate dielectric is conformally deposited around released nanoribbons 101a and/or exposed areas, and a gate electrode including workfunction material and possibly gate fill metal is then deposited on the gate dielectric. If the nanoribbons 101a are unreleased, then then gate structure materials deposit on the sides of the fin structure that includes both 101a and 101b. Just as with the lower device region, spacers 102 extend along the sides of diffusion regions 103a and 107a and isolates those diffusion regions from semiconductor layers 101b (or structure 108, as the case may be). In addition, contacts 109a and 109b provide frontside contact to source or drain region 103a and source or drain region 107a, respectively, and interconnect 111 provides interconnection between contacts 109a-b and other parts of the integrated circuit. As can further be seen in FIG. 1a, contacts 109a and 109b further provide contact to the underlying source or drain region 103b and source or drain region 107b, respectively. Further details with respect to the contacts and interconnect scheme are provided in turn.

In this example embodiment, the junction of an upper diode is provided by diffusion regions 103a and 107a, along with the upper two nanoribbons 101a laterally extending therebetween, and the junction of a lower diode is provided by diffusion regions 103b and 107b, along with the lower two nanoribbons 101a laterally extending therebetween. In addition, intervening semiconductor layers 101b effectively connect the nanoribbons 101a of the upper and lower regions. The diode junctions can be PIN junctions, wherein the nanoribbons 101 and semiconductor layers 101b (if present) are undoped and provide a relatively thick intrinsic region between the doped diffusions region 103a-b (e.g., p-doped) and the oppositely-doped diffusion regions 107a-b (e.g., n-doped). In other example embodiments, the nanoribbons 101a may be oppositely-doped from diffusion region 103a-b (or 107a-b, as the case may be) so as to provide PN junctions, or partially doped to provide PIN junctions having an intrinsic region shorter than the entire length of the nanoribbon 101a, or undoped to provide PIN junctions having a thicker intrinsic region. To this end, note the thickness of the intrinsic region can be varied from zero (for PN junctions) to some desired thickness (for PIN junctions) suitable for a given application. Note that other embodiments may have just one diode (e.g., one diode in the upper device region, or one diode in the lower device region), or more diodes (e.g., three, four, five, etc.). Further note that the "source" and "drain" labels are somewhat arbitrary, in that each such diffusion region can be similarly used in a lateral diode configuration as explained herein. To this end, there is no particular need to distinguish between source and drain regions, and they each can be more generally referred to as a "source or drain region" 103 or 107 (rather than designating one as a source region and the other as a drain region). The source or drain regions of a given lateral diode may also be referred to as lateral diffusion regions.

Each of structures 108 can be formed as gate structures, for example, via gate-first or gate-last processing, and may include any number of suitable gate materials and configurations. In some such embodiments, each of the structures 108 includes a gate electrode and a gate dielectric between the gate electrode and the uppermost semiconductor layer 101a. Note that only sides of the other underlying layers 101a and 101b within the gate trench will be exposed to the gate process, in examples where the nanoribbon release process is skipped. Spacer 102 may also be considered part of the gate structures. Spacer 102 may be, for example, silicon nitride or oxynitride or oxycarbonitride. The gate dielectrics may be any suitable gate dielectric material(s), such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some example embodiments, an annealing process may be carried out to improve gate dielectric quality when a high-k material is used. Further, the gate electrodes may comprise a wide range of suitable metals or metal alloys, such as aluminum, tungsten, cobalt, ruthenium, molybdenum, titanium, tantalum, copper, titanium nitride, or tantalum nitride, for example.

In some embodiments, the gate dielectrics and/or gate electrodes may include a multilayer structure of two or more material layers or components. For instance, in one such embodiment, the gate dielectric can be a bi-layer structure having a first dielectric material (e.g., silicon dioxide or other oxide native to layer 101*a*) in contact with the uppermost layer 101*a* (or wrapped around 101*a* if released) and a second high-k dielectric material (e.g., hafnium oxide or other high-k dielectric) in contact with the first dielectric material. Likewise, the gate electrode may include a central metal plug or fill metal portion (e.g., tungsten, cobalt, molybdenum, ruthenium) with one or more outer workfunction layers (e.g., titanium nitride for PMOS workfunction, or an aluminum-containing alloy such as titanium aluminum carbide for NMOS workfunction) and/or barrier layers (e.g., tantalum nitride), and/or a resistance reducing cap layer (e.g., cobalt). In some embodiments, the gate dielectric and/or gate electrode may include concentration grading (increasing or decreasing) of one or more materials therein. Such gate processing is not particularly relevant to the diodes, but may be relevant to transistor structures being simultaneously formed in other locations of that the integrated circuit (e.g., logic area of device layer), and consistency of process across a given die may be helpful in avoiding diode-specific processes when possible. Numerous gate structure configurations can be used along with the techniques provided herein, and the present disclosure is not intended to be limited to any particular such configurations.

Likewise, numerous source and drain configurations can be used, and the present disclosure is not intended to be limited to any particular ones. In some example embodiments, the diffusion regions 103*a-b* and 107*a-b* are epitaxial diffusion regions that are provided after the relevant portion of the fin was isolated and etched away or otherwise removed. In other embodiments, the diffusion regions 103*a-b* and 107*a-b* may be doped portions of the fin or substrate, rather than epi regions. In some embodiments using an etch and replace process, the diffusion regions 103*a-b* and/or 107*a-b* are faceted and overgrown from a trench within insulator material (e.g., shallow trench isolation, or gate spacer 102 that deposits on the sides of the fin structure in the source and drain locations), and the corresponding contact structure lands on that faceted portion. Alternatively, in other embodiments, the faceted portion of epi diffusion regions 103*a-b* and/or 107*a-b* can be removed (e.g., via chemical mechanical planarization, or CMP), and the corresponding contact structure lands on that planarized portion.

The diffusion regions 103*a-b* and 107*a-b* can be any suitable semiconductor material and may include any dopant scheme. For instance, diffusion regions 103*a-b* may be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions 107*a-b* can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, source and drain regions 103*a-b* are boron-doped SiGe, and source and drain regions 107*a-b* are phosphorus-doped silicon. In a more general sense, the source and drain regions can be any semiconductor material suitable for a given application.

In some cases, diffusion regions 103*a-b* and 107*a-b* may include a multilayer structure, such as a germanium cap on a SiGe body, or a germanium body and a carbon-containing SiGe spacer or liner between the corresponding channel region and that germanium body. In any such cases, a portion of the diffusion regions 103*a-b* and 107*a-b* may have a component that is graded in concentration, such as a graded germanium concentration to facilitate lattice matching, or a graded dopant concentration to facilitate low contact resistance. Any number of source and drain configurations can be used, and the present disclosure is not intended to be limited to any particular such configurations.

The semiconductor bodies 101*a,* which in this case are nanoribbons, can be any number of semiconductor materials as well, such as group IV material (e.g., silicon, germanium, or SiGe) or group III-V materials (e.g., indium gallium arsenide). In other embodiments, the semiconductor bodies 101*a* may be fins on which the corresponding gate structures are formed to provide double-gate or tri-gate configurations (as opposed to gate-all-around configurations with nanoribbons or wires). The semiconductor bodies 101*a* may be doped (e.g., completely or partially, along its length), or undoped, and may be shaped or sculpted during the gate formation process, according to some embodiments. In some cases, semiconductor bodies 101*a* may be a multilayer structure, such as a SiGe body cladded with germanium, or a silicon body cladded with SiGe. Any number of channel configurations can be used. The semiconductor bodies 101*b* are compositionally different from semiconductor bodies 101*a,* so as to provide etch selectivity that may be useful in a release process (even though semiconductor bodies 101*a* are not released in this example embodiment), so as to facilitate release in another area of the integrated circuit (e.g., such as in the logic section of the device layer where gate-all-around transistors are to be formed).

The contacts 109*a-b* can have any number of configurations. In some example embodiments, the contacts 109*a-b* include a contact metal and a conductive liner or barrier layer, deposited in a contact trench formed over diffusion regions 103*a* and 107*a*. The liner can be, for example, tantalum or tantalum nitride, and metal can be any suitable plug/core material, such as tungsten, aluminum, ruthenium, molybdenum, cobalt, titanium, copper, or alloys thereof. In some cases, the contacts 109*a-b* can be optimized p-type (e.g., 109*a*) and n-type (e.g., 109*b*) similar to p-type and n-type gate electrodes. For instance, according to some such embodiments, the liner can be titanium for NMOS contacts, or nickel or platinum for PMOS contacts. In still other embodiments, the contacts 109 may include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact metal and any liner. Other embodiments may be configured differently. In a more general sense, any number of contact configurations and forming processes can be used, and the present disclosure is not intended to be limited to any particular such configurations or processes. Example contact configurations will be discussed in turn with reference to FIGS. 8a-c.

Interconnect 111 can also have many configurations, but generally includes one or more dielectric layers (e.g., silicon dioxide) having conductive features (e.g., copper or aluminum vias, conductive runs, etc.) formed therein. Example interconnect configurations will be discussed in turn with reference to FIGS. 5a-d and 6a-c.

Figure 1B:
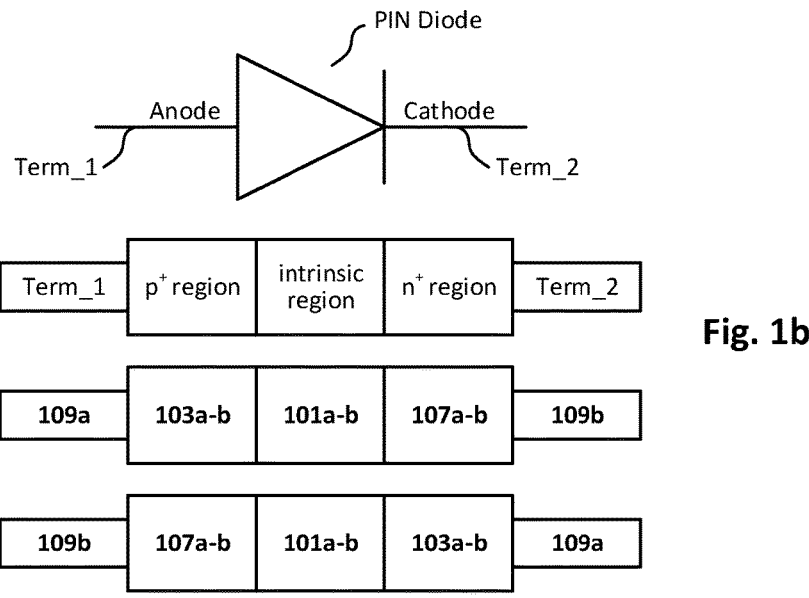
FIG. 1b schematically illustrates a lateral diode of the integrated circuit shown in FIG. 1a, in accordance with some such embodiments.

FIG. 1b schematically illustrates a lateral diode of the integrated circuit shown in FIG. 1a, in accordance with some such embodiments. As can be seen, a PIN diode generally includes a PIN junction between a first terminal (Term_1) and a second terminal (Term_2). The PIN junction includes p-doped ($p^+$) anode region separated from an n-doped ($n^+$) cathode region by an undoped intrinsic region. So, and with further reference to FIG. 1a, note that the anodes may be in one diffusion stack (e.g., 103a-b), and the cathodes are in the other diffusion stack (e.g., 107a-b). Note the individual lateral diodes are effectively in parallel with each other and can be thought of as individual diodes or as part of an overall diode structure. In one such example case (middle of FIG. 1b), contact 109a provides Term_1, and diffusion regions 103a-b provide p-doped anode regions. The intrinsic region is provided by the upper two layers 101a extending from diffusion region 103a and the lower two layers 101a extending from diffusion region 103b, along with the intervening layers 101b (if present). In addition, diffusion regions 107a-b provide the n-doped cathode regions, and contact 109b provides Term_2. In another such example case (bottom of FIG. 1b), contact 109b provides Term_1, and diffusion regions 107a-b provide the p-doped anode regions. The intrinsic region is provided by the upper two layers 101a extending from diffusion region 107a and the lower two layers 101a extending from diffusion region 107b, along with the intervening layers 101b (if present). In addition, diffusion regions 103a-b provide the n-doped cathode regions, and contact 109a provides Term_2. As previously explained, nanoribbons 101a can be doped to provide a PN junction, or partially doped to provide a PIN junction having a thinner intrinsic region, or undoped to provide a PIN junction having a thicker intrinsic region.

Figure 1C:
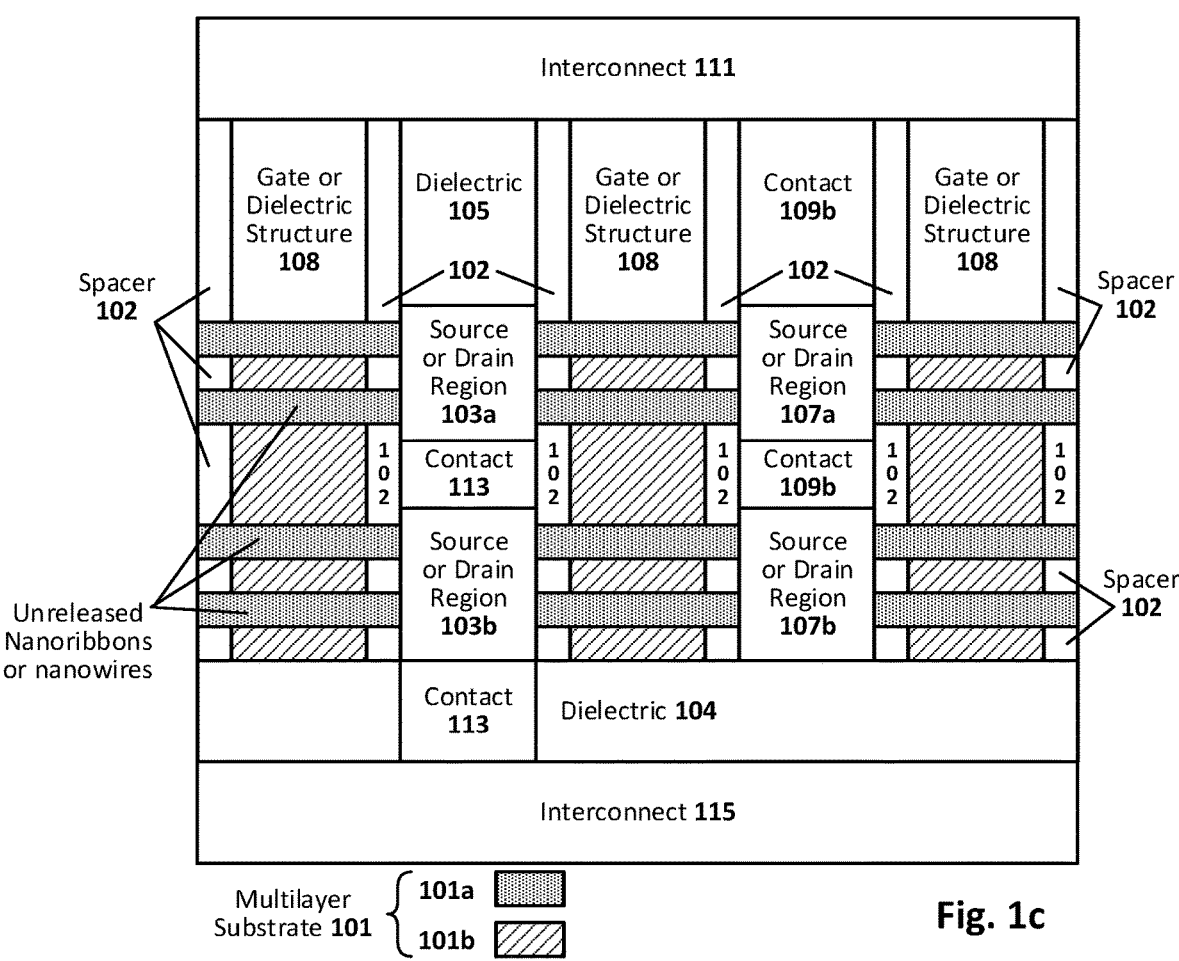
FIG. 1c is a cross-sectional view that illustrates example integrated circuit configured with a lateral diode having both frontside and backside connections, in accordance with some embodiments of the present disclosure.

FIG. 1c is a cross-sectional view that illustrates example integrated circuit configured with a lateral diode having both frontside and backside connections, in accordance with some embodiments of the present disclosure. As can be seen, this example is similar to the example of FIG. 1a, except that this example includes frontside and backside contacts. With respect to features that are similar between the example embodiments of FIGS. 1a and 1c, the previous relevant discussion is equally applicable here. In this example, contact 109b is provisioned during a frontside process and lands on one or more surfaces of each of diffusion regions 107a-b. Contact 109b is coupled to frontside interconnect 111. Note that the location of contact 109a (in FIG. 1a) is left as dielectric 105 (e.g., masked off during processing of contact 109b) in this example. Contact 113 is provisioned in dielectric layer 104 during a backside process and lands on one or more surfaces of diffusion regions 103a-b, and is coupled to backside interconnect 115.

Figure 1D:
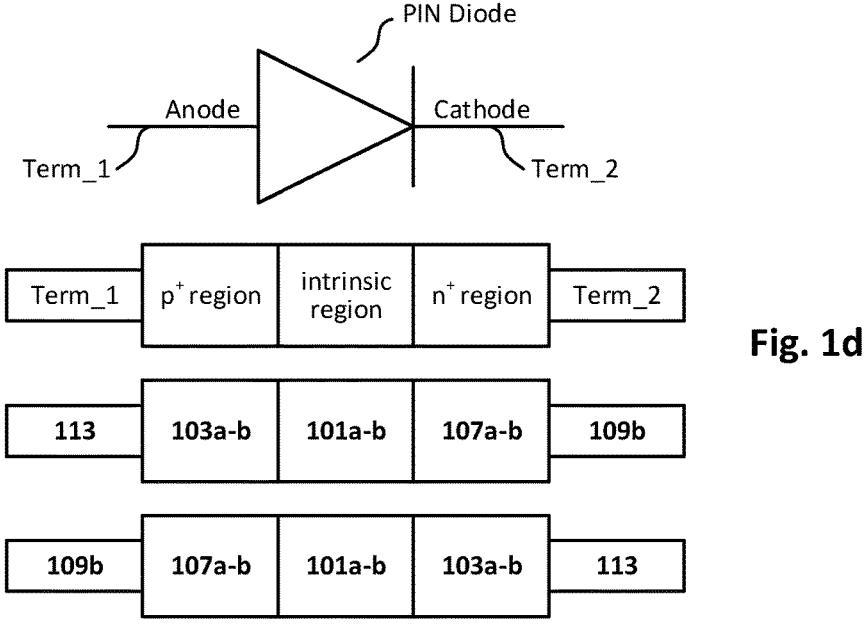
FIG. 1d schematically illustrates a lateral diode of the integrated circuit shown in FIG. 1c, in accordance with some such embodiments.

FIG. 1d schematically illustrates a lateral diode of the integrated circuit shown in FIG. 1c, in accordance with some such embodiments. As shown in the middle of FIG. 1d, contact 113 provides Term_1, and diffusion regions 103a-b provide p-doped anode regions. The intrinsic region is provided by the upper two layers 101a extending from diffusion region 103a and the lower two layers 101a extending from diffusion region 103b, along with the intervening layers 101b (if present). In addition, diffusion regions 107a-b provide the n-doped cathode regions, and contact 109b provides Term_2. In another such example case (bottom of FIG. 1d), contact 109b provides Term_1, and diffusion regions 107a-b provide the p-doped anode regions. The intrinsic region is provided by the upper two layers 101a extending from diffusion region 107a and the lower two layers 101a extending from diffusion region 107b, along with the intervening layers 101b (if present). In addition, diffusion regions 103a-b provide the n-doped cathode regions, and contact 113 provides Term_2. As previously explained, nanoribbons 101a can be doped (similar to one of diffusion regions 103a-b or 107a-b) to provide a PN junction according to some other embodiments, or partially doped to provide a shorter intrinsic region of a PIN junction according to other examples, or undoped to provide a longer intrinsic region according to still other examples.

Figure 2:
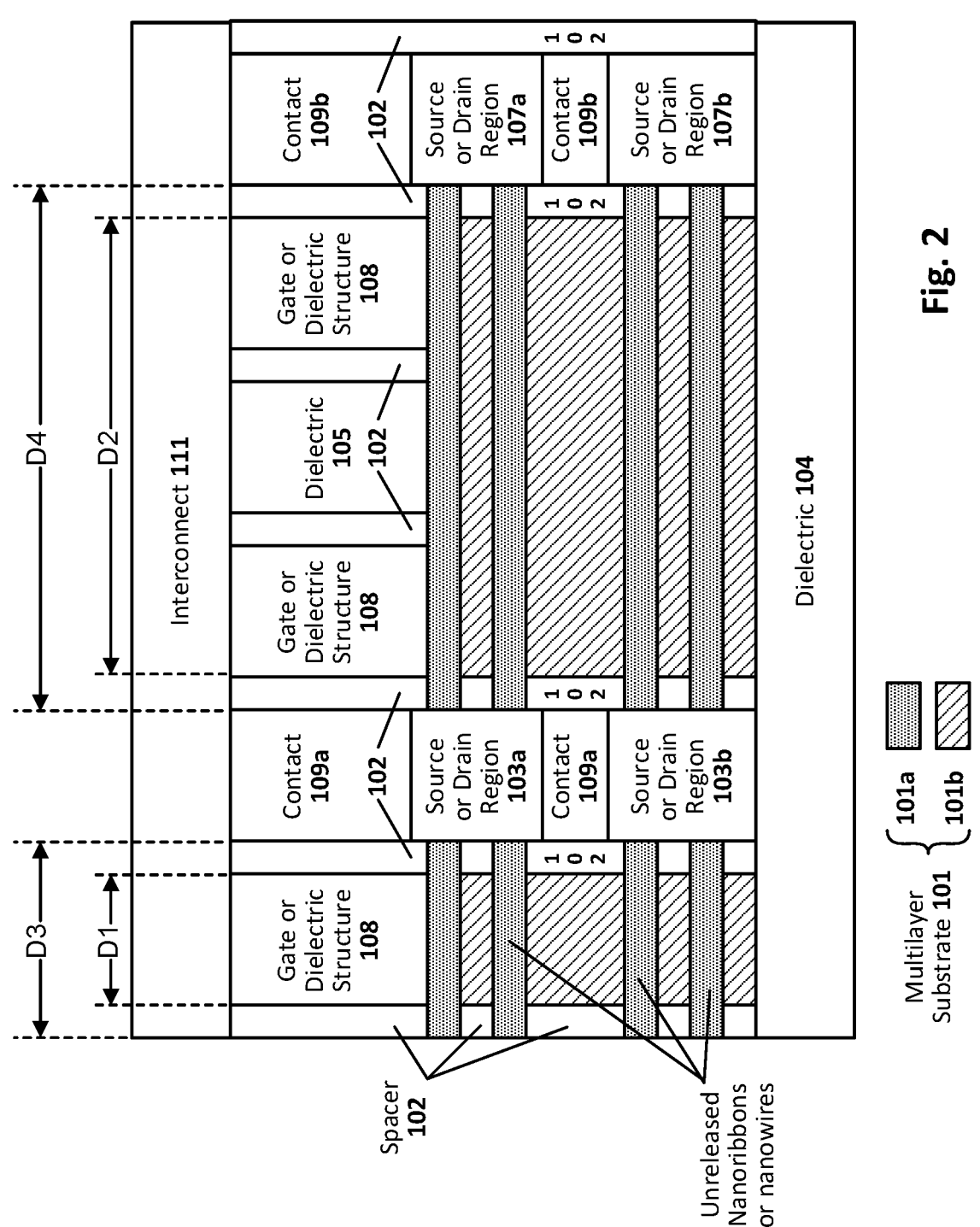
FIG. 2 is a cross-sectional view that illustrates an example integrated circuit configured with a lateral diode having a skipped epitaxial region, in accordance with an embodiment of the present disclosure.

FIG. 2 is a cross-sectional view that illustrates an example integrated circuit configured with a lateral diode having a skipped epitaxial region, in accordance with an embodiment of the present disclosure. As can be seen, this example is similar to the example of FIG. 1a, except that a diffusion region has been skipped (e.g., masked or otherwise blocked off during source/drain processing). With respect to features that are similar between the example embodiments of FIGS. 1a and 2, the previous relevant discussion is equally applicable here. As explained above, skipping an epitaxial growth in one of the source/drain regions between the anode and cathode of a diode structure allows the epi growth mask for diffusion regions 103a-b (e.g., p-type) to terminate on structure 108 just to the right of contact 109a, and the epi growth mask for diffusion regions 107a-b (n-type) to terminate on structure 108 just to the left of contact 109b, thus eliminating or otherwise reducing the risk of growing multiple epitaxial polarities in the same opening due to misregistration. Additionally, dielectric 105, without an added conductor, between the anode and cathode assists in reducing the anode-to-cathode coupling capacitance.

As can be seen, there are a number of structural features associated with a skipped epitaxial region, according to some embodiments. For instance, in this example case, assume the middle two structures 108 are gate structures—note how there is no contact or epitaxial region between them, which is atypical (two laterally neighboring gates with no intervening source or drain region). In other embodiments, the structures 108 are dielectric structures, so as to reduce the conductive material between the anode and cathode. Further note dielectric 105 located between the two structures 108. Such a dielectric 105 would normally be removed and replaced with a contact, if a diffusion region was populated in the underlying region. Further note, for example, the different distances between spacers 102, as well as the different lengths of nanoribbons 101a.

In more detail, note the length of the uppermost nanoribbon 101a that extends from the diffusion region 103a to diffusion region 107a, the length extending the distance D4. A first structure 108 to the right of contact 109a is on that length of the uppermost nanoribbon 101a, and a second structure 108 to the left of contact 109b is on that length of the uppermost nanoribbon 101a. Further note there is no additional diffusion region along the length of the uppermost nanoribbon 101a (the nanoribbon is unbroken for distance D4). Further note, for example, the how the distance D1 between the two leftmost spacers 102 is much smaller than the distance D2 between the next two spacers 102 (e.g., D2 is at least 1.5 times larger than D1, and in some cases D2 is about 2 times or more larger than D1). Further note that the leftmost nanowires 101a extend a total distance D3, while the rightmost nanowires 101a extend a total distance D4 (e.g., D4 is at least 1.5 times larger than D3, and in some cases D4 is about 2 times or more larger than D3).

Note that, while gate structures 108 are not particularly relevant to diode performance (other than being a parasitic), allowing standard or modified gate processes to be carried out may be less disruptive to overall processing of a given die, relative to completely eliminating a gate processing in some portions of the die. To this end, gates provisioned in a diode area may be considered dummy, or unutilized, gates.

Figure 3A:
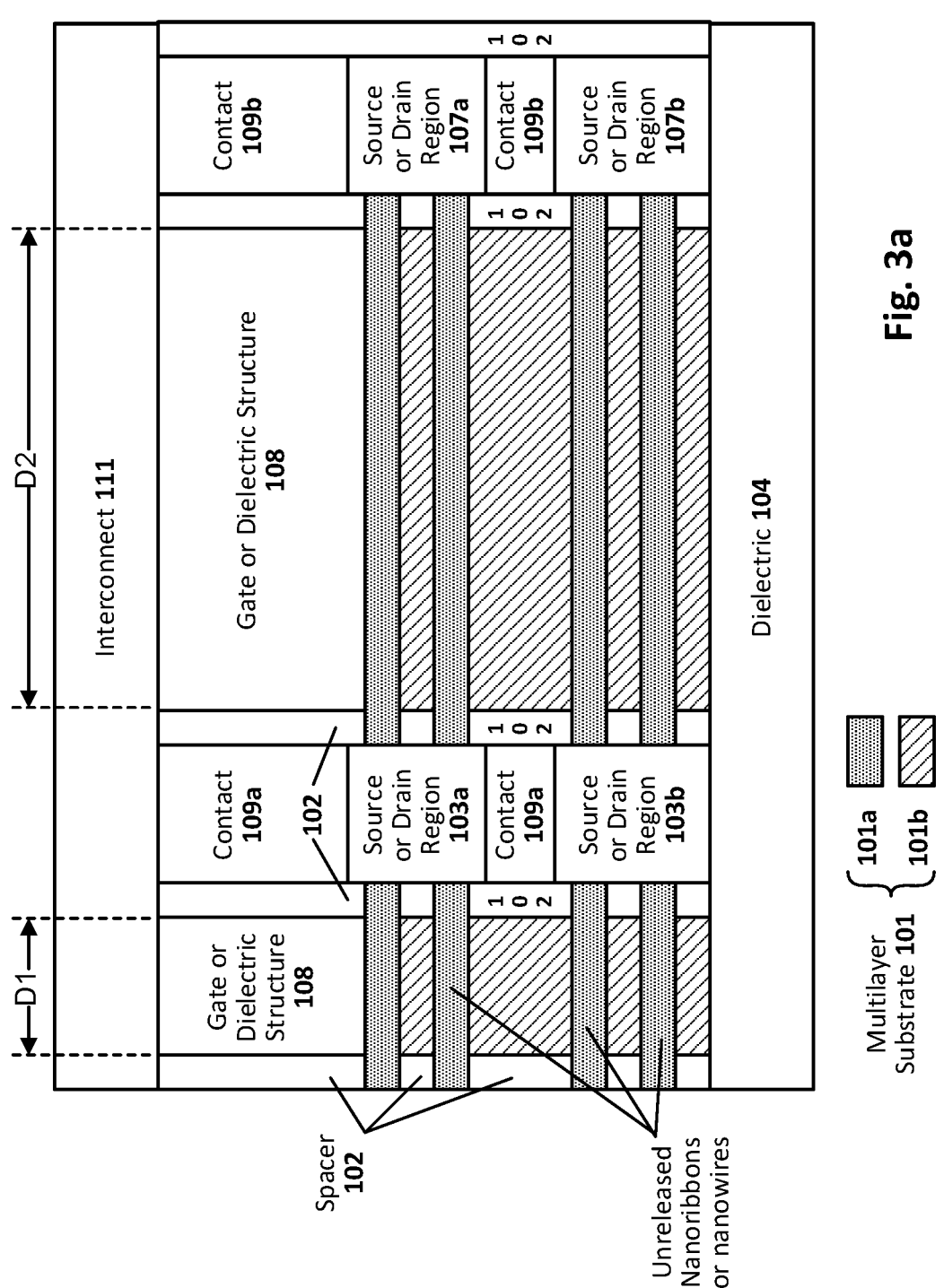
FIG. 3a is a cross-sectional view that illustrates an example integrated circuit configured with a lateral diode having an elongated gate or dielectric structure, in accordance with an embodiment of the present disclosure.

FIG. 3a is a cross-sectional view that illustrates an example integrated circuit configured with a lateral diode having an elongated gate or dielectric structure, in accordance with an embodiment of the present disclosure. As can be seen, this example is similar to the example of FIG. 1a, except that structure 108 is elongated. With respect to features that are similar between the example embodiments of FIGS. 1a and 3a, the previous relevant discussion is equally applicable here. Note the how the leftmost structure 108 extends a distance D1 between its corresponding spacers 102, and the rightmost structure 108 extends a distance D2 between its corresponding spacers 102, and that distance D1 is much smaller than distance D2 (e.g., D2 is at least 1.5 times larger than D1, and in some cases D2 is about 2 times or more larger than D1). As explained above, this technique allows for the greatest registration margin as the structure 108 length can be made arbitrarily large to support the misregistration of the anode and cathode growth masks.

Figure 3B:
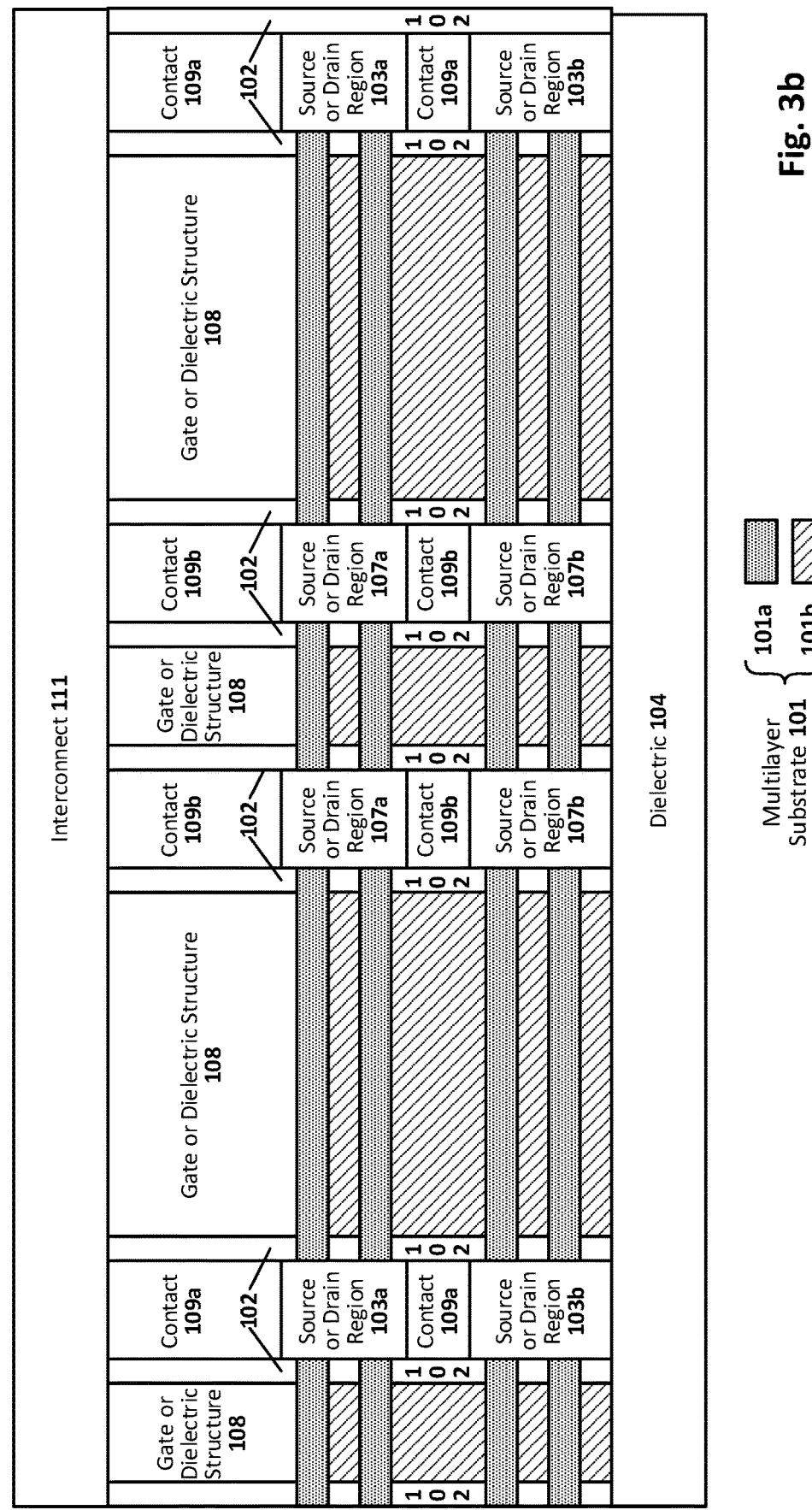
FIG. 3b is a cross-sectional view that illustrates an example integrated circuit configured with a lateral diode having an elongated gate or dielectric structure, in accordance with another embodiment of the present disclosure.

FIG. 3b is a cross-sectional view that illustrates an example integrated circuit configured with a lateral diode having an elongated gate or dielectric structure, in accordance with another embodiment of the present disclosure. This example is similar to that shown in FIG. 3a, but further shows that structures 108 between like diffusion regions can remain closer together. Here, the gate structure 108 between contacts 109b can remain at a standard length (e.g., such as distance D1, or as determined by the critical dimension of a given process node), because that structure 108 is between like diffusion regions 107a-b. Thus, there is no added capacitance since the signals on both sides of that structure are the same. Leaving these structures 108 in place can ease density restrictions in some technologies. Further recall that structure 108 can be a gate structure or a dielectric structure. Replacing conductive gate materials with dielectric materials of an isolation structure helps reduce anode-to-cathode coupling.

Figure 4A:
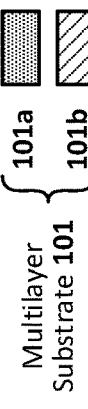
FIG. 4a is a cross-sectional view that illustrates an example integrated circuit configured with a lateral diode in the lower device region and not in the upper device region, in accordance with an embodiment of the present disclosure.

FIG. 4a is a cross-sectional view that illustrates an example integrated circuit configured with a lateral diode in the lower device region and not in the upper device region, in accordance with an embodiment of the present disclosure. As explained above, process cost could be saved by allowing for uniform polarity of epitaxial growth in one of the upper or lower device region such as done for transistors, and populating diodes having the oppositely-doped diffusion regions in the other of the upper or lower device region. Alternatively, the unused device region (non-diode region) may be passivated or left as a dummy transistor device (not contacted) to reduce capacitance. With respect to features that are similar between the example embodiments of FIGS. 1a-d, 2, 3a-b and 4a, the previous relevant discussion is equally applicable here.

In this example case, the lower device region includes a first diode and a second diode. Each diode includes a first backside contact 113a, a first diffusion region 103b (anode or cathode), an intrinsic region 101a/101b (if not doped or partially doped), a second diffusion region 107b (the other of the anode or cathode), and a second backside contact 113b. Recall in some cases the intrinsic region may be doped thus providing an extension of one of the diffusion regions so as to form a PN junction, or partially doped to provide a PIN junction having a shorter intrinsic region. Interconnect 115 provides connections to the contacts 113a-b. Note in this example embodiment that the nanoribbons 101a in the lower device region are unreleased (layers 101b are left in), and that two of the four structures 108 are elongated so as to provide greater distance between the anode and cathode of the diodes, as previously explained above.

As can be further seen, the upper device region includes a plurality of transistors. Each transistor includes a source region 107a and a drain region 107a (which can be structurally and compositionally the same), a gate structure 108 (which may also be a dielectric structure 108), and frontside contacts 109. In this example case, semiconductor layers 101b have been selectively removed from the upper channel regions so as to release the upper nanoribbons 101a. In such a case, note that a gate-all-around configuration can be provided, where a high-k metal gate (HKMG) structure 108 wraps around each of the two nanoribbons 101a within the upper channel region. A dielectric layer 412 isolates the upper structures 108 from the lower channel regions. Gate structures 108 can be provided, for example, during a frontside gate process that includes: exposing the upper channel regions (recess dielectric to top of lower channel region); deposit layer 412 and etch back any excess that deposits on upper channel region; conformally deposit gate dielectric onto upper nanoribbons and other exposed areas within gate trench; and deposit gate electrode on the gate dielectric. In other example configurations where the upper transistors are dummy devices or otherwise not functional, a dielectric structure 108 (e.g., silicon dioxide, or a low-k dielectric such as porous silicon dioxide) can be deposited into the channel region rather than a gate structure, to provide isolation between the underlying anode and cathode regions.

FIG. 4b is a cross-sectional view that illustrates an example integrated circuit configured with a lateral diode in the upper device region and not in the lower device region, in accordance with an embodiment of the present disclosure. With respect to features that are similar between the example embodiments of FIGS. 1a-d, 2, 3a-b, 4a and 4b, the previous relevant discussion is equally applicable here.

In this example case, the upper device region includes a first diode and a second diode. Each diode includes a first frontside contact 109a, a first diffusion region 103a (anode or cathode), an intrinsic region 101a/101b (if not doped or partially doped), a second diffusion region 107a (the other of the anode or cathode), and a second frontside contact 109b. Recall in some cases the intrinsic region may be doped, thus providing an extension of one of the diffusion regions so as to form a PN junction, or partially doped to provide a PIN junction having a shorter intrinsic region. Interconnect 111 provides connections to the contacts 109*a-b*. Note in this example that the nanoribbons 101*a* are unreleased (layers 101*b* are left in), and that an epitaxial diffusion region is skipped between each anode/cathode pair so as to reduce anode-to-cathode coupling capacitance, as previously explained above.

As can be further seen, the lower device region includes a plurality of transistors. Each transistor includes a source region 103*b* and a drain region 103*b* (e.g., same structure and composition), a gate structure 410 (which may also be a dielectric structure 410), and backside contacts 113. In this example case, semiconductor layers 101*b* have been selectively removed from the lower channel regions so as to release the lower nanoribbons 101*a*. In such a case, note that a gate-all-around configuration can be provided, where a HKMG structure 410 wraps around each of the two nanoribbons 101*a* within the lower channel region. A dielectric layer 412 isolates the lower gate structures 410 from the upper channel regions. Gate structures 410 can be provided, for example, during a backside gate process that includes: exposing the lower channel regions (recess dielectric to upper channel region); deposit layer 112 and etch back any excess that deposits on lower channel region; conformally deposit gate dielectric onto lower nanoribbons and other exposed areas within gate trench; and deposit gate electrode on the gate dielectric. Note this process can be done with the integrated circuit structure inverted, to provide access to the backside. In other examples where the lower transistors are dummy devices or otherwise not functional, a dielectric structure 410 (e.g., silicon dioxide, or a low-k dielectric such as porous silicon dioxide) can be deposited into the channel region rather than a gate structure, to provide isolation between the upper anode and cathode regions. Note that spacer 414 and source and drain regions 103*b* can also be provided by a backside process similar to frontside processing previously discussed, as can contacts 113 and interconnect 115, according to some embodiments.

Figure 5A:
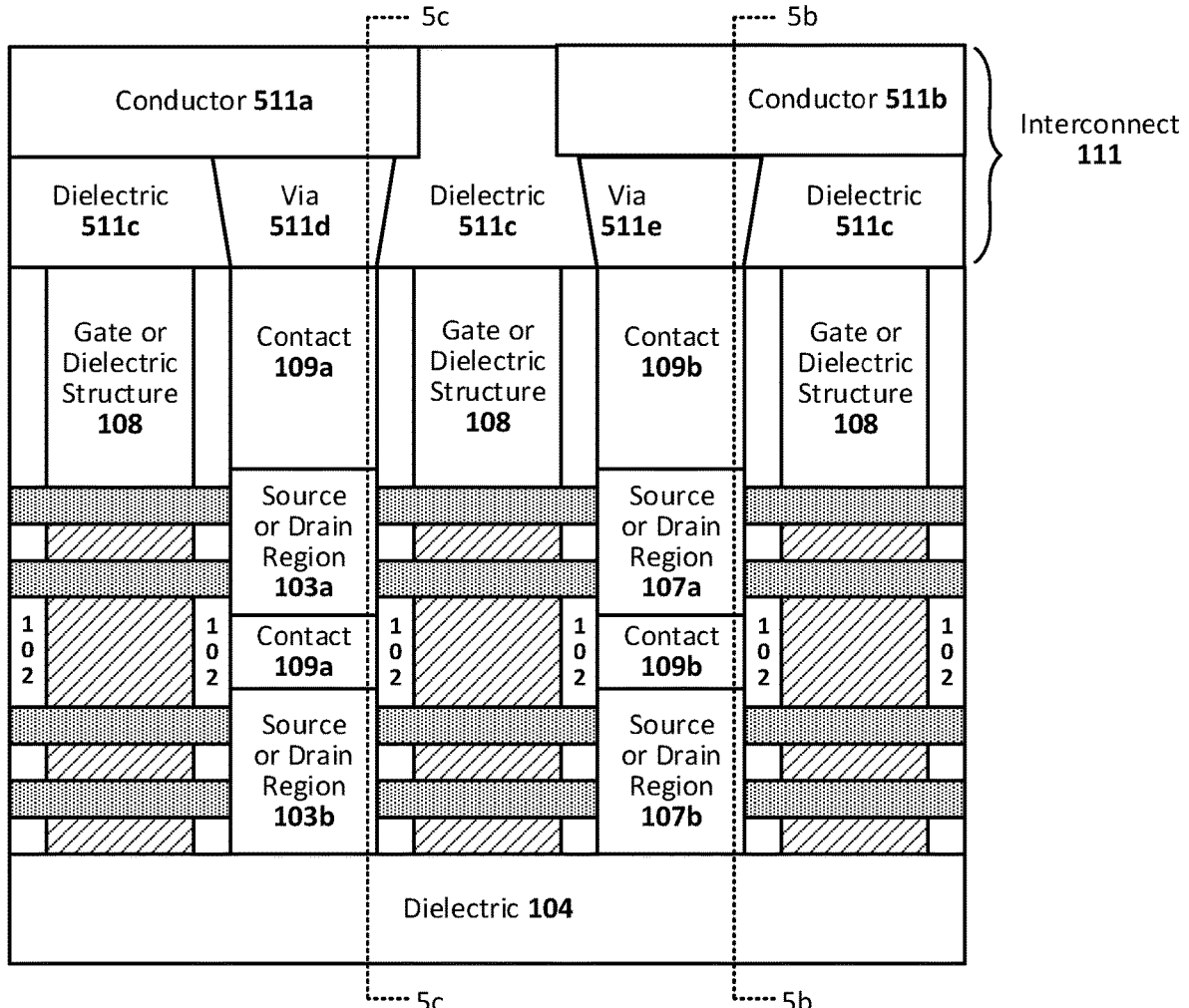
FIGS. 5a-d are cross-sectional views (5b-d are orthogonal to 5a) that illustrate further details with respect to example frontside and backside interconnects of an integrated circuit configured with a lateral diode, in accordance with an embodiment of the present disclosure.
Figure 5B:
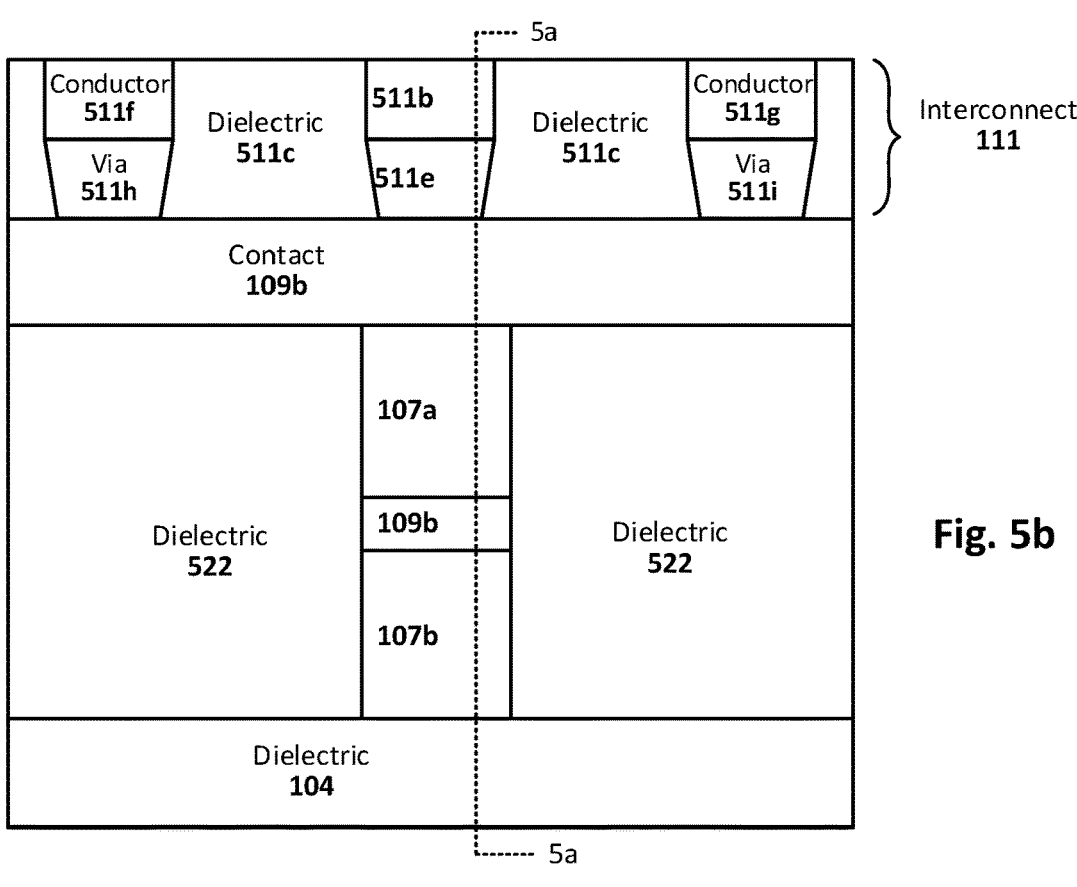
Figure 5C:
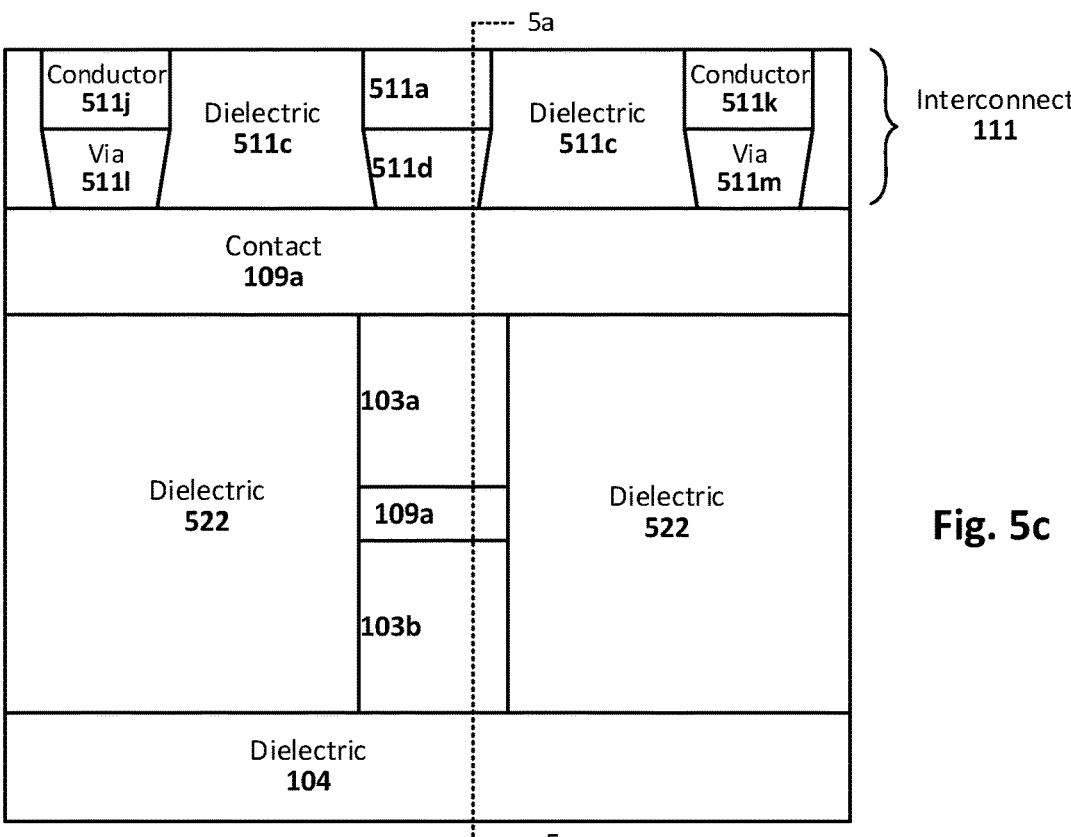

FIGS. 5*a-d* are cross-sectional views (5*b-d* are orthogonal to 5*a*) that illustrate further details with respect to example frontside and backside interconnects of an integrated circuit configured with a lateral diode, in accordance with an embodiment of the present disclosure. The cross-section of FIG. 5*a* is parallel to, and through, the fin structure (dashed line 5*a*-5*a* in each of FIGS. 5*b-c*). With respect to features that are similar between the embodiments of FIGS. 1*a-d*, 2, 3*a-b*, 4*a-b* and 5*a-d*, the previous relevant discussion is equally applicable here. As can be seen, the interconnect 111 includes one or more dielectric layers 511*c*, vias 511*d-e*, and conductors 511*a-b*. Via 511*d* is on contact 109*a*, and via 511*e* is on contact 109*b*. Conductor 511*a* is on via 511*d*, while conductor 511*b* is on via 511*e*. Thus, separate frontside access points to the anode and cathode of the underlying diode structure is provided. Recall that the diode structure may include multiple diodes effectively connected in parallel (e.g., a first diode in the upper device region and a second diode in the lower device region). The cross-section of FIG. 5*b* is perpendicular to the fin structure and through the diffusion regions 107*a-b* (dashed line 5*b*-5*b* in each of FIG. 5*a*). As can be seen, contact 109*b* extends laterally across the top of diffusion region 107*a*, which effectively allows interconnect 111 to provide multiple connection points to the upper diffusion region 107*a*. In this example case, interconnect 111 includes multiple vias (511*e*, 511*h*, and 511*i*) formed in dielectric 511*c*, with each via (511*e*, 511*h*, and 511*i*) in contact with a corresponding conductor (511*b*, 511*f*, and 511*g*). The cross-section of FIG. 5*c* is perpendicular to the fin structure and through the diffusion regions 103*a-b* (dashed line 5*c*-5*c* in each of FIG. 5*a*). As can be seen, contact 109*a* extends laterally across the top of diffusion region 103*a*, which effectively allows interconnect 111 to provide multiple connection points to the upper diffusion region 103*a*. In this example case, interconnect 111 includes multiple vias (511*d*, 511*l*, and 511*m*) formed in dielectric 511*c*, with each via (511*d*, 511*l*, and 511*m*) in contact with a corresponding conductor (511*a*, 511*j*, and 511*k*). Such a interconnect scheme can be provisioned during frontside interconnect processing. Numerous other interconnect schemes can be used.

Figure 5D:
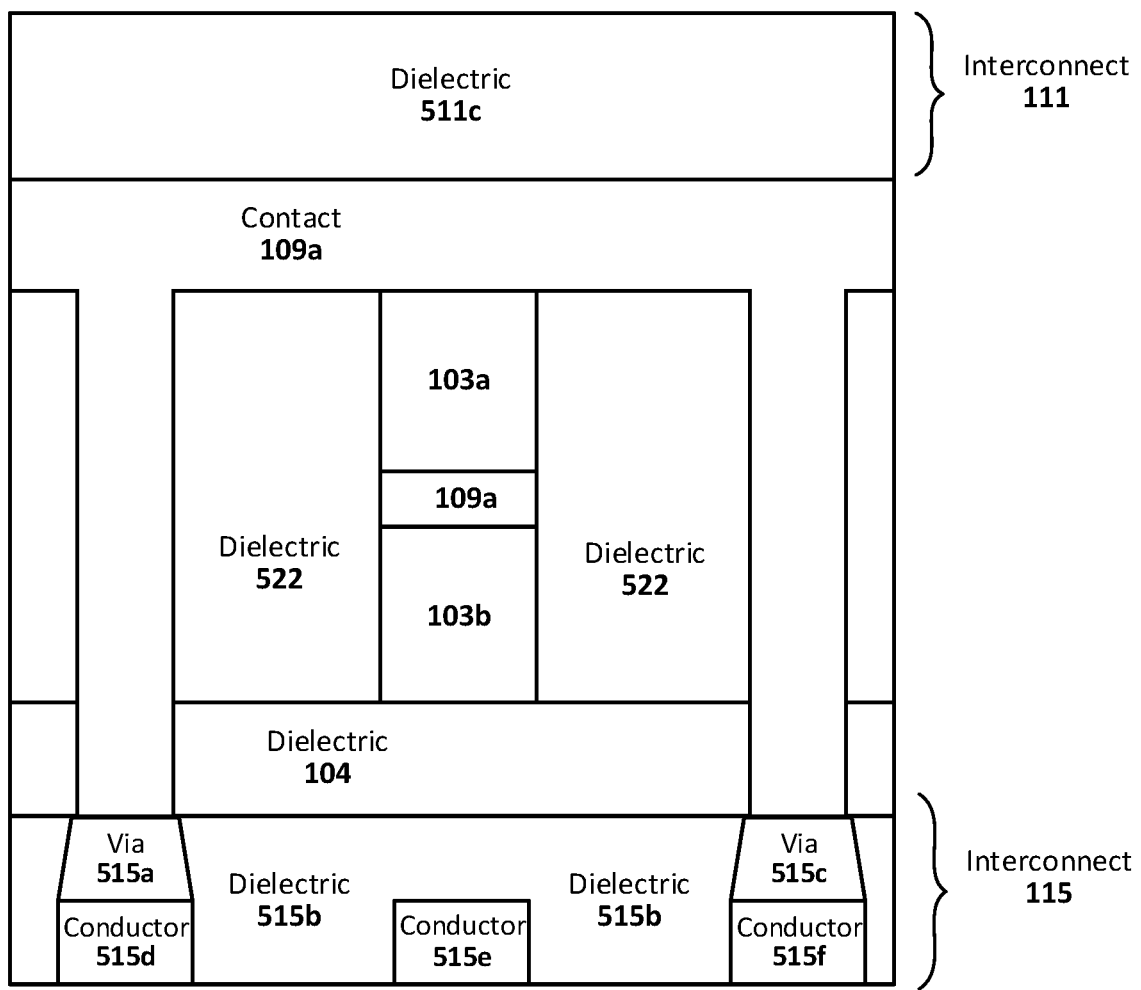

One example variation is shown in FIG. 5*d*, which shows a cross-section perpendicular to the fin structure and through the diffusion regions 103*a-b* (dashed line 5*c*-5*c* in each of FIG. 5*a*). As can be seen, contact 109*a* extends laterally across the top of diffusion region 103*a*. In this example case, however, instead of frontside interconnection, contact 109*a* is fed through to the backside interconnect 115, which includes multiple vias (515*a* and 515*c*) formed in dielectric 515*b*, with each via (515*a* and 515*c*) in contact with a corresponding conductor (515*d* and 515*f*). Such a interconnect scheme can be provisioned during backside interconnect processing.

Figure 6A:
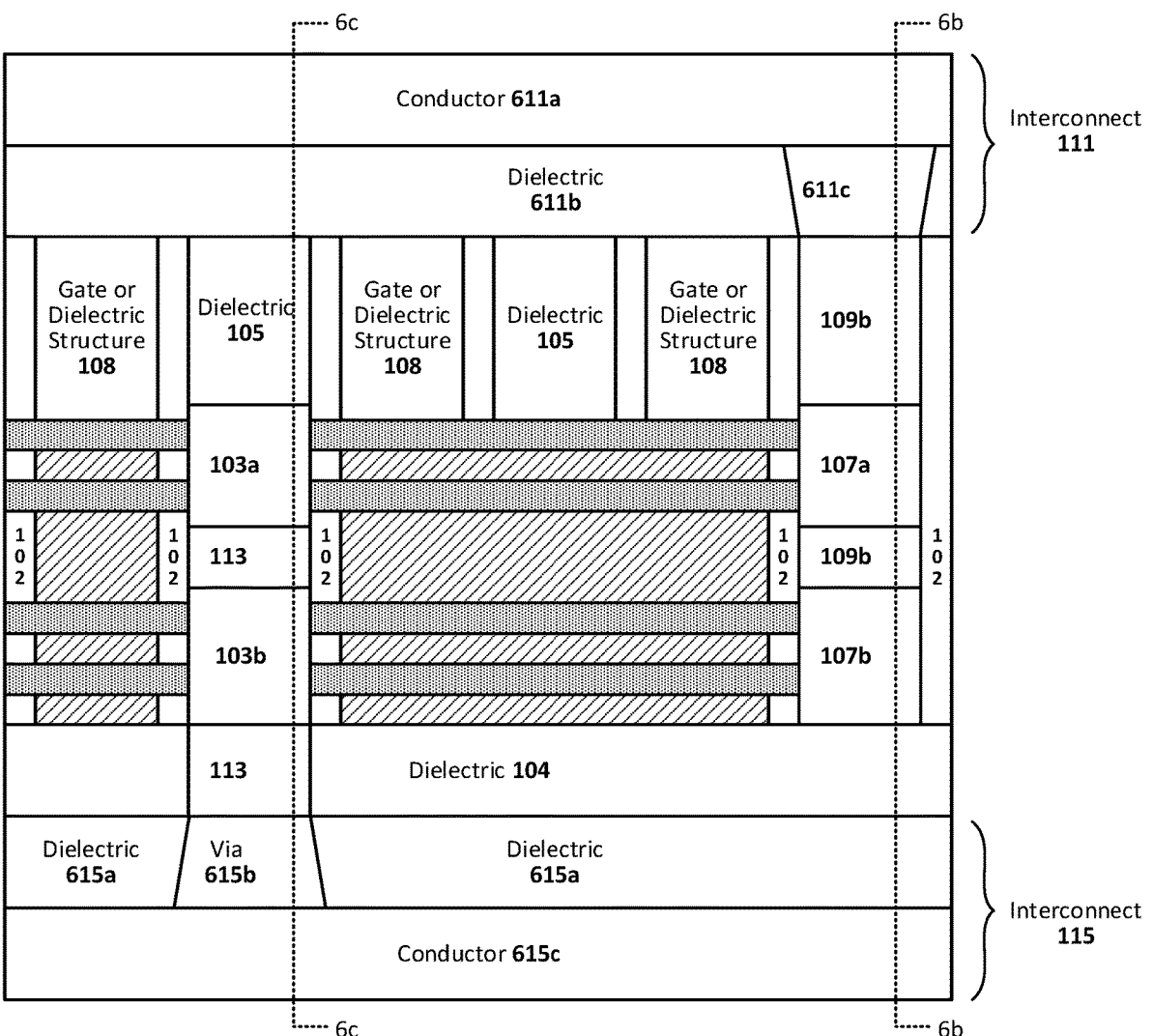
FIGS. 6a-c are cross-sectional views (6b-c are orthogonal to 6a) that illustrate further details with respect to example frontside and backside interconnects of an integrated circuit configured with a lateral diode, in accordance with an embodiment of the present disclosure.
Figure 6B:
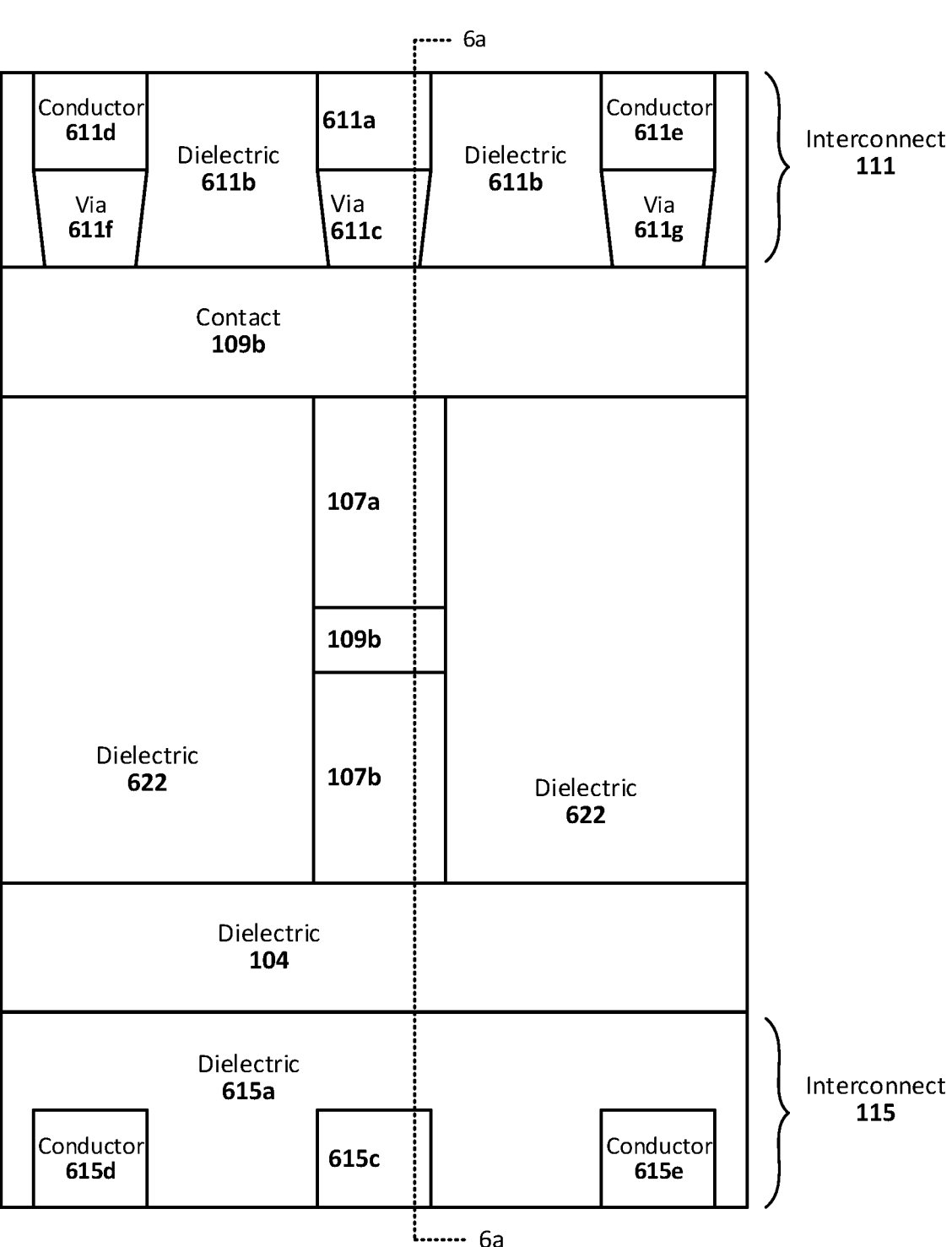
Figure 6C:
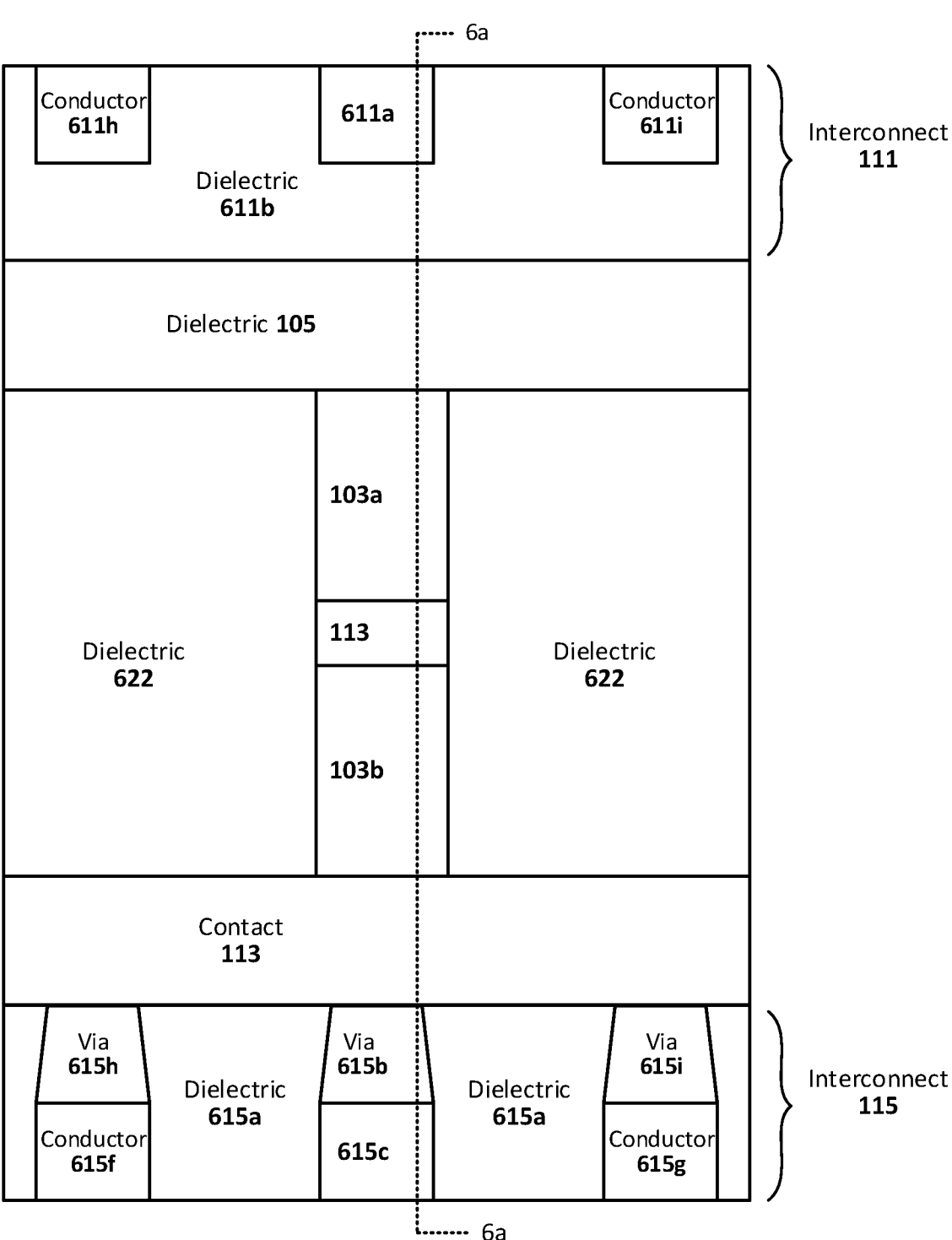

FIGS. 6*a-c* are cross-sectional views (6*b-c* are orthogonal to 6*a*) that illustrate further details with respect to example frontside and backside interconnects of an integrated circuit configured with a lateral diode, in accordance with an embodiment of the present disclosure. The cross-section of FIG. 6*a* is parallel to, and through, the fin structure (dashed line 6*a*-6*a* in each of FIGS. 6*b-c*). With respect to features that are similar between the example embodiments of FIGS. 1*a-d*, 2, 3*a-b*, 4*a-b*, 5*a-d* and 6*a-c*, the previous relevant discussion is equally applicable here.

As can be seen, the frontside interconnect 111 includes one or more dielectric layers 611*b*, via 611*c*, and conductor 611*a*. Via 611*c* is on contact 109*b*. Conductor 611*a* is on via 611*c*. Thus, a frontside access point to the anode or cathode of the underlying diode structure is provided. As can be further seen, the backside interconnect 115 includes one or more dielectric layers 615*a*, via 615*b*, and conductor 615*c*. Via 615*b* is on contact 113. Conductor 615*c* is on via 615*b*. Thus, a backside access point to the anode or cathode of the above diode structure is provided.

The cross-section of FIG. 6*b* is perpendicular to the fin structure and through the diffusion regions 107*a-b* (dashed line 6*b*-6*b* in each of FIG. 6*a*). As can be seen, contact 109*b* extends laterally across the top of diffusion region 107*a*, which effectively allows frontside interconnect 111 to provide multiple connection points to the upper diffusion region 107*a*. In this example case, interconnect 111 includes multiple vias (611*c*, 611*f*, and 611*g*) formed in dielectric 611*b*, with each via (611*c*, 611*f*, and 611*g*) in contact with a corresponding conductor (611*a*, 611*d*, and 611*e*). As can be further seen, backside interconnect 115 includes multiple conductors (615*c*, 615*d*, and 615*e*) formed in dielectric 615*a*. However, there are no vias in this particular cross-section of interconnect 115, as diffusion regions 107*a-b* are frontside-connected in this example case.

The cross-section of FIG. 6*c* is perpendicular to the fin structure and through the diffusion regions 103*a-b* (dashed line 6*c*-6*c* in each of FIG. 6*a*). As can be seen, frontside interconnect 111 includes multiple conductors (611*a*, 611*h*, and 611*i*) formed in dielectric 611*b*. However, there are no vias in this particular cross-section of interconnect 111, as diffusion regions 103*a-b* are backside-connected in this example case. As can be further seen, contact 113 extends laterally across the bottom of diffusion region 103b, which effectively allows interconnect 115 to provide multiple connection points to the lower diffusion region 103b. In this example case, interconnect 115 includes multiple vias (615b, 615h, and 615i) formed in dielectric 615a, with each via (615b, 615h, and 615i) in contact with a corresponding conductor (615c, 615f, and 615g).

In any of these example embodiments, interconnect 111 can be provisioned during frontside interconnect processing, and interconnect 115 can be provisioned during backside interconnect processing. Numerous interconnect schemes can be used.

FIGS. 7a-f are cross-sectional views that each illustrate an example integrated circuit configured with a lateral diode having a conduction path through a sub-fin region, in accordance with an embodiment of the present disclosure. With respect to features that are similar between the example embodiments of FIGS. 1a-d, 2, 3a-b, 4a-b, 5a-d, 6a-c and 7a-f, the previous relevant discussion is equally applicable here. One difference with respect to the examples of FIGS. 1a-d, 2, 3a-b, 4a-b, 5a-d, and 6a-c, is that the examples of FIG. 7a-f have a semiconductor layer 101a instead of dielectric layer 104. This layer is referred to as a sub-fin portion of the multilayer substrate 101, which was removed and replaced with dielectric layer 104 during backside processing, according to some embodiments. In the embodiments of FIGS. 7a-f, however, this sub-fin portion is left intact. The presence of a sub-fin region underneath the bottom diffusion regions opens up a second conducting path from the anode to the cathode. If the sub-fin is doped, a PN junction is formed where the epitaxy of the bottom diffusion regions 103b and 107b touch the sub-fin. Alternatively, the sub-fin can be left undoped, or partially doped, to provide an intrinsic region between the oppositely-doped diffusion regions 103b and 107b so as to provide a PIN junction. Thus, while a first conduction path is provided in the channel region by nanoribbons 101a (and layers 101b, if present), and a second conduction path is provided through the sub-fin. Note in this example case, the diode symbols show diffusion regions 103a-b as the anode (p-doped) and diffusion regions 107a-b as the cathode (n-doped); other embodiments may be the reverse of this.

Figure 7A:
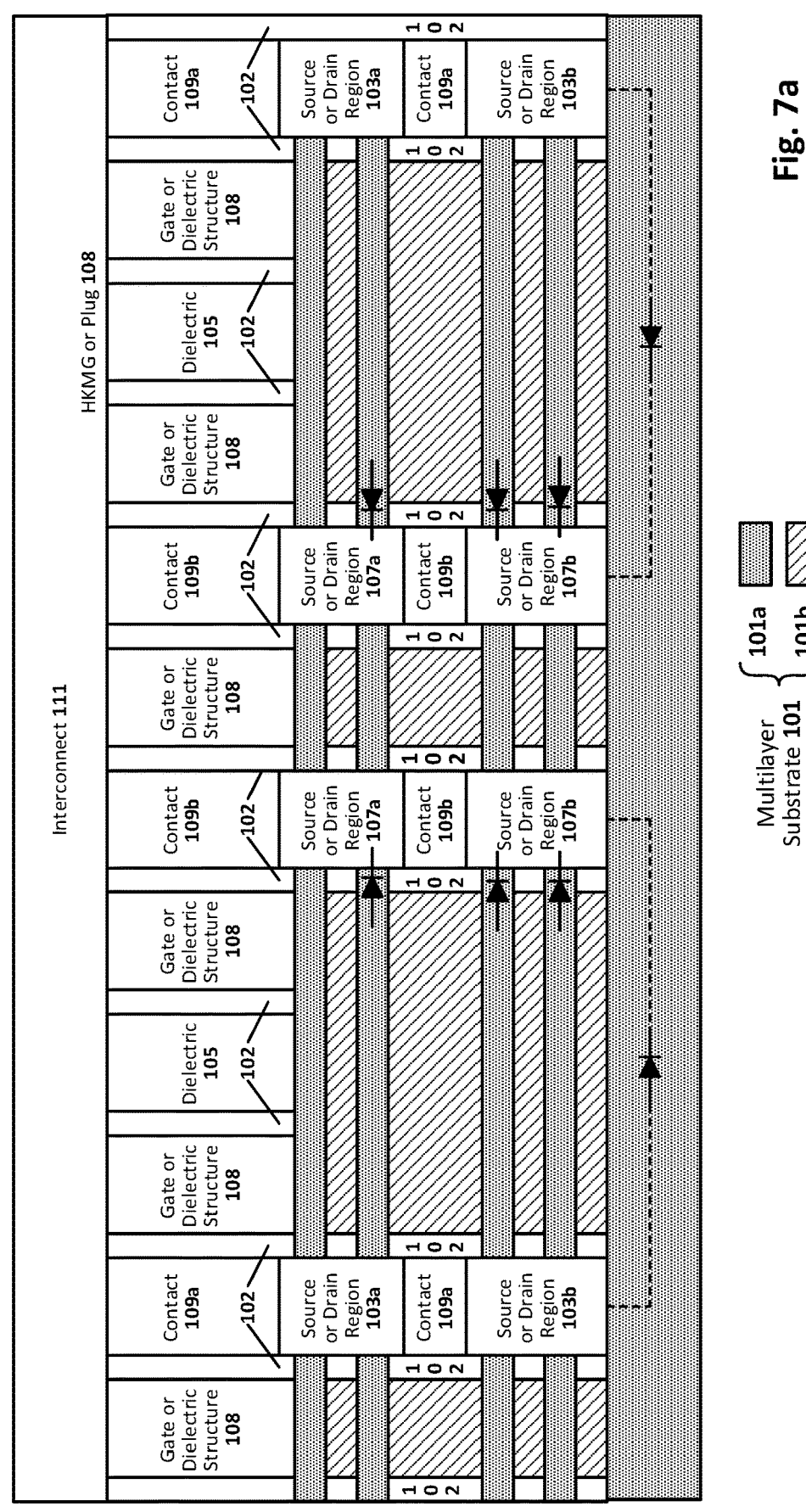
FIGS. 7a-f are cross-sectional views that each illustrate an example integrated circuit configured with a lateral diode having a conduction path through a sub-fin region, in accordance with an embodiment of the present disclosure.
Figure 7B:
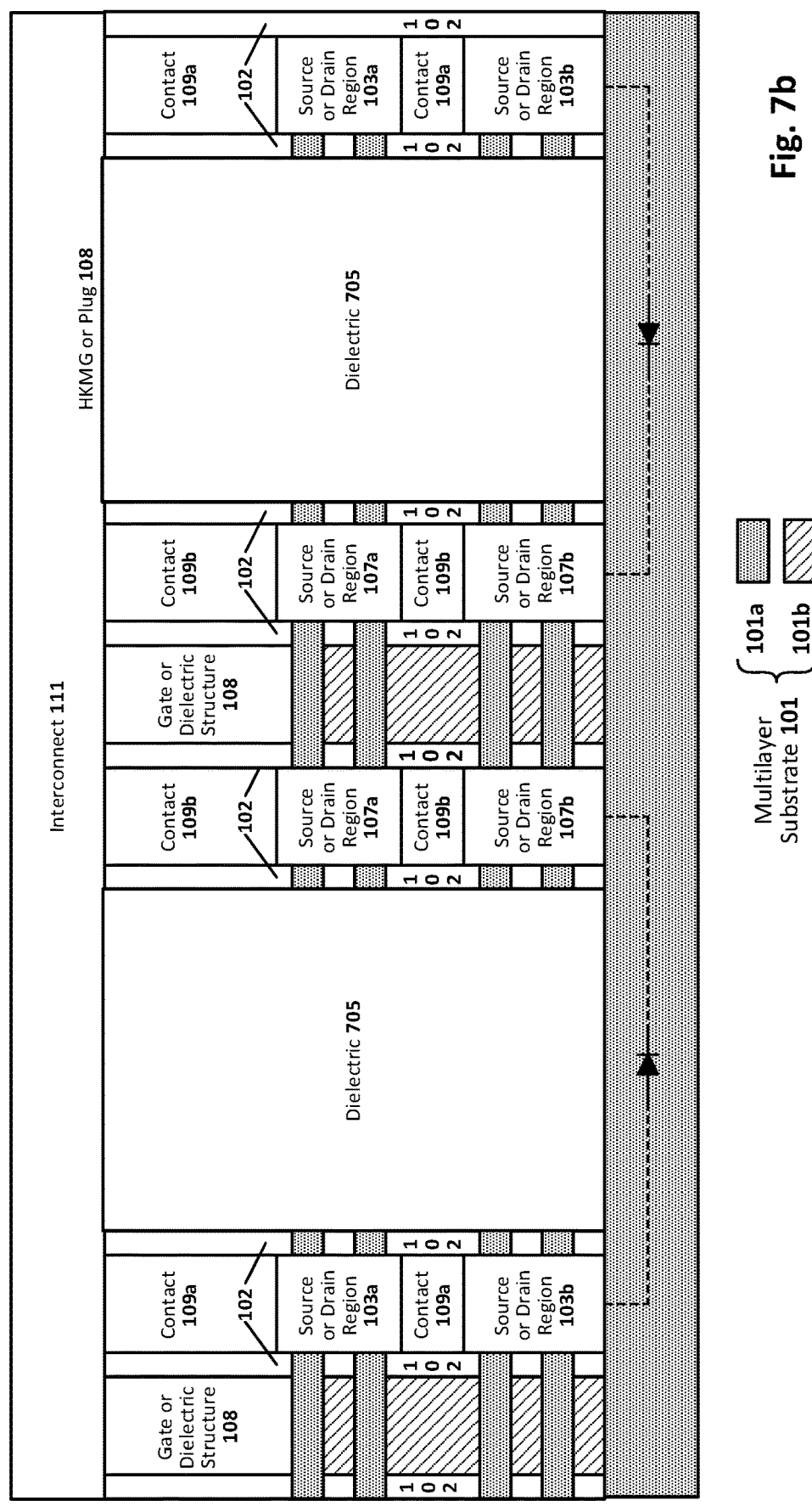
Figure 7C:
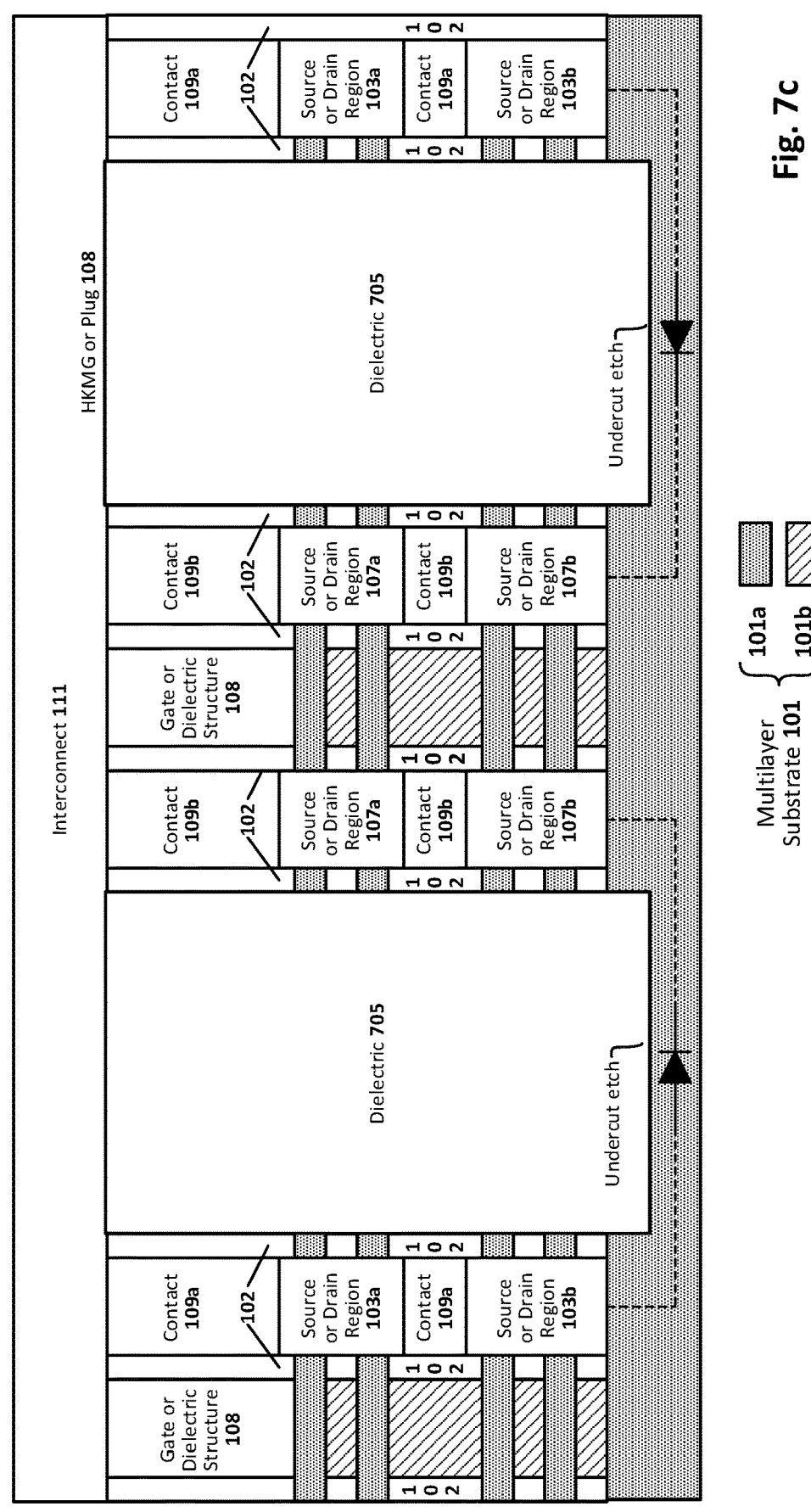

In some embodiments, such as the one shown in FIG. 7b, the nanoribbons 101a (and layers 101b, if present) can be removed from the channel region, such that dielectric structure 705 (also called an isolation structure) fills the entire channel region, to further improve isolation between the anode and cathode of a given diode structure. In such cases, the only conduction path for the diodes is through the sub-fin. Thus, while two nanoribbons 101a are shown in each channel region in FIG. 7a, other examples may include fewer nanoribbons 101a per channel region (e.g., one or zero, as shown in FIG. 7b), or more nanoribbons 101a per channel region (e.g., three or four). FIG. 7c shows an example similar to that shown in FIG. 7b, except that an undercut etch is introduced into the sub-fin, so as to push diode current under the undercut thereby helping suppress sub-fin leakage. The depth of the etch can vary from one embodiment to the next, but in some cases is in the range of 20 to 200 nanometers (nm). The undercut edge can be a continuation of the etch process that removes the channel region materials prior to deposition of isolation structure 705.

Figure 7D:
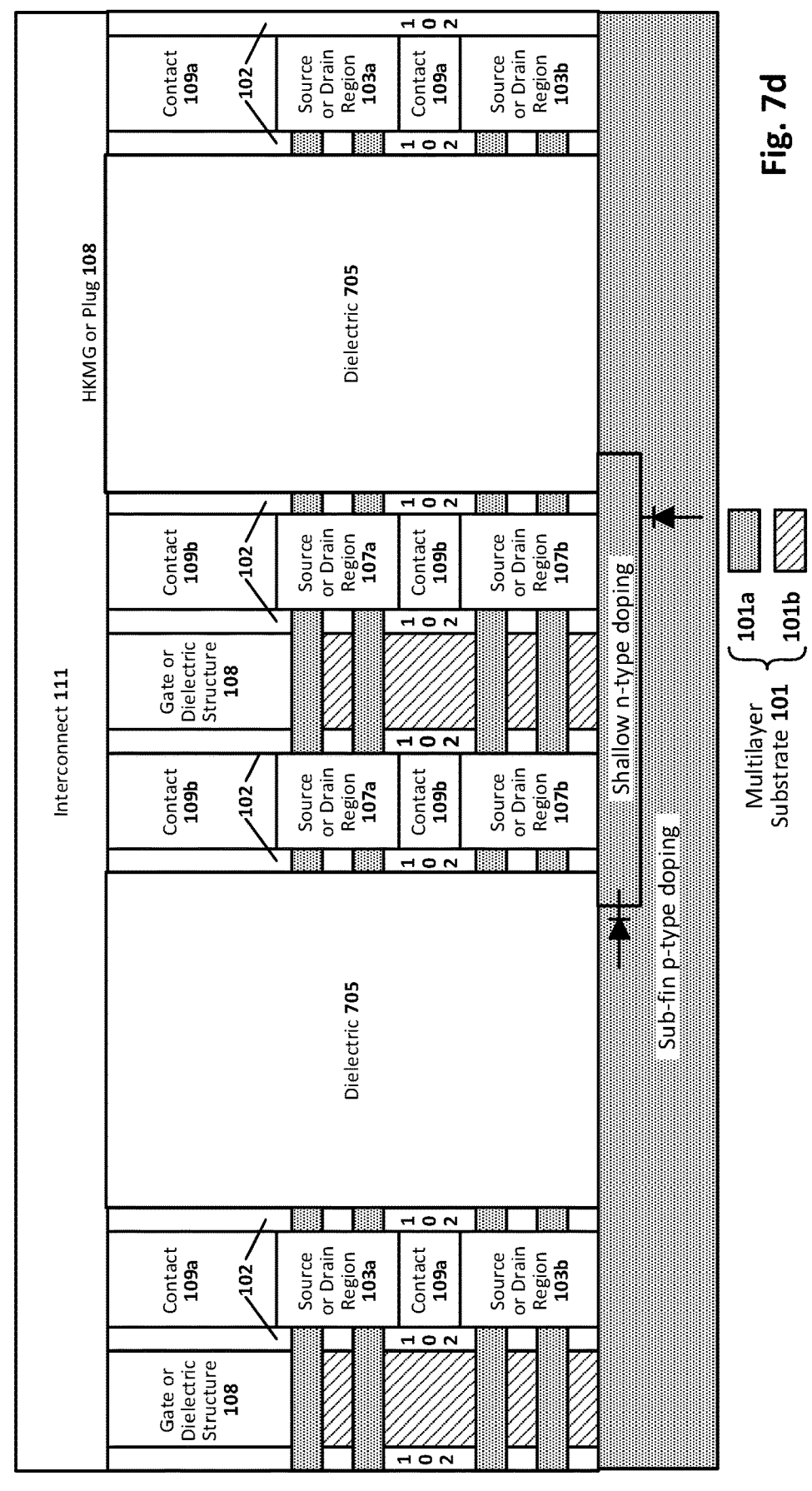
Figure 7E:
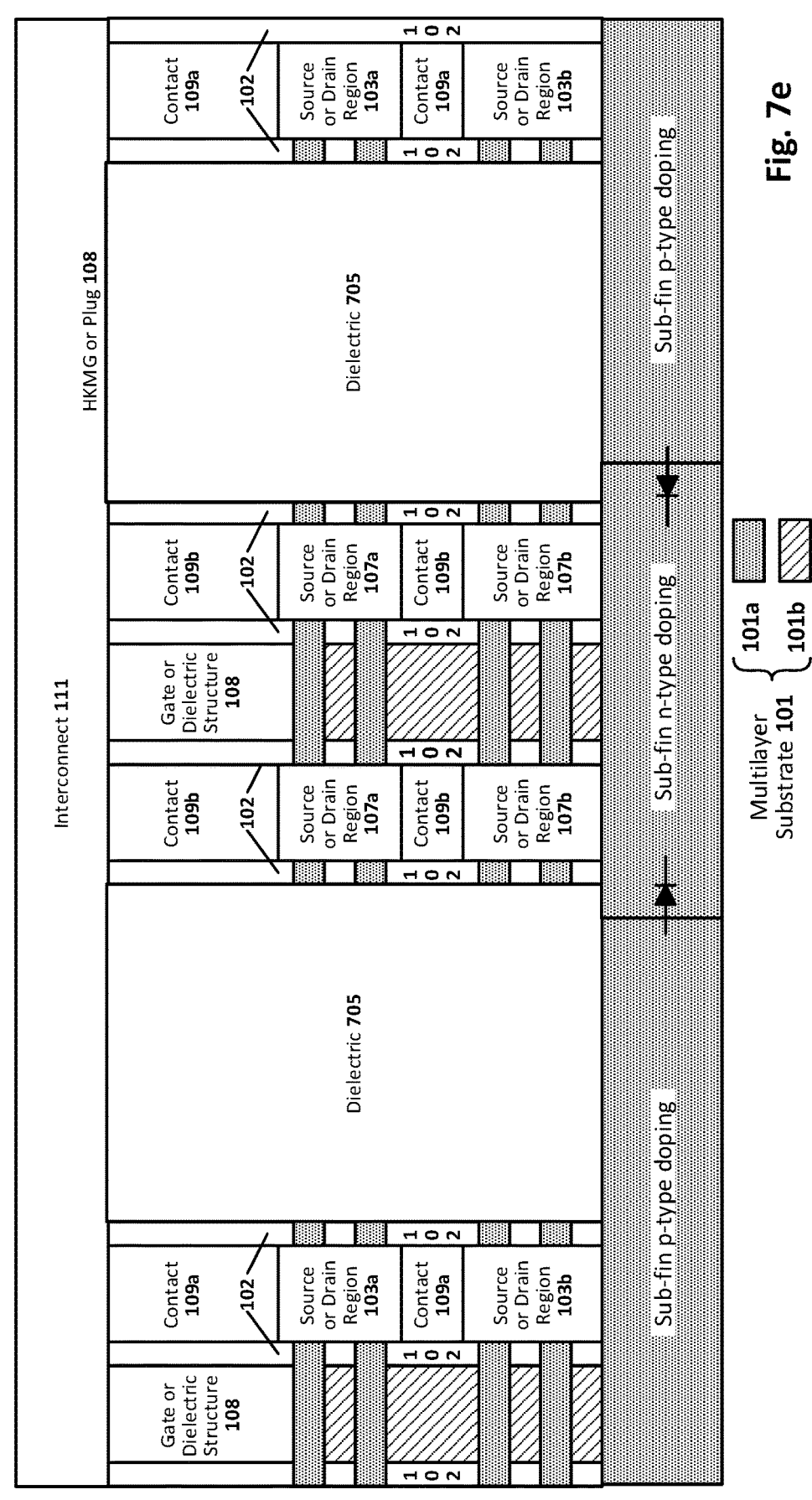
Figure 7F:
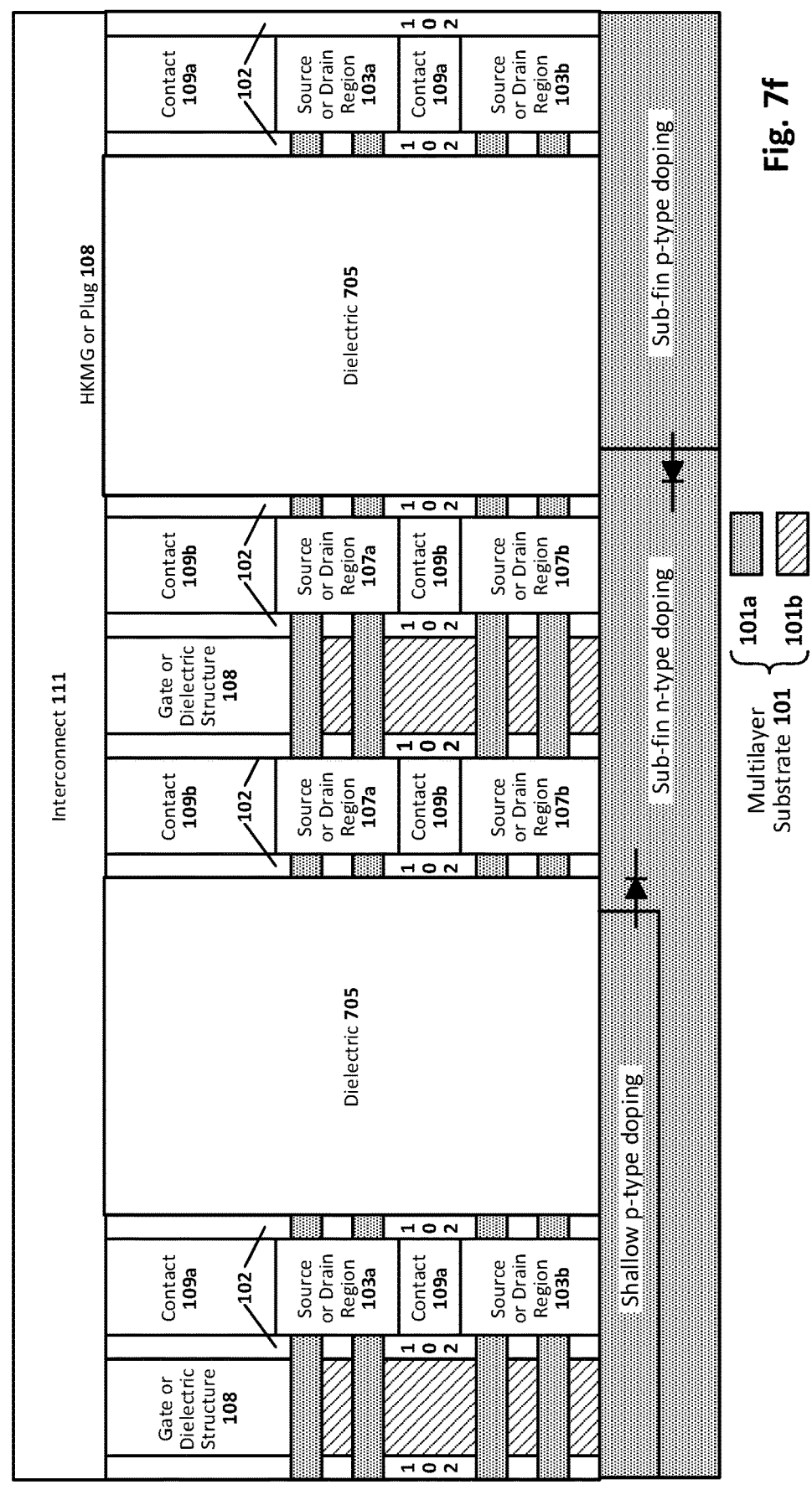

As previously explained above, well-doping can be used to create a junction in the well, rather than inside the channel region, according to some embodiments. Although both types of junctions can be used. A number of well grading schemes that can be used to improve the epitaxy/well PN junction interface, which may be particularly useful for PN junction applications like thermal sensing and calibration. FIG. 7d uses a shallow n-doping for forming a cathode in an anode p-well, according to an embodiment. FIG. 7e uses a deeper well doping for both the anode and the cathode. FIG. 7f shows an example doping scheme that can be used to create 3-terminal structures, and includes a shallow p-doping for forming an emitter in a base n-well that is adjacent to a deeper p-well for the emitter. Variation of these schemes and implant doping can modulate diode performance like ideality, capacitance, leakage, and on-resistance. Note the sub-fin can be doped with the desired doping scheme during formation of multilayer substrate 101, or after substrate 101 is formed into a plurality of fins. Any number of doping processes and schemes can be used.

Figure 8A:
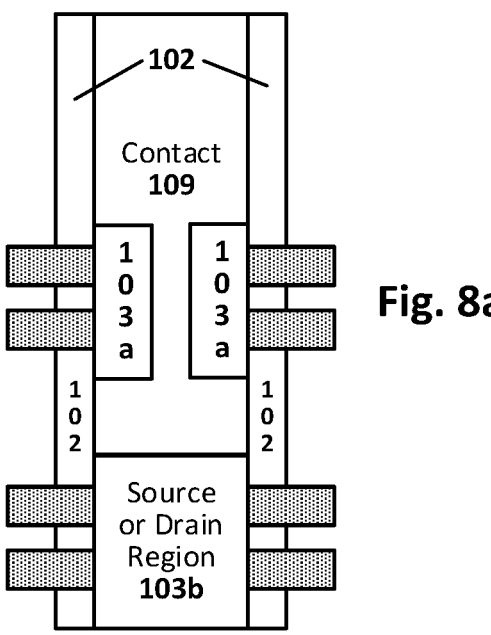
FIGS. 8a-c are cross-sectional views that illustrate further details with respect to example contacts for a lateral diode, in accordance with some embodiments of the present disclosure.
Figure 8B:
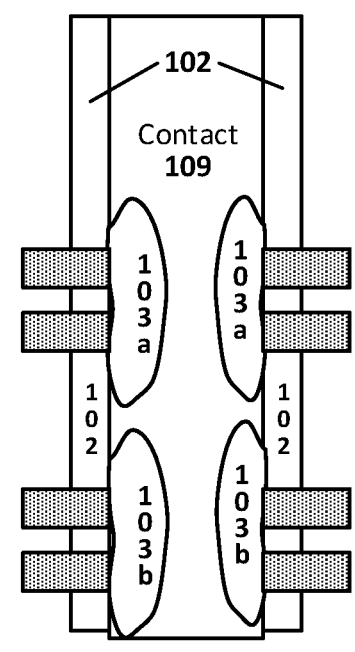
Figure 8C:
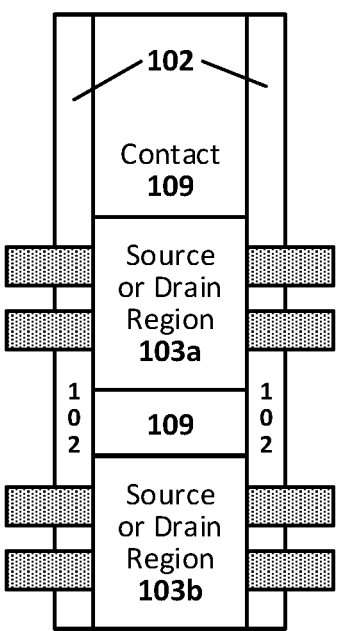

FIGS. 8a-c are cross-sectional views that illustrate further details with respect to example contacts for a lateral diode, in accordance with some embodiments of the present disclosure. The examples are demonstrated with reference to diffusion regions 103a-b and contacts 109, but the techniques can be applied to any stacked diffusion regions, as will be appreciated.

In the example case shown in FIG. 8a, the contact 109 passes through the upper diffusion region 103a and continues to land on a surface of the lower diffusion region 103b. In such cases, a punch-thru etch can be performed after the diffusion regions are formed, to provide a path through the upper diffusion region 103a down to top surface of the lower diffusion region 103b. A lithography mask and/or etch selective spacers can be used to protect the side portions of the diffusion regions being punched-thru. In another example embodiment, the epitaxial growth process of diffusion regions 103a-b is timed, such that the epitaxial growth from the left-side nanoribbon surfaces exposed in the contact trench does not merge with the epitaxial growth from the right-side nanoribbon surfaces exposed in the contact trench, thus leaving a space between those two opposing epitaxial growths, as shown in FIG. 8b. In another example, the contact 109 wraps around the diffusion regions 103a-b exposed in the contact trench, as shown in FIG. 1c. In any such example cases, note that a given contact 109 is at least partially on a surface of the upper diffusion region 103a and at least partially on a surface of the lower diffusion region 103b.

Methodology

FIGS. 9a-9e are cross-sectional views that collectively illustrate an example process for forming an integrated circuit configured with lateral diodes, in accordance with an embodiment of the present disclosure. Note that p-type diffusion regions can be processed separately from n-type diffusion regions (one type of diffusion region is blocked off while the other type is being formed). For purposes of brevity, both types are shown as being formed at the same time.

Figure 9A:
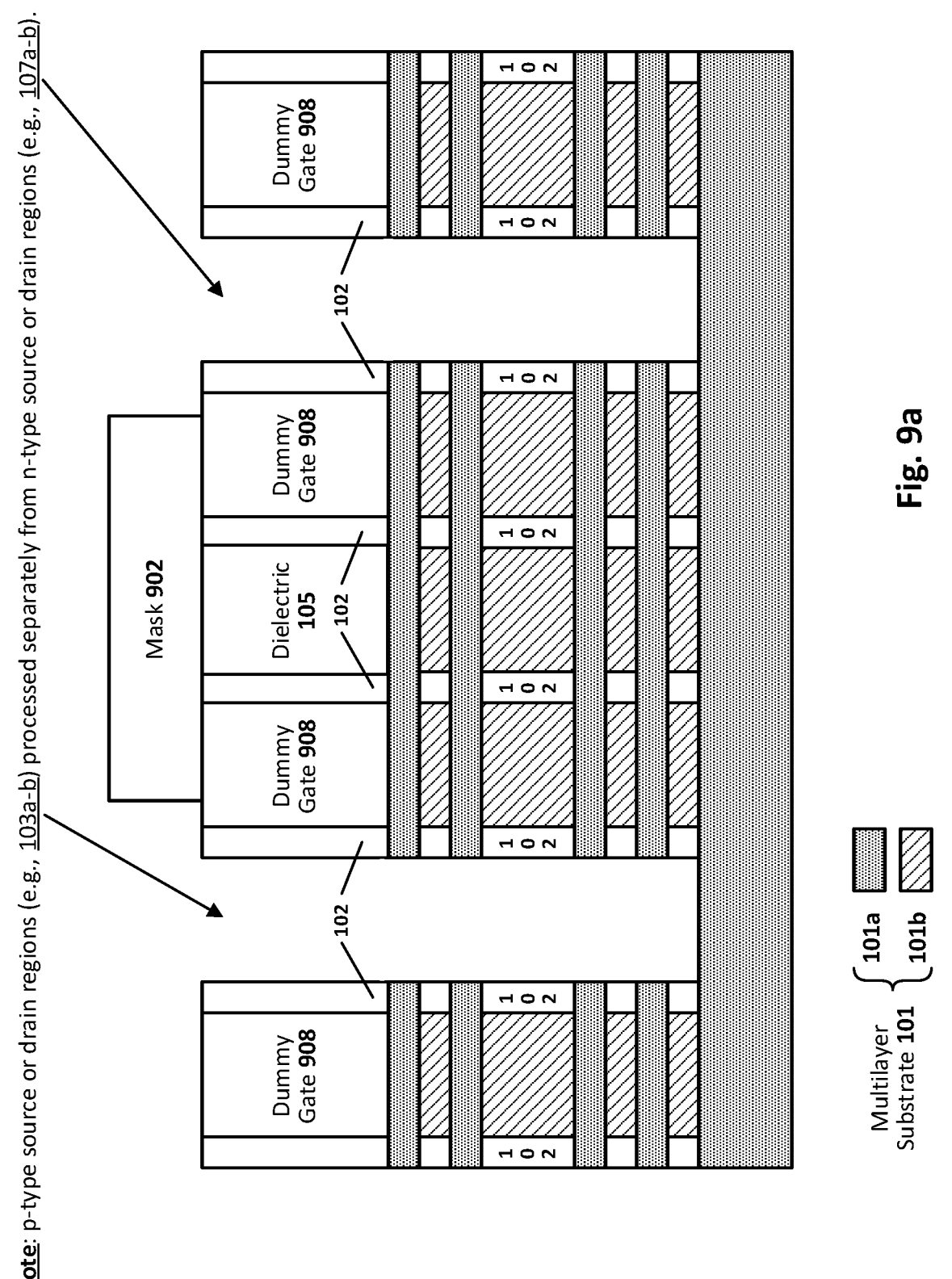

As can be seen in FIG. 9a, the integrated circuit includes a multilayer fin structure formed from a multilayer substrate 101. The cross-section is taken parallel to, and through, the fin structure. The multilayer substrate generally includes alternating layers of semiconductor materials 101a and 101b. In an embodiment, layers 101a are silicon layers, and layers 101b are SiGe layers. Such a configuration is particularly useful in forming nanoribbons or nanowires or nanosheets, given the etch selectivity between silicon and SiGe. The fins can be formed using any number of fin forming processes. In addition, dummy gate structures 908 have been formed over the fin structure (the gate structures are orthogonal to the fin structures). In this example case, four gate structures 908 are shown, but any number of gate structures can be used. The dummy gate structures 908 may include, for instance, a dummy gate dielectric (e.g., oxide native to the fin structure) and polysilicon. Spacer 102 is provided on the sides of the gate structures and laterally adjacent layers 101b. In one example case, the upper most portion of spacer 102 (adjacent the dummy gate 508) is provided directly on the side of the gate structures, via a conformal deposition process. Note that process will also provide a similar conformal spacer on sidewalls of the fin structure, and that spacer can be used as a guide when forming epitaxial diffusion regions. The lower portion of spacer 102 can be provided during the source and drain processing.

In more detail, and as can be further seen in FIG. 9a, the portions of the fin structure where the source and drain regions (or diffusion regions) will be provided have been etched away or otherwise removed. At this point, layers 101b can be selectively recessed in the lateral direction (e.g., by an isotropic etch within the source and drain recesses, the etch being selective to layers 101a), and then the lower portion of spacer 102 is conformally deposited (e.g., atomic layer deposition, ALD) within the recesses, so as to provide spacer material 102 between layers 101a. Any excess spacer material deposited within the recesses can be removed, for instance, via a directional etch (e.g., anisotropic dry etch), so as to provide the example structure shown in FIG. 9a. In some embodiments, after layers 101b are recessed and before spacer 102 is deposited into the recesses, a dopant can be applied to the exposed ends of layers 101a. Such doping can be used to partially dope layers 101a to decrease the thickness of the intrinsic region provided by the central portion of 101a between the oppositely-doped diffusion regions to be subsequently formed. The doping process can be timed to control the depth of the doping along the layer 101a, so as to partially dope that layer (shorter duration) or completely dope that layer (longer duration). The dopant can be, for instance, the same dopant (whether p-type or n-type) as will be provided in the diffusion region to be subsequently formed in that recess as shown in FIG. 9b.

Further note in FIG. 9a that mask 902 is patterned to block off a diffusion region from processing. This diffusion region will be a skipped epitaxial region, as discussed with reference to FIG. 2, to provide a wider distance between the anode and cathode of the diode. In other embodiments, an elongated gate or isolation structure can be used, as discussed with reference to FIGS. 3a-b. Mask 902 can be any suitable lithography mask (e.g., carbon hardmask, or photoresist).

Figure 9B:
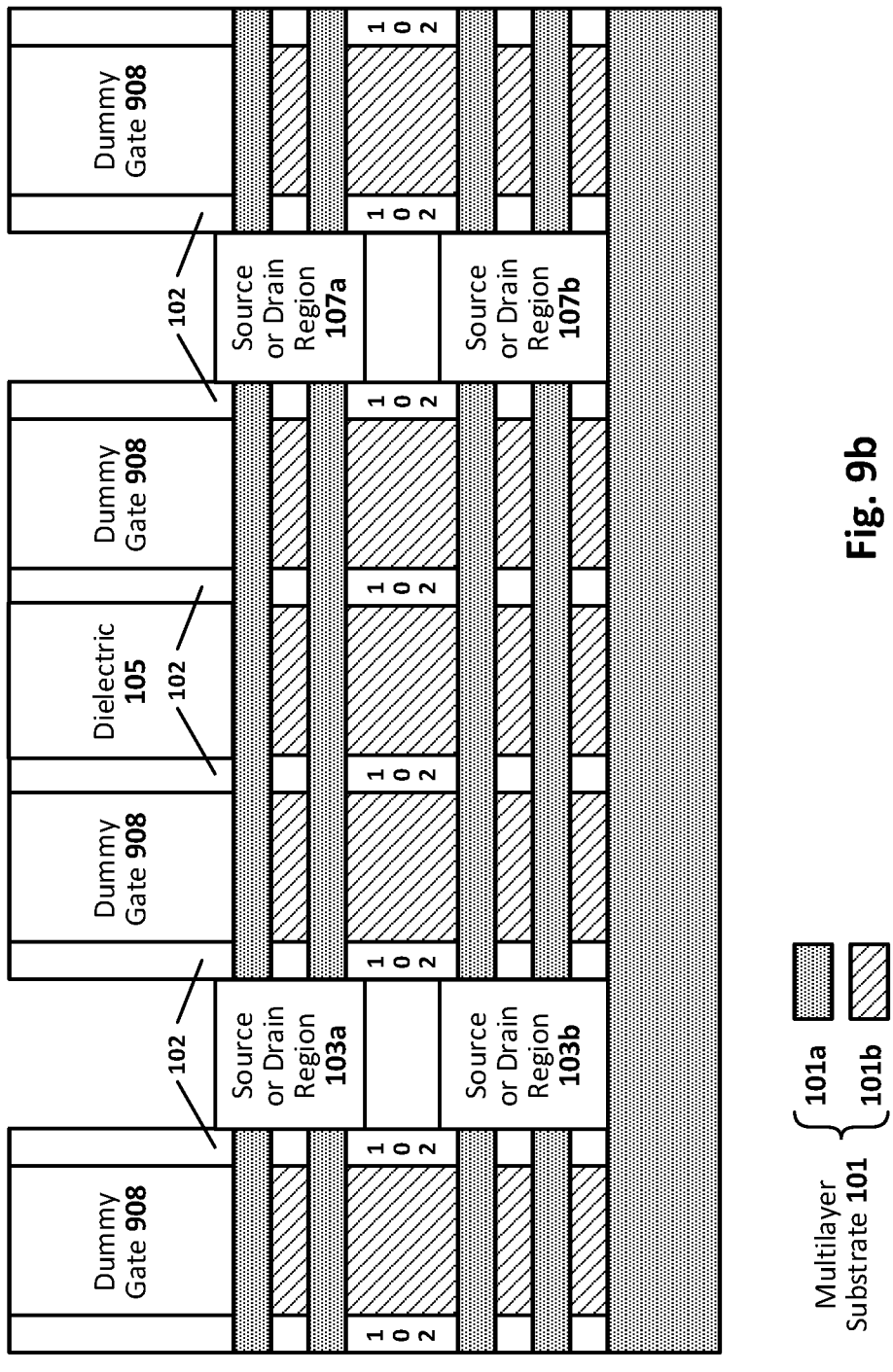

FIG. 9b shows the structure of FIG. 9a, after the lower (103b or 107b) and upper (103a or 107a) source and drain regions (diffusion regions) have been formed, according to an embodiment. Recall that the p-type diffusion regions (e.g., 103a-b) can be formed separately from the n-type diffusion regions (e.g., 107a-b). The diffusion region deposition process can be carried out in a number of ways. In the example shown, no blocking masks are used within the recess, because both the upper and lower diffusion regions are the same and they will selectively deposit on the exposed semiconductor materials 101a and 101b (if present). In other embodiments, where the upper and lower diffusion regions are different polarity (such as shown in FIGS. 4a-b), blocking masks can be used so that the diffusion materials can be selectively deposited, according to some embodiments, and as will be explained in turn with reference to FIGS. 11b through 12j. Other embodiments may use a sequential bottom-up deposition and etch-back process, where lower source or drain materials are first deposited in the recesses, followed by a recess etch to remove any such materials from the upper portion of the recesses, followed by deposition and etch-back of any intervening layer (e.g., dielectric 105) if any, followed by deposition and etch-back of the upper source or drain materials. In a more general sense, any number of forming techniques can be used to provision the diffusion regions 103a-b and 107a-b.

In one example case, the lower and upper diffusion regions 103a-b are epitaxially grown from the respective layers 101a exposed within the recess. The diffusion regions 103a-b may be p-doped semiconductor material (to provide an anode region) or n-doped semiconductor (to provide a cathode region). In a similar fashion (but at a different time), the lower and upper diffusion regions 107a-b are epitaxially grown from the respective layers 101a exposed within the portion of the recess. The diffusion regions 107a-b are oppositely-doped with respect to the diffusion regions 103a-b so as to provide the other of the cathode region or the anode region of the diode.

Figure 9C:
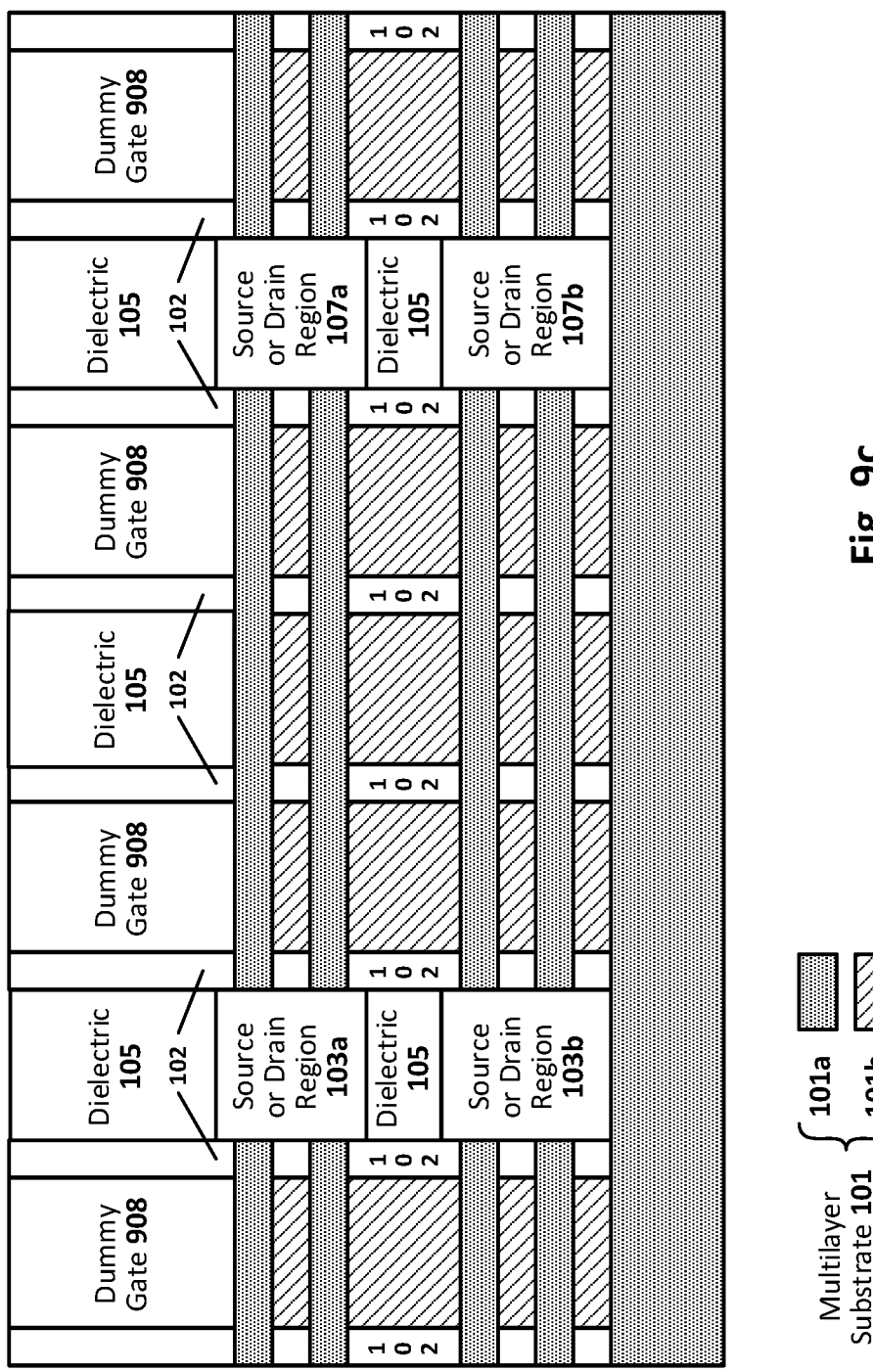

FIG. 9c shows the structure of FIG. 9b, after dielectric 105 has been deposited to fill the remaining portion of the source and drain recesses, according to an embodiment. Note how dielectric 105 also fills the gap between the lowers and upper diffusion regions, in this example case.

FIG. 9d shows the structure of FIG. 9c, after the dummy gates 908 have been removed and final gate structures or dielectric structures 108 are formed in their place, according to an embodiment. As previously explained, note that such gate processing can be part of a standard wafer-wide gate process, so as to not require additional processing. Further note that once the dummy gates 908 are removed, the exposed channel regions can be manipulated as desired (e.g., shaped, release of nanoribbons or wires, remove one or more nanoribbons or wires in a depopulation process, cladded, or some other channel processing). In some example embodiments, recall that layers 101b are not selectively removed so that they can assist in providing a diode junction that is not as size-constrained as a diode junction of just nanoribbons or wires (e.g., left-side of FIG. 1a; FIGS. 1c-7a). In other example embodiments, layers 101b are removed (e.g., right-side of FIG. 1a). In still other example embodiments, layers 101a and 101b are removed (e.g., FIGS. 7b-7f).

Figure 9E:
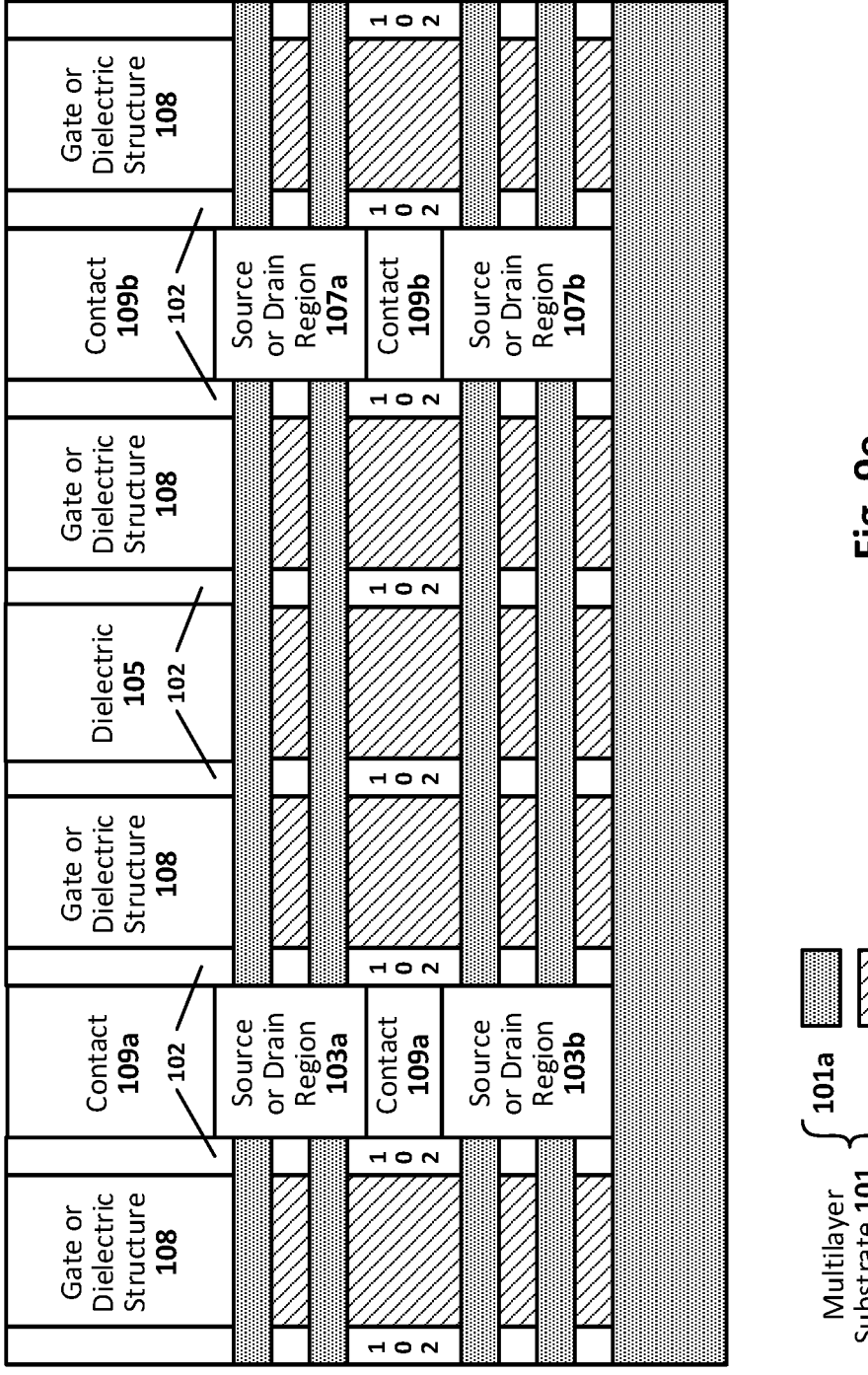

FIG. 9e shows the structure of FIG. 9d, after contacts 109a-b have been formed in frontside processing operations, according to an embodiment. Recall that a frontside interconnect (e.g., 111) may also be formed in frontside processing operations, and backside contacts and a backside interconnect can be formed in backside processing operations. Further recall that the lowermost layer 101a (sometimes call sub-fin herein) may be removed during backside processing and replaced with a dielectric layer, in which contacts 113 may be formed. This removal of lowermost layer 101a can also be done during backside processing operations. In still other embodiments, lowermost layer 101a is left intact, to provide an alternative conduction path for the diodes, as discussed with reference to FIGS. 7a-f. Any number of contact and interconnect processes can be used.

FIG. 10 illustrates an example method for forming an integrated circuit configured with lateral diodes, in accordance with an embodiment of the present disclosure. This method can be used, for instance, to form any of the example structures provided herein. The method includes forming 1002 a number of multilayer fins, which can be accomplished, for instance, by patterning a multilayer substrate and etching it to form multilayer fins. Multilayer fins are particularly useful when forming nanoribbon devices or other gate-all-around devices. Other embodiments may include single layer fins to provide devices having tri-gate or other fin-based channel regions. The method continues with forming 1004 a number of dummy gate structures over the fins. Standard dummy gate processing can be used, in some cases. In other example cases, the dummy gates are elongated (e.g., where the dummy gate structures are 1.5 to 2.5 longer than non-elongated dummy gate) to increase distance between the anode and cathode of a diode structure, as previously explained. As previously explained, the dummy gate structure(s) may include a gate spacer that also deposits on sidewalls of the multilayer fin(s), and that gate spacer can be used to constrain epitaxial growth of diffusion regions. The method continues with recessing 1006 the source and drain regions (also referred to herein as diffusion regions), to each side of a given gate structure. Standard lithography masking and etching can be used to form the source/drain recesses.

The method continues with laterally recessing 1008 sacrificial layers (e.g., 101*b*) of the multilayer fin with etch that is selective to channel layers (e.g., 101*a*) of the multilayer fin. In one example case where the multilayer fin includes alternating layers of silicon and SiGe, an etch that is selective to the silicon layer is used to recess the SiGe layers. The depth of the recess can vary from one embodiment to the next, but in some cases is in the range of 2 to 10 nanometers (nm). In an embodiment, the recess is carried out via a isotropic wet etch. The method continues with forming 1010 spacer material into the recesses, so as to provide spacer material between channel layers of the multilayer fin. Note this spacer material can be, for example, the same spacer material (e.g., a nitride, such as silicon nitride, silicon oxy nitride, or silicon oxycarbonitride) as the gate spacer used when forming the dummy gate structure at 1004. A conformal deposition process can be used to deposit the spacer, such as chemical vapor deposition (CVD) or ALD.

The method continues with forming 1012 the lower and upper source and drain regions. As previously explained, such forming can be accomplished, for instance, by way of selective epitaxial deposition and etch-back processes where needed. Recall that p-type and n-type diffusion region depositions can be done separately from one another, as will be further discussed with reference to FIG. 11*a*. Further recall that blocking masks may also be used to increase selectivity of deposition, as will be further discussed with reference to FIG. 11*b*. The method continues depositing 1014 dielectric (e.g., oxide, such as silicon dioxide) to fill any remaining portion of the source and drain recesses. Chemical mechanical polish (CMP) processing can be used to planarize the resulting structure and remove extraneous materials from the top of the structure.

The method continues with removing 1016 the dummy gate structure(s) and forming the final gate structures. So, for instance, polysilicon dummy gate material can be removed from between silicon nitride gate spacers to expose the underlying channel region. At this point, some embodiments may include releasing a number of nanoribbons or other semiconductor bodies within the exposed channel region, by way of a selective etch. Channel shaping and depopulation (e.g., removal of one or more nanowires or ribbons) may also be carried out. In other embodiments, no release processing is performed, so as to maintain a bulky channel region that can provide a relatively thick intrinsic region of the lateral diode being formed (e.g., FIG. 1*a*). Thus, the final gate structure will vary depending on the embodiment being formed. In any case, if present, the final gate structure may include standard features of a gate structure (e.g., high-k gate dielectric such a hafnium oxide, workfunction layer such as titanium nitride for p-type gates or titanium aluminum carbide for n-type gates, and fill metal such as tungsten). In other embodiments, a dielectric structure (e.g., any oxide, nitride, carbide, or combination thereof) is formed, instead of a final gate structure. In still other embodiments, all of the channel materials are removed and a dielectric structure (e.g., any oxide, nitride, carbide, or combination thereof) is formed in the resulting empty gate trench.

The method continues with forming 1018 frontside contacts and interconnect, and forming 1020 backside contacts and interconnect, such as discussed with reference to the example embodiments of FIGS. 5*a*-6*c*. Any number of frontside and/or backside contacting and interconnect schemes can be used.

Figures 11A, 11B:
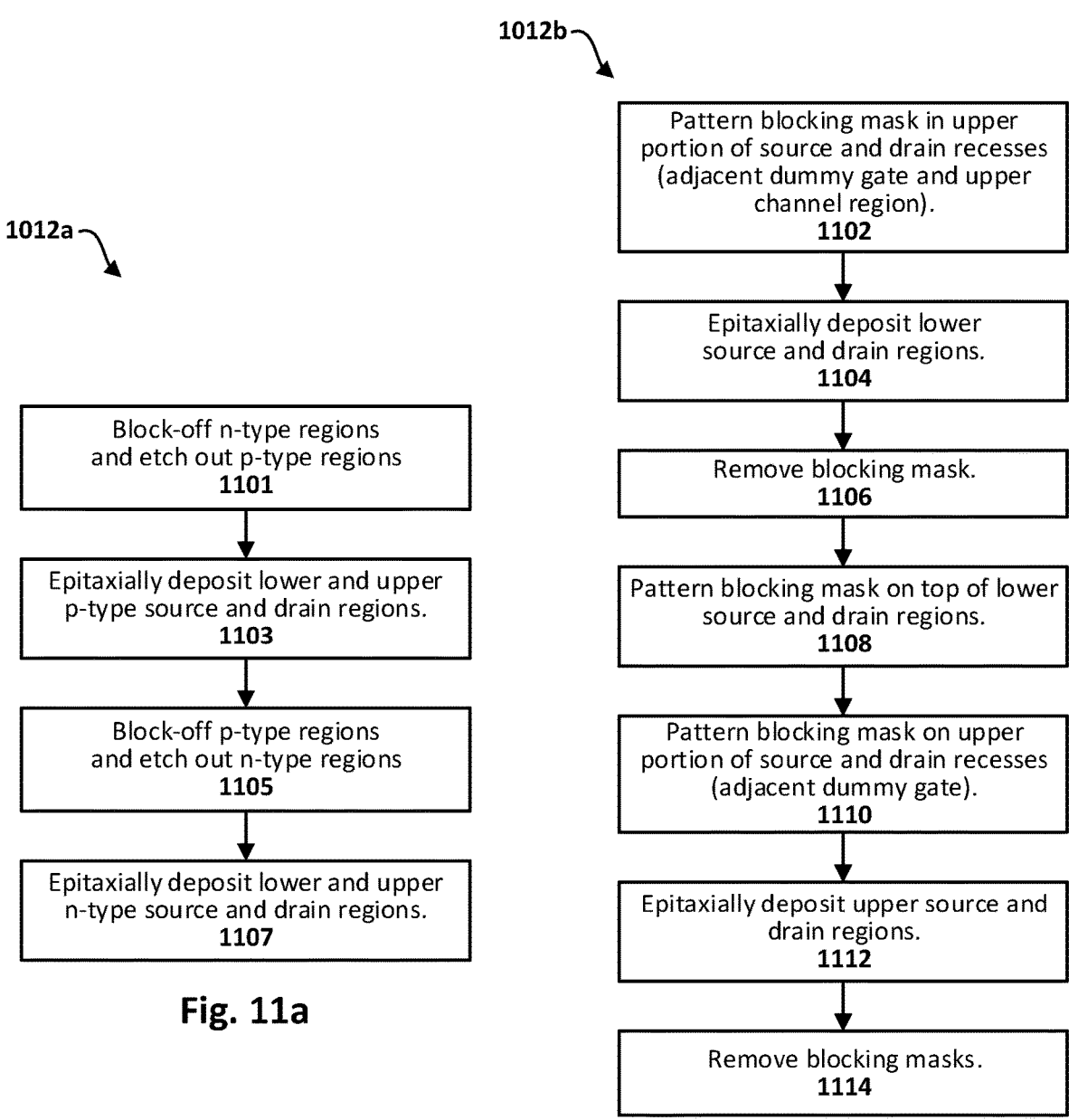
FIGS. 11a-b each illustrates an example method for forming lower and upper source and drain regions for integrated circuits including lateral diodes, in accordance with an embodiment of the present disclosure.

FIGS. 11 *a*-*b* each illustrates an example method for forming lower and upper source and drain regions for integrated circuits including lateral diodes, in accordance with an embodiment of the present disclosure. This methodologies can be used, for instance, at 1012 of the method shown in FIG. 10. FIG. 11*a* is a process for forming the same type diffusion regions within lower and upper regions of a stacked diffusion recess, and FIG. 11*b* is a process for forming a first type diffusion region (e.g., p-type) within the lower portion of the recess and forming a second type diffusion region (e.g., n-type) within the upper portion of the recess, according to some examples.

With reference to FIG. 11*a*, methodology 1012*a* includes blocking-off 1101 n-type diffusion regions (or the location where those regions will be subsequently formed) and etching out the p-type diffusion regions to provide recesses. Recall that one or more p-type diffusions may be masked-off as well, so as to provide one or more skipped diffusion regions according to some embodiments, as previously explained above. The method 1012*a* continues with epitaxially depositing 1103 lower and upper p-type source and drain regions. Recall that the epitaxial growth selectively deposits on the exposed lower and upper semiconductor channel materials within the recess. In some examples, the exposed semiconductor channel materials are the ends or nubs of nanoribbons or other semiconductor bodies exposed along the sidewalls of the recess. To this end, the epitaxial growth grows predominantly from exposed crystalline channel material, rather than any exposed amorphous materials (e.g., oxides or nitrides) within the recess. The method 1012*a* continues with blocking-off 1105 the newly formed p-type diffusion regions and etching out the n-type diffusion regions to provide recesses. Again, recall that one or more n-type diffusions may be masked-off as well, so as to provide one or more skipped diffusion region, according to some embodiments, as previously explained above. The method 1012*a* continues with epitaxially depositing 1107 lower and upper n-type source and drain regions. The previous relevant discussion with respect to p-type epitaxial growth is equally applicable here.

Figures 12A, 12B, 12C:
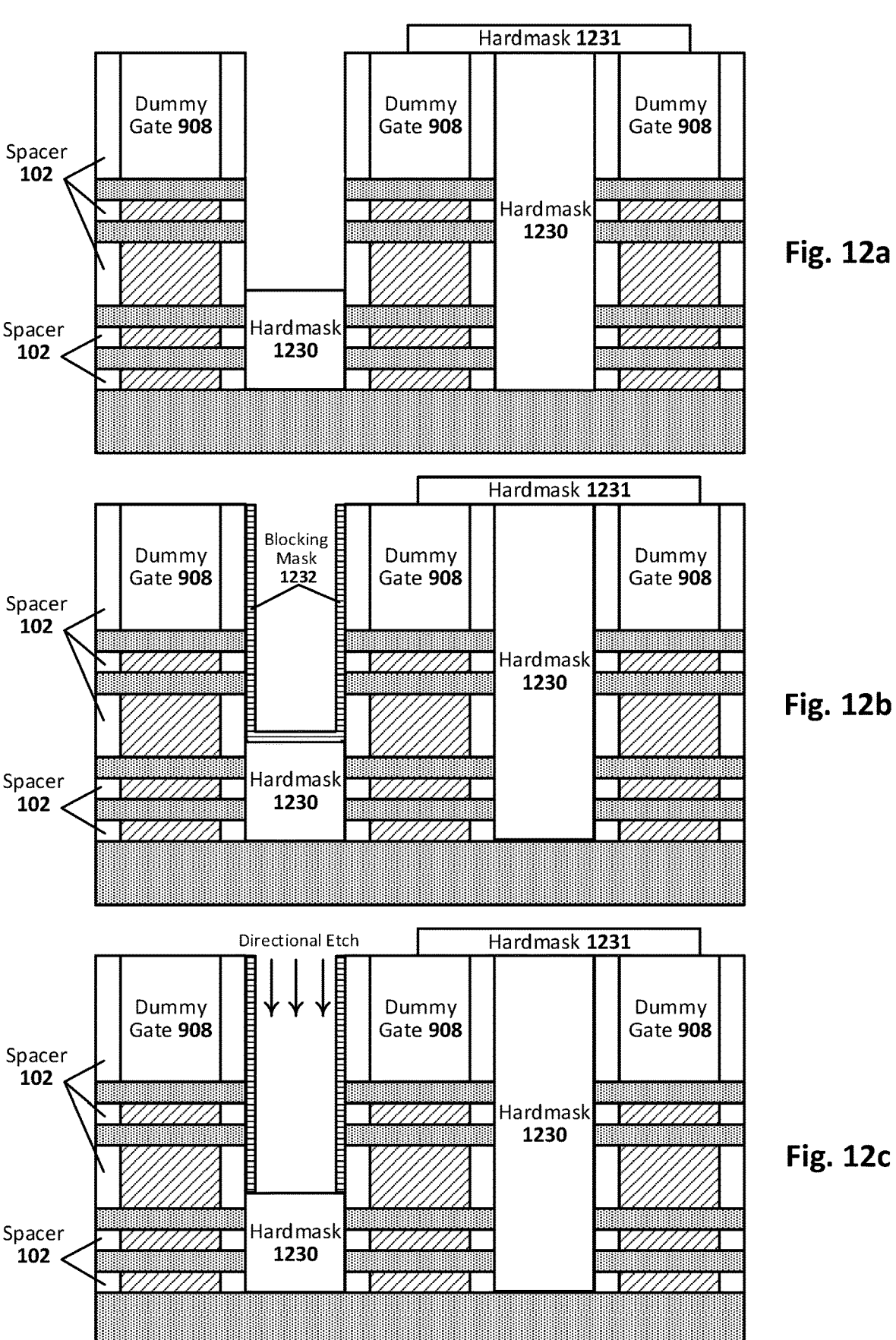
FIGS. 12a-12j are cross-sectional views that further illustrate the method of FIG. 11b, in accordance with an embodiment of the present disclosure.
Figure 12D:
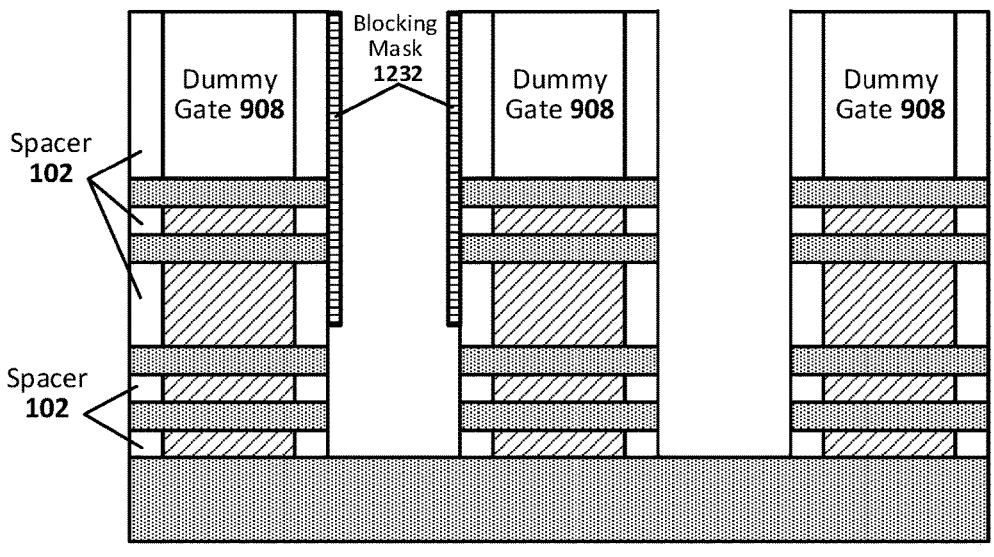

The methodology 1012*b* of FIG. 11*b* is described with further reference to FIGS. 12*a*-*j*, which show a number of cross-section views of structures that are used to help describe the methodology. The cross-sections are taking parallel to, and through, the fin structure. As will be seen, the example shown includes the same type diffusion regions in the upper and lower channel regions of the right-side recess, and oppositely-doped diffusion regions in the upper and lower channel regions of the left-side recess. The method 1012*b* includes patterning 1102 a blocking mask in upper portion of source and drain recesses (adjacent dummy gate and upper channel region). This can be accomplished, for example, as shown in the example embodiment of FIGS. 12*a-d*. In particular, FIG. 12*a* shows the structure after the source and drain recesses have been formed, and after a hardmask 1230 has been formed in the recesses. In addition, the right-side recess is further blocked with hardmask 1231 to protect the underlying hardmask 1230 when recessing the hardmask 1230 in the left-side recess (this is because a blocking mask is not needed in the right-side recess in this example case). The hardmask 1230 can be, for instance, a carbon hardmask that is deposited into the trench and then etched back to a desired height in the left-side recess. Further note that hardmask 1230 can be selectively etched with respect to hardmask 1231. Then, as shown in FIG. 12*b*, a blocking mask 1232 is conformally deposited (e.g., via CVD or ALD) into the recess. The blocking mask 1232 can be, for instance, an oxide or other material upon which epitaxial source/drain material will not grow. The thickness of mask 1232 can vary from one embodiment to the next, but in some example is in the range of 0.5 nm to 5 nm. A directional etch (e.g., anisotropic dry etch) is used to remove mask 1232 from horizontal surfaces on which it has deposited, including the top surface of the hardmask 1230, as shown in FIG. 12*c*. Then, as shown in FIG. 12*d*, the hardmasks 1231 and 1230 are removed. Any suitable mask removal processes can be used (e.g., CMP to remove 1231 and ash-based etch to remove 1230).

Figure 12E:
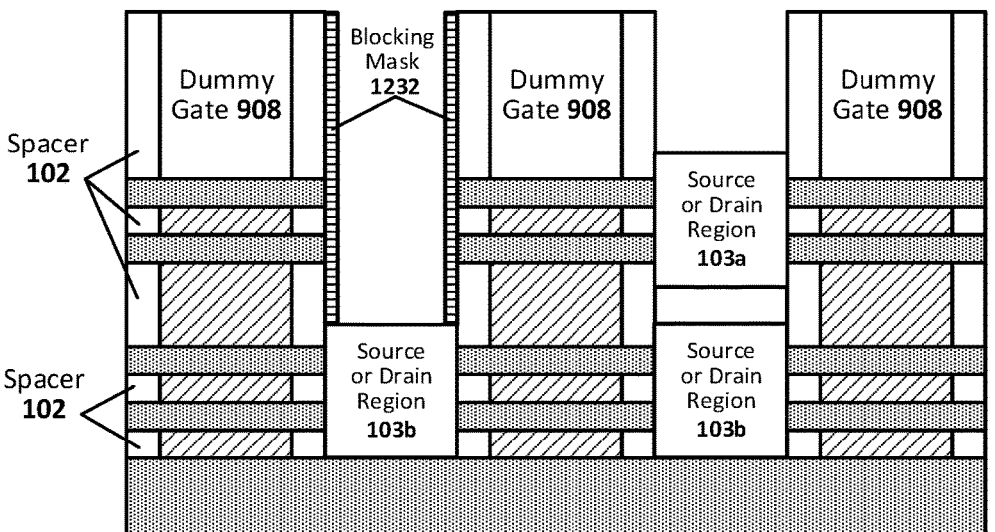

So, with the blocking mask 1232 formed in upper portion of the left-side recess, the methodology 1012*b* continues with epitaxially depositing 1104 the lower diffusion region 103*b* in the left-side recess, and the upper and lower diffusion regions 103*a-b* in the right-side recess. Note that the epitaxial deposition will not deposit on the blocking mask 1232, and only grows on the exposed semiconductor layers 101*a* in the exposed channel regions. The resulting structure is shown in FIG. 12*e*. The method 1012*b* continues with removing 1106 the blocking mask (e.g., wet or dry etch).

Figure 12F:
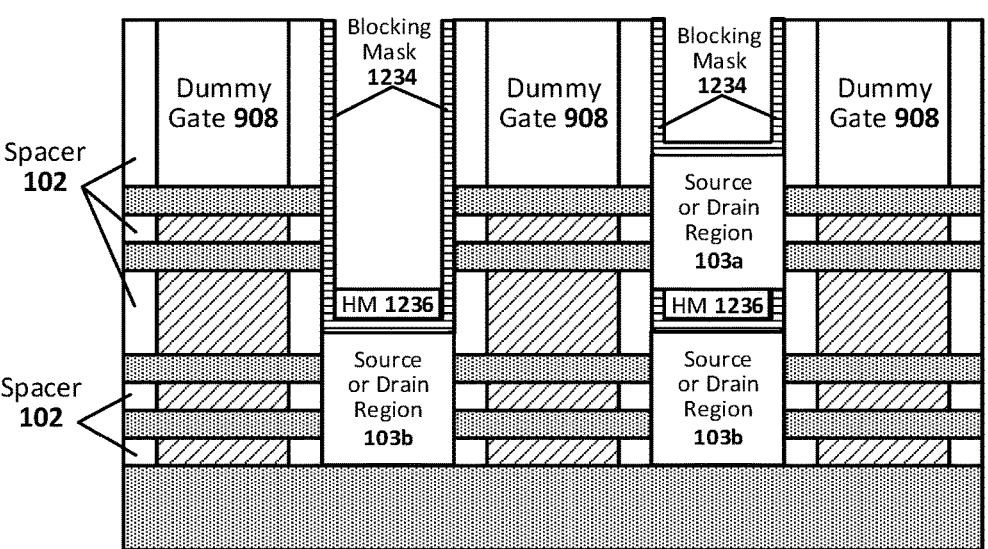
Figure 12G:
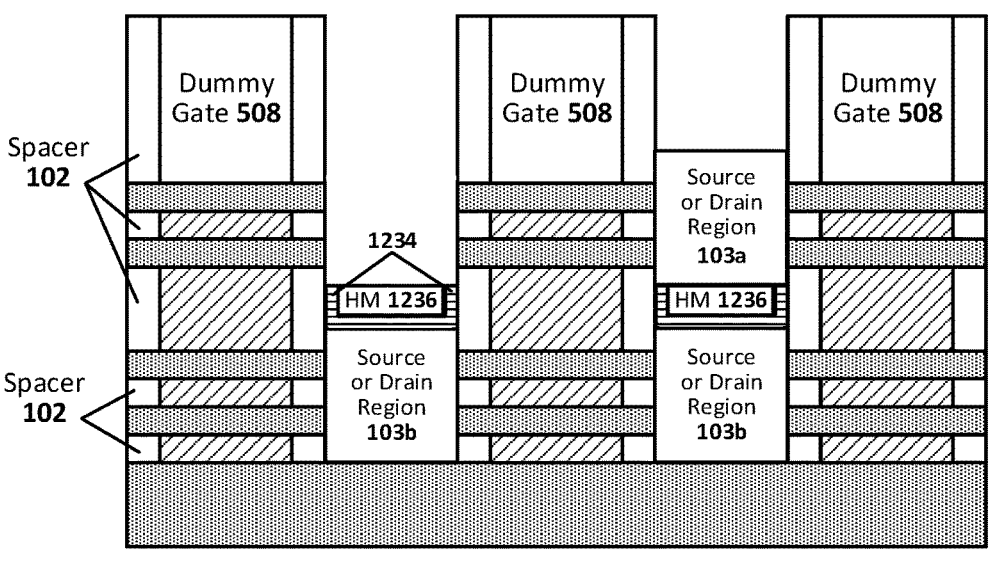

The method 1012*b* continues with patterning 1108 a blocking mask on top of the lower diffusion region in the left-side recess. An example such process is shown in FIGS. 12*f-g*. As can be seen in FIG. 12*f*, a blocking mask 1234 is conformally deposited into the recess. Then, a hardmask 1236 is deposited onto mask 1234 and recessed to a desired height, as further shown in FIG. 12*f*. Note that this height corresponds to the height of dielectric layer 105 to be formed between the oppositely-doped upper and lower diffusion regions and can also be adjusted to provide a desired degree of asymmetry between the lower and upper diffusion areas in some examples. The excess (unmasked) portion of blocking mask 1234 is then removed, as shown in FIG. 12*g*. Note that blocking mask 1234 can be similar to blocking mask 1232, and hardmask 1236 can be similar to hardmask 1230, and the previous relevant discussion with respect to those masks is equally applicable here.

Figure 12H:
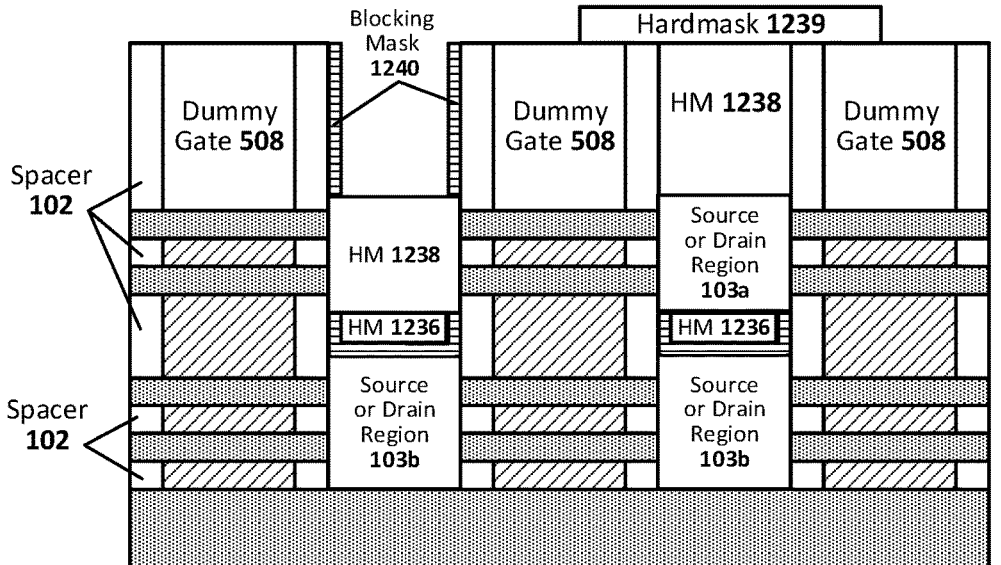

The method 1012*b* continues with patterning 1110 another blocking mask on upper portion of source and drain recesses (adjacent dummy gate), as shown in FIG. 12*h*. As can be seen, a hardmask 1238 is formed on the earlier formed masking structure (which corresponds to the dielectric layer 105), and recessed. Hardmask 1238 also deposits into the right-side recess and is protected with hardmask 1231 when recessing the hardmask 1238 in the left-side recess. Then, blocking mask 1240 is conformally deposited into the recess, and directionally etched, to provide the resulting structure shown in FIG. 12*h*. The hardmask 1238 is then removed. Again, blocking mask 1240 can be similar to blocking mask 1232, and hardmask 1238 can be similar to hardmask 1230, and the previous relevant discussion with respect to those masks is equally applicable here. In other embodiments, blocking mask 1240 is not used (assuming the deposited diffusion material will not grow on the exposed spacer 102). Hardmask 1238 is still helpful, in that it blocks the diffusion material from depositing on top of the diffusion region 103*a*.

Figure 12I:
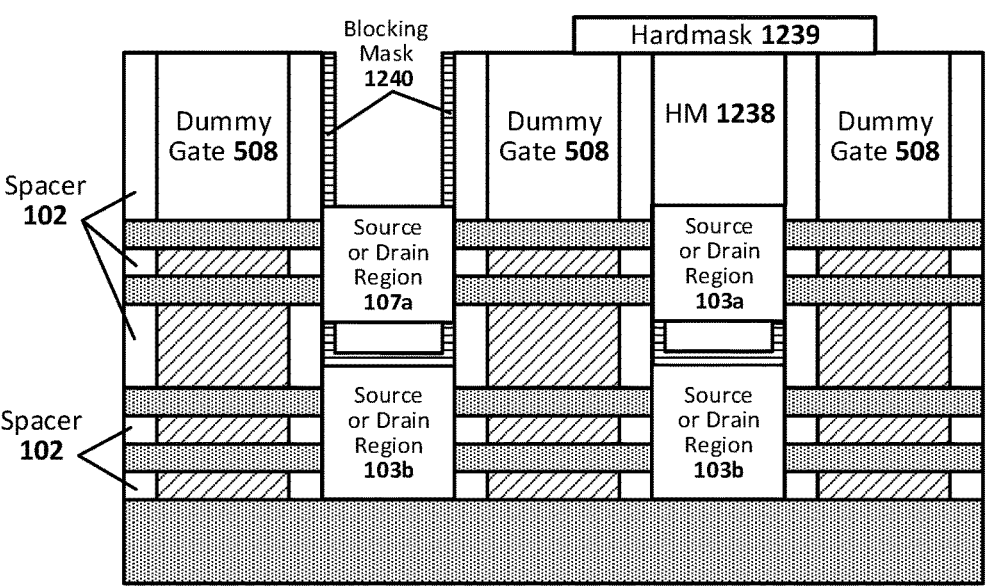
Figure 12J:
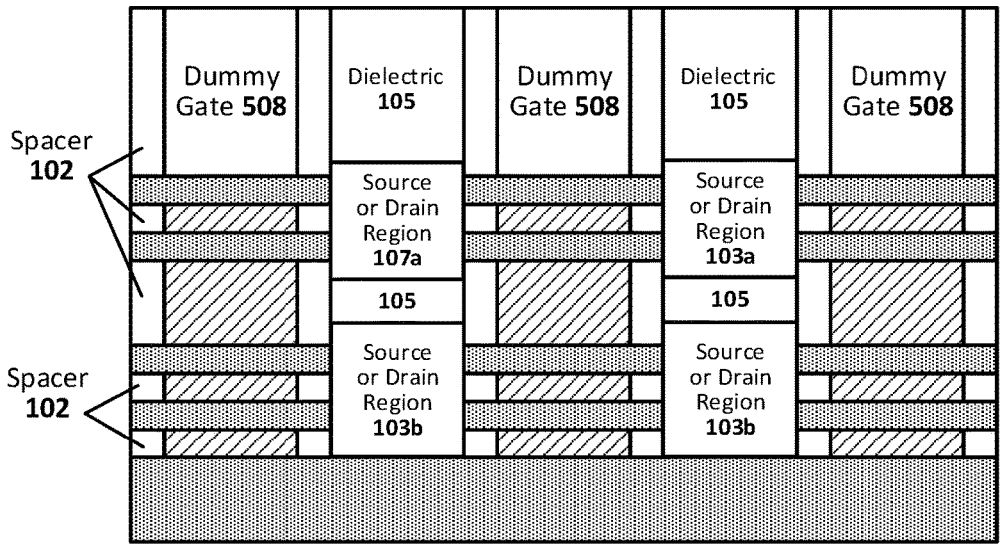

With the uppermost portion of the recess blocked, the method of 1012*b* continues with epitaxially depositing 1112 the upper diffusion region in the left-side recess, as shown in FIG. 12*i*. Recall that the epitaxial growth only occurs on the exposed semiconductor layers 101*a*. With the upper source and drain regions formed, the method 1012 continues with removing the blocking masks 1234 and 1240, as well as any remaining hardmask 1236. A dielectric can then be deposited as noted in FIG. 10 at 1014. CMP can be used to remove excess materials and planarize the resulting structure, thereby providing the structure in FIG. 12*j*. Then, final gate processing at 1016 can be carried out, along with any frontside and/or backside contact and interconnect processing at 1018-20.

Computing System

Figure 13:
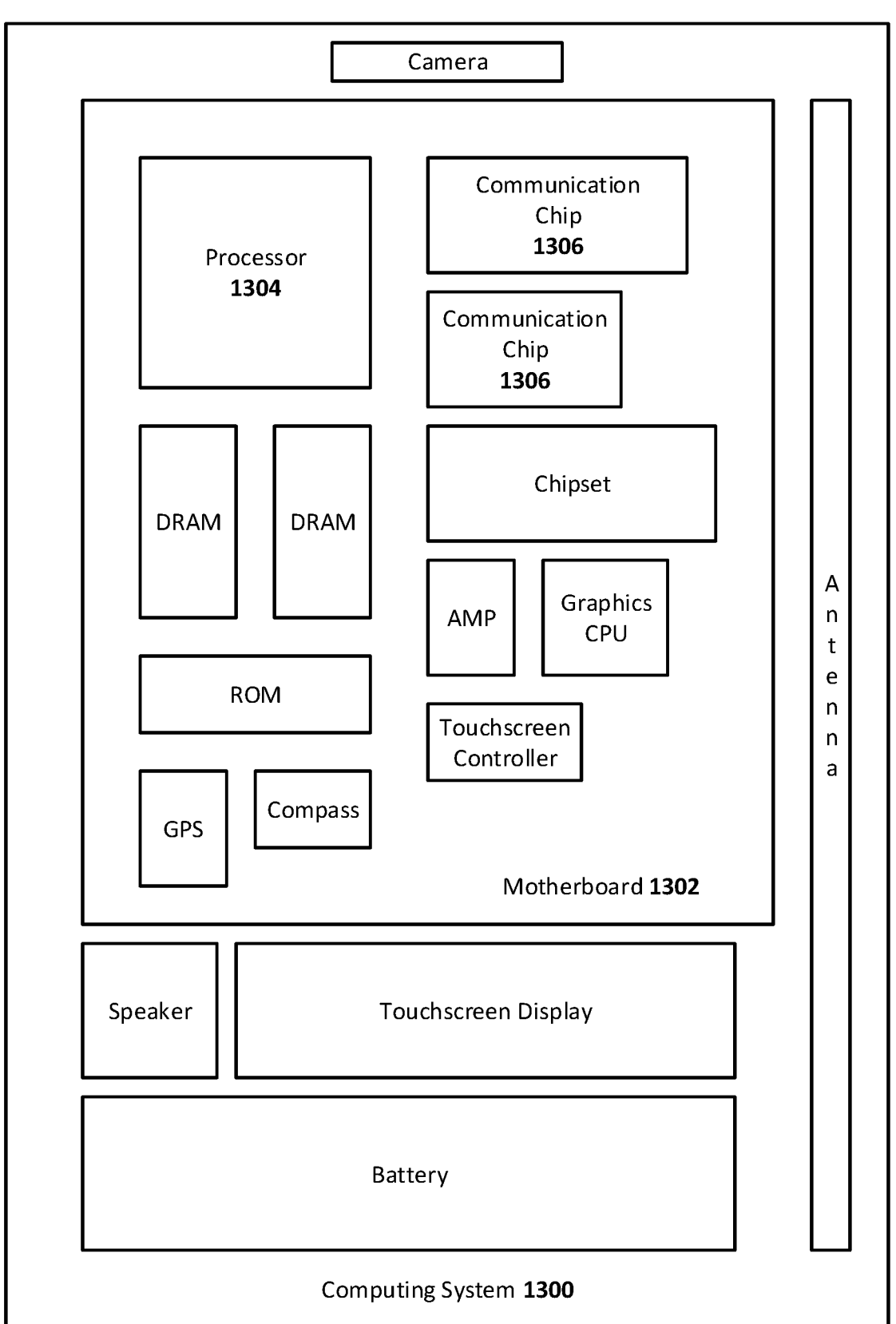
FIG. 13 illustrates a computing system implemented with one or more integrated circuit structures configured in accordance with an embodiment of the present disclosure.

FIG. 13 illustrates a computing system implemented with one or more integrated circuit structures configured in accordance with an embodiment of the present disclosure. As can be seen, the computing system 1300 houses a motherboard 1302. The motherboard 1302 may include a number of components, including but not limited to a processor 1304 and at least one communication chip 1306 (two are shown in this example), each of which can be physically and electrically coupled to the motherboard 1302, or otherwise integrated therein. As will be appreciated, the motherboard 1302 may be, for example, any printed circuit board, whether a main board or a daughterboard mounted on a main board or the only board of system 1300, etc. Depending on its applications, computing system 1300 may include one or more other components that may or may not be physically and electrically coupled to the motherboard 1302. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1300 may include one or more integrated circuits configured with a stacked device configuration having a lateral diode, as variously described herein. In some embodiments, multiple functions can be integrated into one or more chips (e.g., for instance, note that the communication chip 1306 can be part of or otherwise integrated into the processor 1304).

The communication chip 1306 enables wireless communications for the transfer of data to and from the computing system 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others. The processor 1304 of the computing system 1300 includes an integrated circuit die packaged within the processor 1304. In some example embodiments of the present disclosure, the integrated circuit die of the processor 1304 includes one or more occurrences of a lateral diode structure as variously provided herein. The term "processor" may refer to any device or portion of a device that processes, for instance, electronic data from registers and/or memory to transform that electronic data into other electronic data that may be stored in registers and/or memory.

The communication chip 1306 may also include an integrated circuit die packaged within the communication chip 1306. In accordance with some such example embodiments, the integrated circuit die of the communication chip 1306 includes one or more occurrences of a lateral diode structure as variously provided herein. As will be appreciated in light of this disclosure, note that multi-standard wireless capability may be integrated directly into the processor 1304 (e.g., where functionality of any chips 1306 is integrated into processor 1304, rather than having separate communication chips). Further note that processor 1304 may be a chip set having such wireless capability. In short, any number of processor 1304 and/or communication chips 1306 can be used. Likewise, any one chip or chip set can have multiple functions integrated therein.

In various implementations, the computing system 1300 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1300 may be any other electronic device that processes data or employs one or more lateral diode structures as variously provided herein. As will be appreciated in light of this disclosure, various embodiments of the present disclosure can be used to improve performance on products fabricated at any process node (e.g., in the micron range, or sub-micron and beyond) by allowing for the use of stacked transistors having any number of source/drain configurations and channel configurations, along with one or more lateral diode structures as variously provided herein.

Further Example Embodiments

The following examples pertain to further embodiments, from which numerous permutations and configurations will be apparent.

Example 1 is an integrated circuit, comprising: a first diffusion region comprising one of a p-type dopant or an n-type dopant; a second diffusion region comprising the other of the p-type dopant or the n-type dopant; a first semiconductor body extending laterally from the first diffusion region to the second diffusion region; a third diffusion region below or above the first diffusion region; a fourth diffusion region below or above the second diffusion region; and a second semiconductor body extending laterally from the third diffusion region to the fourth diffusion region.

Example 2 includes the integrated circuit of Example 1, wherein the third diffusion region includes the p-type dopant or the n-type dopant that is included in the first diffusion region.

Example 3 includes the integrated circuit of Example 1 or 2, and further includes a contact at least partially on a surface of the first diffusion region and at least partially on a surface of the third diffusion region.

Example 4 includes the integrated circuit of Example 3, wherein the contact passes through the first diffusion region and continues to a surface of the third diffusion region.

Example 5 includes the integrated circuit of Example 3, wherein the contact wraps around one or both of the first diffusion region and the third diffusion region.

Example 6 includes the integrated circuit of Example 3, and further includes: a fifth diffusion region laterally adjacent to the first diffusion region; and a third semiconductor body extending laterally from the fifth diffusion region; wherein the contact extends between opposing surfaces of the first and fifth diffusion regions and continues to a surface of the third diffusion region.

Example 7 includes the integrated circuit of Example 1, and further includes: a layer of dielectric material between the first and third diffusion regions, the third diffusion region being oppositely-doped from the first diffusion region.

Example 8 includes the integrated circuit of Example 1 or 7, wherein the third and fourth diffusion regions both include either a p-type dopant or an n-type dopant and are at least part of a transistor structure, and wherein the first diffusion region, the first semiconductor body, and the second diffusion region are at least part of a diode structure above or below the transistor structure.

Example 9 includes the integrated circuit of any one of Examples 1 through 6, wherein the first and second semiconductor bodies are connected to each other by a third semiconductor body.

Example 10 includes the integrated circuit of Example 9, wherein the first diffusion region, the first semiconductor body, the second diffusion region, the third diffusion region, the second semiconductor body, the fourth diffusion region, and the third semiconductor body are at least part of a diode structure.

Example 11 includes the integrated circuit of Example 9 or 10, wherein at least one of the first, second, and third semiconductor bodies is undoped. In other examples, at least one of the first, second, and third semiconductor bodies may be partially doped so there is an undoped portion and one or more doped portions of a given semiconductor body (e.g., such as a semiconductor body having doped end portions and an undoped middle portion between the doped end portions). In still other examples, at least one of the first, second, and third semiconductor bodies may be doped from one end to the other end.

Example 12 includes the integrated circuit of any one of Examples 9 through 11, wherein the first, second, and third semiconductor bodies are layers of a multilayer fin.

Example 13 includes the integrated circuit of any one of Examples 9 through 12, wherein the first and second semiconductor bodies are silicon, and the third semiconductor body includes silicon and germanium.

Example 14 includes the integrated circuit of any one of Examples 1 through 13, and further includes a spacer layer extending along a surface of the first diffusion region and a surface of the third diffusion region.

Example 15 includes the integrated circuit of any one of Examples 1 through 6 or 9 through 14, wherein the first and second semiconductor bodies are unreleased nanoribbons or unreleased nanowires or unreleased nanosheets.

Example 16 includes the integrated circuit of any one of Examples 1 through 15, and further includes: a first frontside contact in contact with the first diffusion region; a second frontside contact in contact with the second diffusion region; and a frontside interconnect region including a first conductor and a second conductor, the first conductor in contact with the first frontside contact, and the second conductor in contact with the second frontside contact.

Example 17 includes the integrated circuit of any one of Examples 1 through 15, and further includes: a frontside contact in contact with one of the first or second diffusion regions; a backside contact in contact with the other of the first or second diffusion regions; a frontside interconnect region including a first conductor in contact with the frontside contact; and a backside interconnect region including a second conductor in contact with the backside contact.

Example 18 includes the integrated circuit of any one of Examples 1 through 17, and further includes: a gate structure that at least partially wraps around one or both of the first semiconductor body and the second semiconductor body.

Example 19 includes the integrated circuit of any one of Examples 1 through 17, and further includes: an isolation structure that at least partially wraps around one or both of the first semiconductor body and the second semiconductor body.

Example 20 includes the integrated circuit of any one of Examples 1 through 19, wherein a length of the first semiconductor body extends from the first diffusion region to the second diffusion region, and the integrated circuit further includes: a first gate structure on the length of the first semiconductor body between the first and second diffusion regions; and a second gate structure on the length of the first semiconductor body between the first and second diffusion regions; wherein there is no additional diffusion region along the length of the first semiconductor body between the first and second diffusion regions.

Example 21 includes the integrated circuit of any one of Examples 1 through 20, and further includes: a fifth diffusion region comprising the p-type dopant or the n-type dopant that is included in the second diffusion region; a third semiconductor body extending laterally from the second diffusion region to the fifth diffusion region; a first structure on the third semiconductor body between the second and fifth diffusion regions, the first structure extending between first and second spacers at respective first and second sides of the first structure, the first spacer being a distance D1 from the second spacer, the first structure being a gate structure or an isolation structure; and a second structure on the first semiconductor body between the first and second diffusion regions, the second structure extending between third and fourth spacers at respective first and second sides of the second structure, the third spacer being a distance D2 from the fourth spacer, wherein D2 is at least 2 times greater than D1, the second structure being a gate structure or an isolation structure.

Example 22 includes the integrated circuit of any one of Examples 1 through 21, and further includes: a fifth diffusion region comprising the p-type dopant or the n-type dopant that is included in the second diffusion region; and a third semiconductor body extending laterally from the second diffusion region to the fifth diffusion region; wherein the first semiconductor body is at least 2 times longer than the third semiconductor body.

Example 23 includes the integrated circuit of Example 22, and further includes: a gate structure that wraps around a released portion of the third semiconductor body.

Example 24 includes the integrated circuit of Example 22 or 23, and further includes: an isolation structure on the first semiconductor body and between the first and second diffusion regions, the isolation consisting essentially of dielectric material.

Example 25 is an integrated circuit comprising: a first diffusion region comprising one of a p-type dopant or an n-type dopant; a second diffusion region comprising the other of the p-type dopant or the n-type dopant; a first semiconductor body extending laterally from the first diffusion region to the second diffusion region; a third diffusion region below the first diffusion region and comprising the p-type dopant or the n-type dopant that is included in the first diffusion region; a fourth diffusion region below the second diffusion region and comprising the p-type dopant or the n-type dopant that is included in the second diffusion region; and a second semiconductor body extending laterally from the third diffusion region to the fourth diffusion region.

Example 26 includes the integrated circuit of Example 25, and further includes: a first contact at least partially on a surface of the first diffusion region and at least partially on a surface of the third diffusion region; and a second contact at least partially on a surface of the second diffusion region and at least partially on a surface of the fourth diffusion region; wherein the first and second contacts include a metal.

Example 27 includes the integrated circuit of Example 26, wherein the first contact passes through the first diffusion region and continues to a surface of the third diffusion region, and the second contact passes through the second diffusion region and continues to a surface of the fourth diffusion region.

Example 28 includes the integrated circuit of Example 26, wherein the first contact at least partially wraps around one or both of the first diffusion region and the third diffusion region, and the second contact at least partially wraps around one or both of the second diffusion region and the fourth diffusion region.

Example 29 includes the integrated circuit of Example 26, wherein the first diffusion region includes a first portion and a second portion, the first semiconductor body extending from the first portion, and a third semiconductor body extending from the second portion. The third diffusion region includes a first portion and a second portion, the second semiconductor body extending from the first portion, and a fourth semiconductor body extending from the second portion. The first contact extends between opposing surfaces of the first portion and the second portion of the first diffusion region and further extends between opposing surfaces of the first portion and the second portion of the third diffusion region. The first and second portions of a diffusion region can be, for example, epitaxial growths that did not merge.

Example 30 includes the integrated circuit of any one of Examples 25 through 29, wherein the first and second semiconductor bodies are connected to each other by a third semiconductor body, such that the first semiconductor body and the second semiconductor body are unreleased nanoribbons or unreleased nanowires or unreleased nanosheets.

Example 31 includes the integrated circuit of Example 30, wherein the first diffusion region, the first semiconductor body, the second diffusion region, the third diffusion region, the second semiconductor body, the fourth diffusion region, and the third semiconductor body are at least part of a diode structure, and wherein at least one of the first, second, and third semiconductor bodies is undoped. In other examples, at least one of the first, second, and third semiconductor bodies may be partially doped so there is an undoped portion and one or more doped portions of a given semiconductor body (e.g., such as a semiconductor body having doped end portions and an undoped middle portion between the doped end portions). In still other examples, at least one of the first, second, and third semiconductor bodies may be doped from one end to the other end.

Example 32 includes the integrated circuit of Example 30 or 31, wherein the first, second, and third semiconductor bodies are layers of a multilayer fin.

Example 33 includes the integrated circuit of any one of Examples 30 through 32, wherein the first and second semiconductor bodies are silicon, and the third semiconductor body includes silicon and germanium.

Example 34 includes the integrated circuit of any one of Examples 25 through 33, and further includes a spacer layer extending along a surface of the first diffusion region and a surface of the third diffusion region.

Example 35 includes the integrated circuit of any one of Examples 25 through 34, and further includes: a first frontside contact in contact with the first diffusion region; a second frontside contact in contact with the second diffusion region; and a frontside interconnect region including a first conductor and a second conductor, the first conductor in contact with the first frontside contact, and the second conductor in contact with the second frontside contact.

Example 36 includes the integrated circuit of any one of Examples 25 through 34, and further includes: a first frontside contact in contact with the first diffusion region; a second frontside contact in contact with the second diffusion region; a frontside interconnect region including conductor in contact with the first frontside contact; and a backside interconnect region including a conductor in contact with the second frontside contact.

Example 37 includes the integrated circuit of any one of Examples 25 through 34, and further includes: a frontside contact in contact with one of the first or second diffusion regions; a backside contact in contact with the other of the first or second diffusion regions; a frontside interconnect region including a first conductor in contact with the frontside contact; and a backside interconnect region including a second conductor in contact with the backside contact.

Example 38 includes the integrated circuit of any one of Examples 25 through 37, and further includes a gate structure that at least partially wraps around one or both of the first semiconductor body and the second semiconductor body.

Example 39 includes the integrated circuit of any one of Examples 25 through 37, and further includes an isolation structure that at least partially wraps around one or both of the first semiconductor body and the second semiconductor body.

Example 40 includes the integrated circuit of any one of Examples 25 through 39, wherein a length of the first semiconductor body extends from the first diffusion region to the second diffusion region, the integrated circuit further including: a first gate structure on the length of the first semiconductor body between the first and second diffusion regions; and a second gate structure on the length of the first semiconductor body between the first and second diffusion regions; wherein there is no additional diffusion region along the length of the first semiconductor body between the first and second diffusion regions.

Example 41 includes the integrated circuit of any one of Examples 25 through 40, and further includes: a fifth diffusion region comprising the p-type dopant or the n-type dopant that is included in the second diffusion region; a third semiconductor body extending laterally from the second diffusion region to the fifth diffusion region; a first structure on the third semiconductor body between the second and fifth diffusion regions, the first structure extending between first and second spacers at respective first and second sides of the first structure, the first spacer being a distance D1 from the second spacer, the first structure being a gate structure or an isolation structure; and a second structure on the first semiconductor body between the first and second diffusion regions, the second structure extending between third and fourth spacers at respective first and second sides of the second structure, the third spacer being a distance D2 from the fourth spacer, wherein D2 is at least 2 times greater than D1, the second structure being a gate structure or an isolation structure.

Example 42 includes the integrated circuit of any one of Examples 25 through 41, and further includes: a fifth diffusion region comprising the p-type dopant or the n-type dopant that is included in the second diffusion region; and a third semiconductor body extending laterally from the second diffusion region to the fifth diffusion region; wherein the first semiconductor body is at least 2 times longer than the third semiconductor body.

Example 43 includes the integrated circuit of Example 42, and further includes a gate structure that wraps around a released portion of the third semiconductor body.

Example 44 includes the integrated circuit of Example 42 or 43, and further includes an isolation structure on the first semiconductor body and between the first and second diffusion regions, the isolation consisting essentially of dielectric material.

Example 45 is an integrated circuit comprising: a first diffusion region comprising one of a p-type dopant or an n-type dopant; a second diffusion region comprising the other of the p-type dopant or the n-type dopant; a first semiconductor body extending laterally from the first diffusion region to the second diffusion region; a third diffusion region below or above the first diffusion region; a fourth diffusion region below or above the second diffusion region; a second semiconductor body extending laterally from the third diffusion region to the fourth diffusion region; a first spacer layer extending along a surface of the first diffusion region and a surface of the third diffusion region; and a second spacer layer extending along a surface of the second diffusion region and a surface of the fourth diffusion region.

Example 46 includes the integrated circuit of Example 45, wherein the third diffusion region includes the p-type dopant or the n-type dopant that is included in the first diffusion region.

Example 47 includes the integrated circuit of Example 45 or 46, and further includes a contact at least partially on a surface of the first diffusion region and at least partially on a surface of the third diffusion region.

Example 48 includes the integrated circuit of Example 47, wherein the contact passes through the first diffusion region and continues to a surface of the third diffusion region.

Example 49 includes the integrated circuit of Example 47, wherein the contact wraps around one or both of the first diffusion region and the third diffusion region.

Example 50 includes the integrated circuit of Example 47, and further includes: a fifth diffusion region laterally adjacent to the first diffusion region; and a third semiconductor body extending laterally from the fifth diffusion region; wherein the contact extends between opposing surfaces of the first and fifth diffusion regions and continues to a surface of the third diffusion region.

Example 51 includes the integrated circuit of Example 45, and further includes: a layer of dielectric material between the first and third diffusion regions, the third diffusion region being oppositely-doped from the first diffusion region.

Example 52 includes the integrated circuit of Example 45 or 51, wherein the third and fourth diffusion regions both include either a p-type dopant or an n-type dopant and are at least part of a transistor structure, and wherein the first diffusion region, the first semiconductor body, and the second diffusion region are at least part of a diode structure above or below the transistor structure.

Example 53 includes the integrated circuit of any one of Examples 45 through 50, wherein the first and second semiconductor bodies are connected to each other by a third semiconductor body.

Example 54 includes the integrated circuit of Example 53, wherein the first diffusion region, the first semiconductor body, the second diffusion region, the third diffusion region, the second semiconductor body, the fourth diffusion region, and the third semiconductor body are at least part of a diode structure.

Example 55 includes the integrated circuit of Example 53 or 54, wherein at least one of the first, second, and third semiconductor bodies is undoped. In other examples, at least one of the first, second, and third semiconductor bodies may be partially doped so there is an undoped portion and one or more doped portions of a given semiconductor body (e.g., such as a semiconductor body having doped end portions and an undoped middle portion between the doped end portions). In still other examples, at least one of the first, second, and third semiconductor bodies may be doped from one end to the other end.

Example 56 includes the integrated circuit of any one of Examples 53 through 55, wherein the first, second, and third semiconductor bodies are layers of a multilayer fin.

Example 57 includes the integrated circuit of any one of Examples 53 through 56, wherein the first and second semiconductor bodies are silicon, and the third semiconductor body includes silicon and germanium.

Example 58 includes the integrated circuit of any one of Examples 45 through 50 or 53 through 57, wherein the first and second semiconductor bodies are unreleased nanoribbons or unreleased nanowires or unreleased nanosheets.

Example 59 includes the integrated circuit of any one of Examples 45 through 58, and further includes: a first frontside contact in contact with the first diffusion region; a second frontside contact in contact with the second diffusion region; and a frontside interconnect region including a first conductor and a second conductor, the first conductor in contact with the first frontside contact, and the second conductor in contact with the second frontside contact.

Example 60 includes the integrated circuit of any one of Examples 45 through 58, and further includes: a frontside contact in contact with one of the first or second diffusion regions; a backside contact in contact with the other of the first or second diffusion regions; a frontside interconnect region including a first conductor in contact with the frontside contact; and a backside interconnect region including a second conductor in contact with the backside contact.

Example 61 includes the integrated circuit of any one of Examples 45 through 60, and further includes: a gate structure that at least partially wraps around one or both of the first semiconductor body and the second semiconductor body.

Example 62 includes the integrated circuit of any one of Examples 45 through 60, and further includes: an isolation structure that at least partially wraps around one or both of the first semiconductor body and the second semiconductor body.

Example 63 includes the integrated circuit of any one of Examples 45 through 62, wherein a length of the first semiconductor body extends from the first diffusion region to the second diffusion region, and the integrated circuit further includes: a first gate structure on the length of the first semiconductor body between the first and second diffusion regions; and a second gate structure on the length of the first semiconductor body between the first and second diffusion regions; wherein there is no additional diffusion region along the length of the first semiconductor body between the first and second diffusion regions.

Example 64 includes the integrated circuit of any one of Examples 45 through 63, and further includes: a fifth diffusion region comprising the p-type dopant or the n-type dopant that is included in the second diffusion region; a third semiconductor body extending laterally from the second diffusion region to the fifth diffusion region; a first structure on the third semiconductor body between the second and fifth diffusion regions, the first structure extending between first and second spacers at respective first and second sides of the first structure, the first spacer being a distance D1 from the second spacer, the first structure being a gate structure or an isolation structure; and a second structure on the first semiconductor body between the first and second diffusion regions, the second structure extending between third and fourth spacers at respective first and second sides of the second structure, the third spacer being a distance D2 from the fourth spacer, wherein D2 is at least 2 times greater than D1, the second structure being a gate structure or an isolation structure.

Example 65 includes the integrated circuit of any one of Examples 45 through 64, and further includes: a fifth diffusion region comprising the p-type dopant or the n-type dopant that is included in the second diffusion region; and a third semiconductor body extending laterally from the second diffusion region to the fifth diffusion region; wherein the first semiconductor body is at least 2 times longer than the third semiconductor body.

Example 66 includes the integrated circuit of Example 65, and further includes: a gate structure that wraps around a released portion of the third semiconductor body.

Example 67 includes the integrated circuit of Example 65 or 66, and further includes: an isolation structure on the first semiconductor body and between the first and second diffusion regions, the isolation consisting essentially of dielectric material.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:
1. An integrated circuit comprising:
   a first diffusion region comprising a p-type dopant;
   a second diffusion region comprising a n-type dopant;

a first semiconductor body extending laterally from the first diffusion region to the second diffusion region;

a third diffusion region aligned directly below or aligned directly above the first diffusion region, the third diffusion region comprising one of the p-type dopant or the n-type dopant;

a fourth diffusion region aligned directly below or aligned directly above the second diffusion region, the fourth diffusion region comprising the same dopant type as the third diffusion region; and a second semiconductor body extending laterally between the third diffusion region and the fourth diffusion region.

2. The integrated circuit of claim 1, wherein the third diffusion region and the fourth diffusion region each includes the p-type dopant that is included in the first diffusion region.

3. The integrated circuit of claim 2, further comprising a contact at least partially on a surface of the first diffusion region and at least partially on a surface of the third diffusion region.

4. The integrated circuit of claim 3, wherein the contact passes through the first diffusion region and continues to a surface of the third diffusion region.

5. The integrated circuit of claim 3, wherein the contact wraps around one or both of the first diffusion region and the third diffusion region.

6. The integrated circuit of claim 3, further comprising:

a fifth diffusion region laterally adjacent to the first diffusion region; and a third semiconductor body extending laterally from the fifth diffusion region;

wherein the contact extends between opposing surfaces of the first and fifth diffusion regions and continues to a surface of the third diffusion region.

7. The integrated circuit of claim 1, further comprising a layer of dielectric material between the first and third diffusion regions.

8. The integrated circuit of claim 7, wherein the third and fourth diffusion regions are at least part of a transistor structure, and wherein the first diffusion region, the first semiconductor body, and the second diffusion region are at least part of a diode structure above or below the transistor structure.

9. The integrated circuit of claim 1, further comprising a third semiconductor body directly contacting the first semiconductor body between the first diffusion region and the second diffusion region.

10. The integrated circuit of claim 9, wherein the first diffusion region, the first semiconductor body, the second diffusion region; and the third semiconductor body are at least part of a diode structure.

11. The integrated circuit of claim 9, wherein the first, second, and third semiconductor bodies are layers of a multilayer fin.

12. The integrated circuit of claim 9, wherein the first semiconductor body includes silicon, and the third semiconductor body includes silicon and germanium.

13. The integrated circuit of claim 1, further comprising a spacer layer extending along a surface of the first diffusion region and a surface of the third diffusion region.

14. The integrated circuit of claim 9, wherein the first and third semiconductor bodies are unreleased nanoribbons or unreleased nanowires or unreleased nanosheets.

15. The integrated circuit of claim 1, further comprising a first frontside contact in contact with the first diffusion region;

a second frontside contact in contact with the second diffusion region; and a frontside interconnect region including a first conductor and a second conductor, the first conductor in contact with the first frontside contact, and the second conductor in contact with the second frontside contact.

16. The integrated circuit of claim 1, further comprising a frontside contact in contact with one of the first or second diffusion regions;

a backside contact in contact with the other of the first or second diffusion regions;

a frontside interconnect region including a first conductor in contact with the frontside contact; and a backside interconnect region including a second conductor in contact with the backside contact.

17. The integrated circuit of claim 1, further comprising:

a gate structure that at least partially wraps around one or both of the first semiconductor body and the second semiconductor body; and/or an isolation structure that at least partially wraps around one or both of the first semiconductor body and the second semiconductor body.

18. The integrated circuit of claim 1, wherein a length of the first semiconductor body extends from the first diffusion region to the second diffusion region, the integrated circuit further comprising:

a first gate structure on the length of the first semiconductor body between the first and second diffusion regions; and a second gate structure on the length of the first semiconductor body between the first and second diffusion regions;

wherein there is no additional diffusion region along the length of the first semiconductor body between the first and second diffusion regions.

19. The integrated circuit of claim 1, further comprising:

a fifth diffusion region comprising the same dopant type as in the second diffusion region;

a third semiconductor body extending laterally from the second diffusion region to the fifth diffusion region;

a first structure on the third semiconductor body between the second and fifth diffusion regions, the first structure extending between first and second spacers at respective first and second sides of the first structure, the first spacer being a distance D1 from the second spacer, the first structure being a gate structure or an isolation structure; and a second structure on the first semiconductor body between the first and second diffusion regions, the second structure extending between third and fourth spacers at respective first and second sides of the second structure, the third spacer being a distance D2 from the fourth spacer, wherein D2 is at least 2 times greater than D1, the second structure being a gate structure or an isolation structure.

20. The integrated circuit of claim 1, further comprising:

a fifth diffusion region comprising the same dopant type as the second diffusion region; and a third semiconductor body extending laterally from the second diffusion region to the fifth diffusion region;

wherein the first semiconductor body is at least 2 times longer than the third semiconductor body.

21. The integrated circuit of claim 20, further comprising:

a gate structure that wraps arounds a released portion of the third semiconductor body; and/or

an isolation structure on the first semiconductor body and between the first and second diffusion regions, the isolation consisting essentially of dielectric material.

22. An integrated circuit comprising:

a first diffusion region comprising one of a p-type dopant or an n-type dopant;

a second diffusion region comprising the other of the p-type dopant or the n-type dopant;

a first semiconductor body extending laterally from the first diffusion region to the second diffusion region;

a third diffusion region below the first diffusion region and comprising the p-type dopant or the n-type dopant that is included in the first diffusion region;

a fourth diffusion region below the second diffusion region and comprising the same dopant type that is included in the third diffusion region; and a second semiconductor body extending laterally between the third diffusion region and the fourth diffusion region.

23. The integrated circuit of claim 22, further comprising:

a first contact at least partially on a surface of the first diffusion region and at least partially on a surface of the third diffusion region; and a second contact at least partially on a surface of the second diffusion region and at least partially on a surface of the fourth diffusion region;

wherein the first and second contacts include a metal;

the first diffusion region includes a first portion and a second portion, the first semiconductor body extending from the first portion, and a third semiconductor body extending from the second portion;

the third diffusion region includes a first portion and a second portion, the second semiconductor body extending from the first portion, and a fourth semiconductor body extending from the second portion; and the first contact extends between opposing surfaces of the first portion and the second portion of the first diffusion region and further extends between opposing surfaces of the first portion and the second portion of the third diffusion region.

24. An integrated circuit comprising:

a first diffusion region comprising one of a p-type dopant or an n-type dopant;

a second diffusion region comprising the other of the p-type dopant or the n-type dopant;

a first semiconductor body extending laterally from the first diffusion region to the second diffusion region;

a third diffusion region below or above the first diffusion region and comprising one of the p-type dopant or the n-type dopant;

a fourth diffusion region below or above the second diffusion region and comprising the same dopant type as the third diffusion region;

a second semiconductor body extending laterally between the third diffusion region and the fourth diffusion region;

a first spacer layer extending along a surface of the first diffusion region and a surface of the third diffusion region; and a second spacer layer extending along a surface of the second diffusion region and a surface of the fourth diffusion region.

25. The integrated circuit of claim 24, wherein a length of the first semiconductor body extends from the first diffusion region to the second diffusion region, the integrated circuit further comprising:

a first gate structure on the length of the first semiconductor body between the first and second diffusion regions; and a second gate structure on the length of the first semiconductor body between the first and second diffusion regions;

wherein there is no additional diffusion region along the length of the first semiconductor body between the first and second diffusion regions.

* * * * *